(12) United States Patent
Makino et al.

(10) Patent No.: US 12,391,801 B2
(45) Date of Patent: Aug. 19, 2025

(54) COLORING RESIN COMPOSITION, FILM, COLOR FILTER, SOLID-STATE IMAGING ELEMENT, AND IMAGE DISPLAY DEVICE

(71) Applicant: FUJIFILM Corporation, Tokyo (JP)

(72) Inventors: Masaomi Makino, Shizuoka (JP); Takashi Kawashima, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 601 days.

(21) Appl. No.: 17/585,551

(22) Filed: Jan. 27, 2022

(65) Prior Publication Data

US 2022/0145009 A1 May 12, 2022

Related U.S. Application Data

(63) Continuation of application No. PCT/JP2020/028782, filed on Jul. 28, 2020.

(30) Foreign Application Priority Data

Jul. 30, 2019 (JP) .................................. 2019-139391

(51) Int. Cl.
| | | |
|---|---|---|
| C08G 73/10 | (2006.01) | |
| C08K 5/00 | (2006.01) | |
| C08K 5/04 | (2006.01) | |
| C08K 5/33 | (2006.01) | |
| G02B 1/04 | (2006.01) | |

(52) U.S. Cl.
CPC ..... *C08G 73/1067* (2013.01); *C08G 73/1025* (2013.01); *C08G 73/1032* (2013.01); *C08G 73/1064* (2013.01); *C08K 5/0041* (2013.01); *C08K 5/33* (2013.01); *G02B 1/04* (2013.01); *C08G 73/1007* (2013.01)

(58) Field of Classification Search
CPC .............................. C08G 73/10; C08G 73/1007
See application file for complete search history.

(56) References Cited

U.S. PATENT DOCUMENTS

| | | | | |
|---|---|---|---|---|
| 10,450,417 | B2 * | 10/2019 | Kawabata | G03F 7/031 |
| 10,526,448 | B2 * | 1/2020 | Shibuya | C08G 73/105 |
| 10,538,627 | B2 * | 1/2020 | Kawabata | G03F 7/037 |
| 10,896,942 | B2 * | 1/2021 | Arai | H10K 85/111 |
| 2006/0159839 | A1 * | 7/2006 | Suwa | C08G 73/101 |
| | | | | 430/270.1 |
| 2018/0037698 | A1 | 2/2018 | Miyamoto et al. | |
| 2018/0259852 | A1 * | 9/2018 | Tanigaki | H10K 50/00 |
| 2020/0218150 | A1 | 7/2020 | Arayama | |
| 2021/0011381 | A1 | 1/2021 | Tanigaki et al. | |
| 2022/0064444 | A1 * | 3/2022 | Nara | C08L 39/00 |

FOREIGN PATENT DOCUMENTS

| | | |
|---|---|---|
| CN | 108027561 | 5/2018 |
| JP | H11246824 | 9/1999 |
| JP | 2005029659 | 2/2005 |
| JP | 2007002023 A * | 1/2007 |
| JP | 2007063417 A * | 3/2007 |
| JP | 2008189747 | 8/2008 |
| JP | 2012167169 | 9/2012 |
| JP | 2013015635 | 1/2013 |
| JP | 2017173812 | 9/2017 |
| JP | 2017186530 | 10/2017 |
| JP | 2019045865 | 3/2019 |
| WO | 2004109403 | 12/2004 |
| WO | WO-2015146949 A1 * | 10/2015 ............. G03F 7/027 |
| WO | 2016147958 | 9/2016 |
| WO | WO-2016143740 A1 * | 9/2016 ............. C08G 73/10 |
| WO | WO-2016194769 A1 * | 12/2016 ............ C08F 290/14 |
| WO | WO-2017002859 A1 * | 1/2017 ............. C08F 290/14 |

(Continued)

OTHER PUBLICATIONS

"Decision of Refusal of Japan Counterpart Application", issued on May 16, 2023, with English translation thereof, p. 1-p. 13.
Office Action of Japan Counterpart Application, with English translation thereof, issued on Dec. 27, 2022, pp. 1-14.
Office Action of Japan Counterpart Application, with English translation thereof, issued on Feb. 20, 2024, pp. 1-6.
"Office Action of China Counterpart Application", issued on Apr. 3, 2024, with English translation thereof, pp. 1-19.
"International Search Report (Form PCT/ISA/210) of PCT/JP2020/028782," mailed on Sep. 8, 2020, with English translation thereof, pp. 1-7.

(Continued)

*Primary Examiner* — Rip A Lee
(74) *Attorney, Agent, or Firm* — JCIPRNET

(57) ABSTRACT

Provided are a coloring resin composition including a resin, a coloring material, and a solvent, in which the resin is a polyimide or polyimide precursor including a repeating unit represented by Formula (1-1) or Formula (1-2), and a content of the coloring material is 30 mass % or more with respect to a total solid content of the composition; a film; a color filter; a solid-state imaging element; and an image display device.

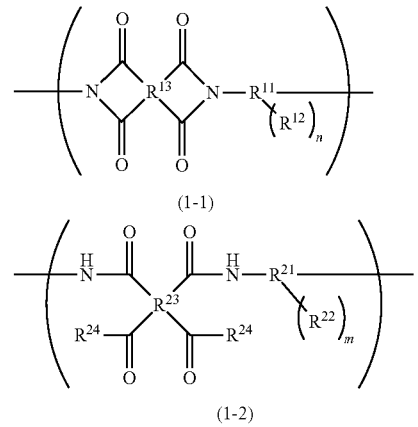

23 Claims, No Drawings

(56) References Cited

FOREIGN PATENT DOCUMENTS

| WO | WO-2017002860 A1 * | 1/2017 | ............ C08F 290/14 |
| WO | 2017057281 | 4/2017 | |
| WO | WO-2017057281 A1 * | 4/2017 | ............ C08F 265/06 |
| WO | WO-2017145652 A1 * | 8/2017 | ........... G02F 1/1337 |
| WO | WO-2018003725 A1 * | 1/2018 | ............ C08F 290/06 |
| WO | 2019058882 | 3/2019 | |

OTHER PUBLICATIONS

"Written Opinion of the International Searching Authority (Form PCT/ISA/237)" of PCT/JP2020/028782, mailed on Sep. 8, 2020, with English translation thereof, pp. 1-12.
"Office Action of China Counterpart Application", issued on Jan. 15, 2025, with English translation thereof, p. 1-p. 13.
"Office Action of China Counterpart Application", issued on May 23, 2025, with English translation thereof, p. 1-p. 19.

* cited by examiner

COLORING RESIN COMPOSITION, FILM, COLOR FILTER, SOLID-STATE IMAGING ELEMENT, AND IMAGE DISPLAY DEVICE

CROSS-REFERENCE TO RELATED APPLICATIONS

This application is a Continuation of PCT International Application No. PCT/JP2020/028782 filed on Jul. 28, 2020, which claims priority under 35 U.S.C. § 119(a) to Japanese Patent Application No. 2019-139391 filed on Jul. 30, 2019. Each of the above application(s) is hereby expressly incorporated by reference, in its entirety, into the present application.

BACKGROUND OF THE INVENTION

1. Field of the Invention

The present invention relates to a coloring resin composition, a film, a color filter, a solid-state imaging element, and an image display device.

2. Description of the Related Art

In recent years, as a digital camera, a mobile phone with a camera, and the like have been further spreading, there has been a greatly increasing demand for a solid-state imaging element such as a charge coupled device (CCD) image sensor. A film including a pigment, such as a color filter, has been used for the solid-state imaging element. The film including a pigment, such as a color filter, is manufactured by using a coloring resin composition and the like, which includes a coloring material, a resin, and a solvent.

For example, JP2019-045865A discloses a display device provided with a cured film obtained by curing a negative photosensitive resin composition, in which the negative photosensitive resin composition includes (A1) a first resin, (A2) a second resin, (C) a photopolymerization initiator, and (D) a colorant, the first resin (A1) is (A1-1) polyimide and/or (A1-2) polybenzoxazole, the second resin (A2) is one or more selected from (A2-1) a polyimide precursor, (A2-2) a polybenzoxazole precursor, (A2-3) polysiloxane, (A2-4) a cardo-based resin, and (A2-5) an acrylic resin, a content ratio of the first resin (A1) in the total of 100 mass % of the first resin (A1) and the second resin (A2) is in a range of 25 to 90 mass %, an optical density per 1 μm of the cured film is in a range of 0.3 to 5.0, the cured film includes a cured pattern, and a taper angle of an inclined side in a cross section of the cured pattern is in a range of 1° to 60°.

JP2017-186530A discloses a coloring resin composition containing (A) a polyimide precursor derivative which has a specific structural unit and a structural unit in which a carboxy group in the specific structural unit is replaced with an amide group or an ester group, (B) a colorant, and (C) an organic solvent.

SUMMARY OF THE INVENTION

In recent years, in the manufacturing process of a solid-state imaging element, it has been also studied to form a film such as a color filter using a coloring resin composition including a coloring material, a resin, and a solvent, and then subject the film to a step requiring a heating treatment at a high temperature (for example, 300° C. or higher).

Therefore, an object of the present invention is to provide a novel coloring resin composition which can expand a process window of the process after manufacturing the film, a film, a color filter, a solid-state imaging element, and an image display device.

Examples of typical embodiments of the present invention are shown below.

<1> A coloring resin composition comprising:
a resin;
a coloring material; and
a solvent,
in which the resin is a polyimide or polyimide precursor including a repeating unit represented by Formula (1-1) or Formula (1-2), and
a content of the coloring material is 30 mass % or more with respect to a total solid content of the composition,

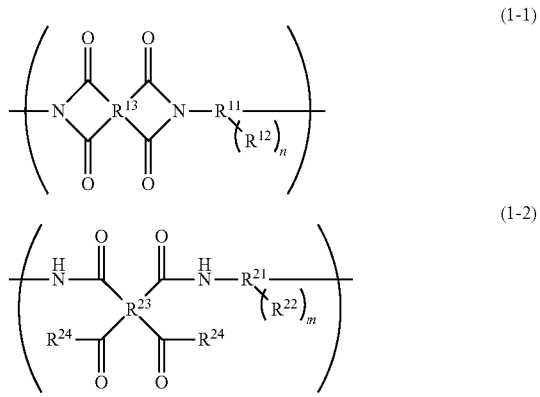

in Formula (1-1), $R^{11}$ represents an aromatic hydrocarbon group having 6 to 14 carbon atoms, $R^{12}$ represents a monovalent substituent which is a substituent on the aromatic hydrocarbon group in $R^{11}$, n represents an integer of 0 to nA, nA is a maximum number of substitutions of the aromatic hydrocarbon group in $R^{11}$, and $R^{13}$ represents a tetravalent organic group, in Formula (1-2), $R^{21}$ represents an aromatic hydrocarbon group having 6 to 14 carbon atoms, $R^{22}$ represents a monovalent substituent which is a substituent on the aromatic hydrocarbon group in $R^{21}$, m represents an integer of 0 to mA, mA is a maximum number of substitutions of the aromatic hydrocarbon group in $R^{21}$, $R^{23}$ represents a tetravalent organic group, and $R^{24}$'s each independently represent a monovalent substituent.

<2> The coloring resin composition according to <1>,
in which the resin includes at least one repeating unit selected from the group consisting of a repeating unit 1-1a which is the repeating unit represented by Formula (1-1) and in which $R^{12}$ in Formula (1-1) is a group $R^{1a}$ including at least one acid group selected from the group consisting of a carboxy group, a sulfo group, a phosphoric acid group, a sulfonamide group, and a hydroxy group, and a repeating unit 1-2a which is the repeating unit represented by Formula (1-2) and in which $R^{22}$ in Formula (1-2) is $R^{1a}$.

<3> The coloring resin composition according to <1> or <2>,
in which the resin includes at least one repeating unit selected from the group consisting of a repeating unit 1-1b which is the repeating unit represented by Formula (1-1) and in which $R^{12}$ in Formula (1-1) is a group $R^{1b}$ including at least one curable group selected from the group consisting of a (meth)acryloxy group, a (meth)acrylamide group, an aromatic vinyl group, a maleimide group, an epoxy group, and an oxetanyl group, and a repeating unit 1-2b which is the repeating unit represented by Formula (1-2) and in which $R^{22}$ in Formula (1-2) is $R^{1b}$.

<4> The coloring resin composition according to any one of <1> to <3>,
in which the resin includes at least one repeating unit selected from the group consisting of a repeating unit 1-1c which is the repeating unit represented by Formula (1-1) and in which $R^{12}$ in Formula (1-1) is a group $R^{1c}$ having 12 or more carbon atoms, and a repeating unit 1-2c which is the repeating unit represented by Formula (1-2) and in which $R^{22}$ in Formula (1-2) is $R^{1c}$.

<5> The coloring resin composition according to <4>,
in which $R^{1c}$ includes at least one selected from the group consisting of a repeating unit derived from a (meth)acrylic acid ester compound, a repeating unit derived from a (meth)acrylamide compound, a repeating unit derived from an aromatic vinyl compound, and a polyester structure.

<6> The coloring resin composition according to any one of <1> to <5>,
in which $R^{13}$ and $R^{23}$ are groups including an alicyclic structure, or groups including a fluorine atom and an aromatic ring structure.

<7> The coloring resin composition according to any one of <1> to <6>,
in which $R^{24}$ is a group including at least one acid group selected from the group consisting of a carboxy group, a sulfo group, a phosphoric acid group, a sulfonamide group, and a hydroxy group, a group including at least one curable group selected from the group consisting of a (meth)acryloxy group, a (meth)acrylamide group, an aromatic vinyl group, a maleimide group, an epoxy group, and an oxetanyl group, or a group having 12 or more carbon atoms.

<8> The coloring resin composition according to any one of <1> to <7>,
in which an acid value of the resin is 20 to 150 mgKOH/g.

<9> The coloring resin composition according to any one of <1> to <8>,
in which a C=C value of the resin is 0.1 mmol/g to 3 mmol/g.

<10> The coloring resin composition according to any one of <1> to <9>,
wherein a weight-average molecular weight of the resin is 5,000 to 20,000.

<11> The coloring resin composition according to any one of <1> to <10>,
in which, as the resin, the following resin 1 and resin 2 are included,
resin 1: a resin including at least one acid group selected from the group consisting of a carboxy group, a sulfo group, a phosphoric acid group, a sulfonamide group, and a hydroxy group and at least one curable group selected from the group consisting of a (meth)acryloxy group, a (meth)acrylamide group, an aromatic vinyl group, a maleimide group, an epoxy group, and an oxetanyl group,
resin 2: a resin including at least one acidic group selected from the group consisting of a carboxy group, a sulfo group, a phosphoric acid group, a sulfonamide group, and a hydroxy group and a group having 12 or more carbon atoms.

<12> The coloring resin composition according to any one of <1> to <11>,
in which the coloring material is an organic pigment.

<13> The coloring resin composition according to any one of <1> to <12>,
in which the coloring material includes at least one selected from a chromatic coloring material or a near-infrared absorbing coloring material.

<14> The coloring resin composition according to any one of <1> to <13>,
in which the coloring material includes a chromatic coloring material and a near-infrared absorbing coloring material.

<15> The coloring resin composition according to any one of <1> to <14>,
in which the coloring material includes a black coloring material.

<16> The coloring resin composition according to any one of <1> to <15>,
in which the coloring material includes at least one coloring material selected from the group consisting of a red coloring material, a yellow coloring material, a blue coloring material, and a violet coloring material.

<17> The coloring resin composition according to any one of <1> to <16>, further comprising:
a photopolymerization initiator.

<18> The coloring resin composition according to <17>,
in which the photopolymerization initiator is an oxime initiator.

<19> The coloring resin composition according to any one of <1> to <18>,
in which the solvent includes at least one solvent selected from the group consisting of propylene glycol monomethyl ether acetate, propylene glycol monomethyl ether, cyclohexanone, cyclopentanone, butyl acetate, ethyl 3-ethoxypropionate, propylene glycol monoethyl ether acetate, ethyl lactate, 3-methoxybutanol, methyl isobutyl ketone, and dipropylene glycol monomethyl ether.

<20> The coloring resin composition according to any one of <1> to <19>,
in which the coloring resin composition is used for forming a pattern in a photolithography method.

<21> The coloring resin composition according to any one of <1> to <20>,
in which the coloring resin composition is used for a solid-state imaging element.

<22> A film formed of the coloring resin composition according to any one of <1> to <21>.

<23> A color filter comprising:
the film according to <22>.

<24> A solid-state imaging element comprising:
the film according to <22>.

<25> An image display device comprising:
the film according to <22>.

<26> A polyimide or a polyimide precursor comprising:
a repeating unit represented by Formula (2-1) or Formula (2-2),

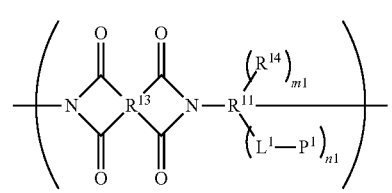

(2-1)

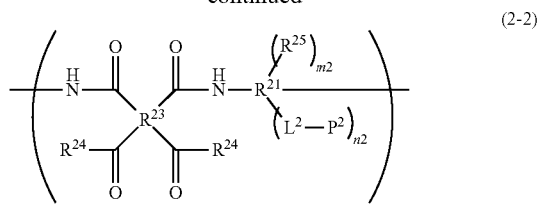

(2-2)

in Formula (2-1), $R^{11}$ represents an aromatic hydrocarbon group having 6 to 14 carbon atoms, $L^1$ represents a group represented by Formula (L-1), Formula (L-2), or Formula (L-3), $P^1$ represents a molecular chain having a molecular weight of 1,000 to 10,000 and having no acid group and basic group, n1 is 1 or 2, $R^{14}$ represents a monovalent substituent which is a substituent on the aromatic hydrocarbon group in $R^{11}$, m1 represents an integer of 0 to nA1, nA1 is a number obtained by subtracting n1 from a maximum number of substitutions of the aromatic hydrocarbon group in $R^{11}$, and $R^{13}$ represents a tetravalent organic group, in Formula (2-2), $R^{21}$ represents an aromatic hydrocarbon group having 6 to 14 carbon atoms, $L^2$ represents a group represented by Formula (L-1), Formula (L-2), or Formula (L-3), $P^2$ represents a molecular chain having a molecular weight of 1,000 to 10,000 and having no acid group and basic group, n2 is 1 or 2, $R^{25}$ represents a monovalent substituent which is a substituent on the aromatic hydrocarbon group in $R^{21}$, m2 represents an integer of 0 to nA2, nA2 is a number obtained by subtracting n2 from a maximum number of substitutions of the aromatic hydrocarbon group in $R^{21}$, $R^{23}$ represents a tetravalent organic group, and $R^{24}$'s each independently represent a monovalent substituent, $$*\overset{O}{\underset{\|}{C}}-X^1-L^3-\bullet \quad (L\text{-}1)$$

$$*-S-L^3-\bullet \quad (L\text{-}2)$$

$$*-O-L^3-\bullet \quad (L\text{-}3)$$

in Formula (L-1), Formula (L-2), or Formula (L-3), $X^1$ represents —O— or —$NR^N$—, $L^3$ represents a single bond, —O—, —$NR^N$—, —S—, —C(=O)—, —$NR^N$(C=O)O—, —$CH_2$—CH(OH)—$CH_2$—, a hydrocarbon gr group a group of a combination of two or more these groups, * represents a bonding site with $R^{11}$ or $R^{21}$, ● represents a bonding site with $P^1$ or $P^2$, and $R^N$ represents a hydrogen atom or a hydrocarbon group.

According to the present invention, a novel coloring resin composition which can expand a process window of the process after manufacturing the film, a film, a color filter, a solid-state imaging element, and an image display device are provided.

DESCRIPTION OF THE PREFERRED EMBODIMENTS

Hereinafter, main embodiments of the present invention will be described. However, the present invention is not limited to the specified embodiments.

In the present specification, "to" is used to refer to a meaning including numerical values denoted before and after "to" as a lower limit value and an upper limit value.

In the present specification, unless specified as a substituted group or as an unsubstituted group, a group (atomic group) denotes not only a group (atomic group) having no substituent but also a group (atomic group) having a substituent. For example, an "alkyl group" includes not only an alkyl group having no substituent (unsubstituted alkyl group), but also an alkyl group having a substituent (substituted alkyl group).

In the present specification, unless specified otherwise, "exposure" denotes not only exposure using light but also drawing using a corpuscular beam such as an electron beam or an ion beam. In addition, examples of light used for the exposure include actinic rays or radiation such as a bright line spectrum of a mercury lamp, far ultraviolet rays typified by an excimer laser, extreme ultraviolet rays (EUV light), X-rays, or electron beams.

In the present specification, a (meth)allyl group represents either or both of allyl and methallyl, "(meth)acrylate" represents either or both of acrylate and methacrylate, "(meth)acryl" represents either or both of acryl and methacryl, and "(meth)acryloyl" represents either or both of acryloyl and methacryloyl.

In the present specification, a weight-average molecular weight and a number-average molecular weight are values in terms of polystyrene through measurement by a gel permeation chromatography (GPC) method.

In the present specification, near-infrared rays denote light having a wavelength in a range of 700 to 2500 nm.

In the present specification, a total solid content denotes the total mass of all the components of the composition excluding a solvent.

In the present specification, the term "step" refers to not only an individual step but also a step which is not clearly distinguishable from another step as long as an effect expected from the step can be achieved.

In addition, in the present specification, a combination of preferred aspects is a more preferred aspect.

(Coloring Resin Composition)

A coloring resin composition according to an embodiment of the present invention includes a resin, a coloring material, and a solvent, in which the resin is a polyimide or polyimide precursor including a repeating unit represented by Formula (1-1) or Formula (1-2), and a content of the coloring material is 30 mass % or more with respect to a total solid content of the composition.

Hereinafter, the above-described polyimide or polyimide precursor is also collectively referred to as a "specific resin".

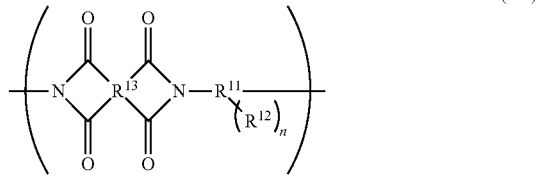

(1-1)

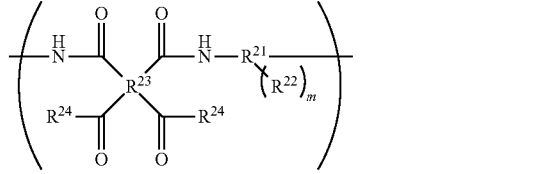

(1-2)

In Formula (1-1), $R^{11}$ represents an aromatic hydrocarbon group having 6 to 14 carbon atoms, $R^{12}$ represents a monovalent substituent which is a substituent on the aromatic hydrocarbon group in $R^{11}$, n represents an integer of 0 to nA, nA is a maximum number of substitutions of the aromatic hydrocarbon group in $R^{11}$, and $R^{13}$ represents a tetravalent organic group, in Formula (1-2), $R^{21}$ represents an aromatic hydrocarbon group having 6 to 14 carbon atoms, $R^{22}$ represents a monovalent substituent which is a substituent on the aromatic hydrocarbon group in $R^{21}$, m represents an integer of 0 to mA, mA is a maximum number of substitutions of the aromatic hydrocarbon group in $R^{21}$, $R^{23}$ represents a tetravalent organic group, and $R^{24}$'s each independently represent a monovalent substituent.

The coloring resin composition according to the embodiment of the present invention contains a high concentration (30 mass % or more) of a coloring material, a resin, and a solvent.

As a result of intensive studies, the present inventors have found that, in a coloring resin composition including such a high concentration coloring material, a resin, and a solvent, in a case where an acrylic resin used in the related art is used as the resin, a process window of the process after manufacturing a film is narrow in a case of being subjected to a step of a heating treatment requiring a high temperature (for example, 300° C. or higher), such as a film contraction ratio of a composition film to be obtained is increased, and cracks occur in other films (for example, an inorganic film) formed on the composition film to be obtained.

It is presumed that this is because the acrylic resin is decomposed by high temperature.

Therefore, as a result of intensive studies, the present inventors have found that, by using, as the resin, a polyimide or polyimide precursor including a repeating unit represented by Formula (1-1) or Formula (1-2), the occurrence of cracks and the like described above are suppressed, and the process window of the process after manufacturing the film can be expanded.

Although the mechanism by which the above-described effects are obtained is unclear, it is considered that, in the film obtained by the coloring resin composition including the polyimide or polyimide precursor including the above-described specific repeating unit, the decomposition of the resin is suppressed even in the step of a heating treatment requiring the high temperature. Therefore, such as contraction due to heating of the above-described film is suppressed, cracks are less likely to occur, it is presumed that it is possible to expand an applicable range of the heating temperature in steps after manufacturing the film using the coloring resin composition to a higher temperature (for example, 300° C. or higher), and it is possible to expand the process window of the process after manufacturing the film.

In a case where a film having a thickness of 0.60 μm is formed by heating the coloring resin composition according to the embodiment of the present invention at 200° C. for 30 minutes, a thickness of the film after performing a heating treatment of the film at 300° C. for 5 hours in a nitrogen atmosphere is preferably 70% or more of a thickness of the film before the heating treatment, more preferably 80% or more thereof, and still more preferably 90% or more.

In addition, a thickness of the film after performing a heating treatment of the film at 350° C. for 5 hours in a nitrogen atmosphere is preferably 70% or more of a thickness of the film before the heating treatment, more preferably 80% or more thereof, and still more preferably 90% or more.

In addition, a thickness of the film after performing a heating treatment of the film at 400° C. for 5 hours in a nitrogen atmosphere is preferably 70% or more of a thickness of the film before the heating treatment, more preferably 80% or more thereof, and still more preferably 90% or more.

The above-described physical properties can be achieved by a method such as adjusting the type and content of the specific resin to be used or other resins.

In addition, in a case where a film having a thickness of 0.60 μm is formed by heating the coloring resin composition according to the embodiment of the present invention at 200° C. for 30 minutes, a rate of change ΔA in absorbance of the film after the heating treatment at 300° C. for 5 hours in a nitrogen atmosphere, which is represented by Expression (1), is preferably 50% or less, more preferably 45% or less, still more preferably 40% or less, and particularly preferably 35% or less.

$$\Delta A(\%) = |100(A2/A1) \times 100| \qquad (1)$$

ΔA is the rate of change in the absorbance of the film after the heating treatment;

A1 is a maximum value of an absorbance of the film before the heating treatment in a wavelength range of 400 to 1100 nm; and A2 is the absorbance of the film after the heating treatment, and is the absorbance at a wavelength showing the maximum value of the absorbance of the film before the heating treatment in a wavelength range of 400 to 1100 nm.

The above-described physical properties can be achieved by a method such as adjusting the type and content of the specific resin to be used or other resins.

In addition, in a case where a film having a thickness of 0.60 μm is formed by heating the coloring resin composition according to the embodiment of the present invention at 200° C. for 30 minutes, an absolute value of a difference between a wavelength λ1 showing the maximum value of the absorbance of the film in a wavelength range of 400 to 1100 nm and a wavelength λ2 showing the maximum value of the absorbance of the film after the heating treatment at 300° C. for 5 hours in a nitrogen atmosphere is preferably 50 nm or less, more preferably 45 nm or less, and still more preferably 40 nm or less.

The above-described physical properties can be achieved by a method such as adjusting the type and content of the specific resin to be used or other resins.

In addition, in a case where a film having a thickness of 0.60 μm is formed by heating the coloring resin composition according to the embodiment of the present invention at 200° C. for 30 minutes, a maximum value of the rate of change $\Delta A_\lambda$ in an absorbance of the film after the heating treatment at 300° C. for 5 hours in a nitrogen atmosphere in a wavelength range of 400 to 1100 nm is preferably 30% or less, more preferably 27% or less, and still more preferably 25% or less. The rate of change in the absorbance is a value calculated from Expression (2).

$$\Delta A_\lambda = |100 - (A2_\lambda/A1_\lambda) \times 100| \qquad (2)$$

$\Delta A_\lambda$ is the rate of change in the absorbance of the film after the heating treatment at a wavelength k;

A1$_\lambda$ is the absorbance of the film before the heating treatment at the wavelength λ; and A2$_\lambda$ is the absorbance of the film after the heating treatment at the wavelength λ.

The above-described physical properties can be achieved by a method such as adjusting the type and content of the specific resin to be used or other resins.

In addition, in a case where the coloring resin composition according to the embodiment of the present invention is applied to a glass substrate and heated at 100° C. for 120 seconds to form a film having a film thickness of 0.6 μm, it is preferable that the film has a transmittance of 80% or more at a wavelength of 400 nm. In addition, it is preferable that the above-described film has a transmittance of 90% or more at a wavelength of 450 nm. More preferably, the film has a transmittance of 90% or more at a wavelength of 400 nm and a transmittance of 95% or more at a wavelength of 450 nm.

The coloring resin composition according to the embodiment of the present invention can be used for a color filter, a near-infrared transmitting filter, a near-infrared cut filter, a black matrix, a light shielding film, and the like.

Examples of the color filter include a filter having a colored pixel which transmits light having a specific wavelength, and a filter having at least one colored pixel selected from a red pixel, a blue pixel, a green pixel, a yellow pixel, a cyan pixel, and a magenta pixel is preferable. The color filter can be formed using a coloring resin composition including a chromatic coloring material.

Examples of the near-infrared cut filter include a filter having a maximal absorption wavelength in a wavelength range of 700 to 1800 nm. As the near-infrared cut filter, a filter having a maximal absorption wavelength in a wavelength range of 700 to 1300 nm is preferable, and a filter having a maximal absorption wavelength in a wavelength range of 700 to 1100 nm is more preferable. In addition, in the near-infrared cut filter, a transmittance of in the entire wavelength range of 400 to 650 nm is preferably 70% or more, more preferably 80% or more, and still more preferably 90% or more. In addition, the transmittance at at least one point in a wavelength range of 700 to 1800 nm is preferably 20% or less. In addition, in the near-infrared cut filter, absorbance A$_{max}$/absorbance A$_{550}$, which is a ratio of an absorbance A$_{max}$ at a maximal absorption wavelength to an absorbance A$_{550}$ at a wavelength of 550 nm, is preferably 20 to 500, more preferably 50 to 500, still more preferably 70 to 450, and particularly preferably 100 to 400. The near-infrared cut filter can be formed using a coloring resin composition including a near-infrared absorbing coloring material.

The near-infrared transmitting filter is a filter which transmits at least a part of near-infrared rays. The near-infrared transmitting filter may be a filter (transparent film) which transmits both visible light and near-infrared ray, or may be a filter which shields at least a part of visible light and transmits at least a part of near-infrared rays. Preferred examples of the near-infrared transmitting filter include filters satisfying spectral characteristics in which the maximum value of a transmittance in a wavelength range of 400 to 640 nm is 20% or less (preferably 15% or less and more preferably 10% or less) and the minimum value of a transmittance in a wavelength range of 1100 to 1300 nm is 70% or more (preferably 75% or more and more preferably 80% or more). The near-infrared transmitting filter is preferably a filter which satisfies any one of the following spectral characteristics (1) to (4).

(1): filter in which the maximum value of a transmittance in a wavelength range of 400 to 640 nm is 20% or less (preferably 15% or less and more preferably 10% or less) and the minimum value of a transmittance in a wavelength range of 800 to 1300 nm is 70% or more (preferably 75% or more and more preferably 80% or more).

(2): filter in which the maximum value of a transmittance in a wavelength range of 400 to 750 nm is 20% or less (preferably 15% or less and more preferably 10% or less) and the minimum value of a transmittance in a wavelength range of 900 to 1300 nm is 70% or more (preferably 75% or more and more preferably 80% or more).

(3): filter in which the maximum value of a transmittance in a wavelength range of 400 to 830 nm is 20% or less (preferably 15% or less and more preferably 10% or less) and the minimum value of a transmittance in a wavelength range of 1000 to 1300 nm is 70% or more (preferably 75% or more and more preferably 80% or more).

(4): filter in which the maximum value of a transmittance in a wavelength range of 400 to 950 nm is 20% or less (preferably 15% or less and more preferably 10% or less) and the minimum value of a transmittance in a wavelength range of 1100 to 1300 nm is 70% or more (preferably 75% or more and more preferably 80% or more).

The coloring resin composition according to the embodiment of the present invention can be preferably used as a coloring resin composition for a color filter. Specifically, the coloring resin composition according to the embodiment of the present invention can be preferably used as a coloring resin composition for forming a pixel of a color filter, and can be more preferably used as a coloring resin composition for forming a red or blue pixel of a color filter. In addition, the coloring resin composition according to the embodiment of the present invention can be preferably used as a coloring resin composition for forming a pixel of a color filter used in a solid-state imaging element.

In a case where the coloring resin composition according to the embodiment of the present invention is applied to a glass substrate and heated at 100° C. for 120 seconds to form a film having a film thickness of 0.6 μm, it is preferable that a maximum value of a transmittance of the film at a wavelength of 400 to 1100 nm is 70% or more (preferably 75% or more, more preferably 80% or more, and still more preferably 85% or more), and a minimum value thereof is 30% or less (preferably 25% or less, more preferably 20% or less, and still more preferably 15% or less). A coloring resin composition capable of forming a film satisfying the above-described spectral characteristics can be particularly preferably used as a coloring resin composition for forming a color filter, a near-infrared transmitting filter, or a near-infrared cut filter.

In addition, the coloring resin composition according to the embodiment of the present invention is also preferably a coloring resin composition used for forming a pattern in a photolithography method. According to this aspect, finely sized pixels can be easily formed. Therefore, the coloring resin composition according to the embodiment of the present invention can be particularly preferably used as a coloring resin composition for forming a pixel of a color filter used in a solid-state imaging element. For example, a coloring resin composition containing a component having a polymerizable group (for example, a resin or polymerizable compound having a polymerizable group) and a photopolymerization initiator can be preferably used as a coloring resin composition used for forming a pattern in a photolithography method. The coloring resin composition for forming a pattern in the photolithography method preferably further contains an alkali-soluble resin (for example, a resin 1 described later or an alkali developable resin described later).

Hereinafter, the respective components used in the coloring resin composition according to the embodiment of the present invention will be described.

<Coloring Material>

The coloring resin composition according to the embodiment of the present invention contains a coloring material. Examples of the coloring material include a white coloring material, a black coloring material, a chromatic coloring material, and a near-infrared absorbing coloring material. In the present invention, the white coloring material includes not only a pure white coloring material but also a bright gray (for example, grayish-white, light gray, and the like) coloring material close to white.

In addition, it is preferable that the coloring material includes at least one coloring material selected from the group consisting of a chromatic coloring material, a black coloring material, and a near-infrared absorbing coloring material, it is more preferable to include at least one coloring material selected from the group consisting of a chromatic coloring material and a near-infrared absorbing coloring material, it is still more preferable to include a chromatic coloring material, and it is even more preferable to include at least one coloring material selected from the group consisting of a red coloring material, a yellow coloring material, a blue coloring material, and a violet coloring material.

In addition, the coloring material preferably includes a black coloring material.

In addition, the coloring material preferably includes a chromatic coloring material and a near-infrared absorbing coloring material, and more preferably includes two or more kinds of chromatic coloring materials and a near-infrared absorbing coloring material.

In addition, the coloring material also preferably includes a black coloring material and a near-infrared absorbing coloring material.

According to these aspects, the coloring resin composition according to the embodiment of the present invention can be preferably used as a coloring resin composition for forming a near-infrared transmitting filter.

For the combination of these coloring materials, JP2013-77009A, JP2014-130338A, WO2015/166779A, and the like can be referred to.

Examples of the coloring material include a dye and a pigment, and from the viewpoint of heat resistance, a pigment is preferable. In addition, the pigment may be an inorganic pigment or an organic pigment, but from the viewpoint of many color variations, ease of dispersion, safety, and the like, an organic pigment is preferable. In addition, it is preferable that the pigment includes at least one selected from a chromatic pigment or a near-infrared ray absorbing pigment, and it is more preferable to include a chromatic pigment.

In addition, it is preferable that the pigment includes at least one selected from a phthalocyanine pigment, a dioxazine pigment, a quinacridone pigment, an anthraquinone pigment, a perylene pigment, an azo pigment, a diketopyrrolopyrrole pigment, a pyrrolopyrrole pigment, an isoindoline pigment, or a quinophthalone pigment, it is more preferable to include at least one selected from a phthalocyanine pigment, a diketopyrrolopyrrole pigment, or a pyrrolopyrrole pigment, and it is still more preferable to include a phthalocyanine pigment or a diketopyrrolopyrrole pigment. In addition, from the reason that it is easy to form a film in which spectral characteristics do not easily fluctuate even after heating to a high temperature (for example, 300° C. or higher), the phthalocyanine pigment is preferably a phthalocyanine pigment having no central metal or a phthalocyanine pigment having copper or zinc as a central metal.

In addition, from the reason that it is easy to form a film in which spectral characteristics do not easily fluctuate even after heating to a high temperature (for example, 300° C. or higher), it is preferable that the coloring material included in the coloring resin composition includes at least one selected from a red pigment, a yellow pigment, a blue pigment, or an infrared ray absorbing pigment, it is more preferable to include at least one selected from a red pigment or a blue pigment, and it is still more preferable to include a blue pigment.

The coloring material included in the coloring resin composition preferably includes a pigment A exhibiting the following requirement 1. By using a coloring material having such characteristics, it is possible to form a film in which spectral characteristics do not easily fluctuate even after heating to a high temperature (for example, 300° C. or higher). The proportion of the pigment A in the total amount of the pigment included in the coloring resin composition is preferably 20 to 100 mass %, more preferably 30 to 100 mass %, and still more preferably 40 to 100 mass %.

Requirement 1)

In a case where a film having a thickness of 0.60 μm is formed by heating, at 200° C. for 30 minutes, a composition which includes 6 mass % of the pigment A, 10 mass % of a resin B-5, and 84 mass % of propylene glycol monomethyl ether acetate, in a case where the film is subjected to a heating treatment at 300° C. for 5 hours in a nitrogen atmosphere, the rate of change ΔA10 in an absorbance of the film after the heating treatment, which is represented by Expression (10), is 50% or less;

$$\Delta A10 = |100(A12/A11) \times 100| \quad (10)$$

ΔA10 is the rate of change in the absorbance of the film after the heating treatment;

A11 is the maximum value of the absorbance of the film before the heating treatment in a wavelength range of 400 to 1100 nm;

A12 is the absorbance of the film after the heating treatment, and is the absorbance at the wavelength showing the maximum value of the film before the heating treatment in a wavelength range of 400 to 1100 nm; and The resin B-5 is a resin having the following structure, in which a numerical value added to a main chain represents a molar ratio, the weight-average molecular weight is 11000, and the acid value is 32 mgKOH/g.

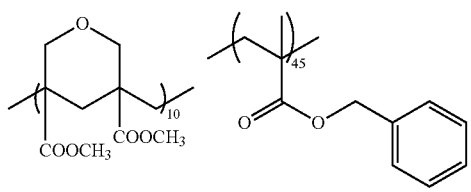

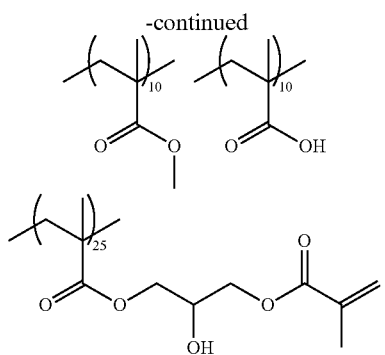

Examples of the pigment A satisfying the above-described requirement 1 include C. I. Pigment Red 254, C. I. Pigment Red 264, Pigment Red 272, Pigment Red 122, Pigment Red 177, C. I. Pigment Blue 15:3, C. I. Pigment Blue 15:4, C. I. Pigment Blue 15:6, and C. I. Pigment Blue 16.

The average primary particle diameter of the pigment is preferably 1 to 200 nm. The lower limit is preferably 5 nm or more and more preferably 10 nm or more. The upper limit is preferably 180 nm or less, more preferably 150 nm or less, and still more preferably 100 nm or less. In a case where the average primary particle diameter of the pigment is within the above-described range, dispersion stability of the pigment in the coloring resin composition is good. In the present invention, the primary particle diameter of the pigment can be determined from an image obtained by observing primary particles of the pigment using a transmission electron microscope. Specifically, a projected area of the primary particles of the pigment is determined, and the corresponding equivalent circle diameter is calculated as the primary particle diameter of the pigment. In addition, the average primary particle diameter in the present invention is the arithmetic average value of the primary particle diameters with respect to 400 primary particles of the pigment. In addition, the primary particle of the pigment refers to a particle which is independent without aggregation.

[Chromatic Coloring Material]

Examples of the chromatic coloring material include a coloring material having a maximal absorption wavelength in a wavelength range of 400 to 700 nm. Examples thereof include a yellow coloring material, an orange coloring material, a red coloring material, a green coloring material, a violet coloring material, and a blue coloring material. From the viewpoint of heat resistance, the chromatic coloring material is preferably a pigment (chromatic pigment), more preferably a red pigment, a yellow pigment, or a blue pigment, and still more preferably a red pigment or a blue pigment. Specific examples of the chromatic pigment include the following.

Color Index (C. I.) Pigment Yellow 1, 2, 3, 4, 5, 6, 10, 11, 12, 13, 14, 15, 16, 17, 18, 20, 24, 31, 32, 34, 35, 35:1, 36, 36:1, 37, 37:1, 40, 42, 43, 53, 55, 60, 61, 62, 63, 65, 73, 74, 77, 81, 83, 86, 93, 94, 95, 97, 98, 100, 101, 104, 106, 108, 109, 110, 113, 114, 115, 116, 117, 118, 119, 120, 123, 125, 126, 127, 128, 129, 137, 138, 139, 147, 148, 150, 151, 152, 153, 154, 155, 156, 161, 162, 164, 166, 167, 168, 169, 170, 171, 172, 173, 174, 175, 176, 177, 179, 180, 181, 182, 185, 187, 188, 193, 194, 199, 213, 214, 215, 228, 231, 232 (methine-based), 233 (quinoline-based), 234 (aminoketone-based), 235 (aminoketone-based), 236 (aminoketone-based), and the like (all of which are yellow pigments);

C. I. Pigment Orange 2, 5, 13, 16, 17:1, 31, 34, 36, 38, 43, 46, 48, 49, 51, 52, 55, 59, 60, 61, 62, 64, 71, and 73 (all of which are orange pigments);

C. I. Pigment Red 1, 2, 3, 4, 5, 6, 7, 9, 10, 14, 17, 22, 23, 31, 38, 41, 48:1, 48:2, 48:3, 48:4, 49, 49:1, 49:2, 52:1, 52:2, 53:1, 57:1, 60:1, 63:1, 66, 67, 81:1, 81:2, 81:3, 83, 88, 90, 105, 112, 119, 122, 123, 144, 146, 149, 150, 155, 166, 168, 169, 170, 171, 172, 175, 176, 177, 178, 179, 184, 185, 187, 188, 190, 200, 202, 206, 207, 208, 209, 210, 216, 220, 224, 226, 242, 246, 254, 255, 264, 270, 272, 279, 294 (xanthene-based, Organo Ultramarine, Bluish Red), 295 (monoazo-based), 296 (diazo-based), 297 (aminoketone-based), and the like (all of which are red pigments);

C. I. Pigment Green 7, 10, 36, 37, 58, 59, 62, 63, 64 (phthalocyanine-based), 65 (phthalocyanine-based), 66 (phthalocyanine-based), and the like (all of which are green pigments);

C. I. Pigment Violet 1, 19, 23, 27, 32, 37, 42, 60 (triarylmethane-based), 61 (xanthene-based), and the like (all of which are violet pigments); and C. I. Pigment Blue 1, 2, 15, 15:1, 15:2, 15:3, 15:4, 15:6, 16, 22, 29, 60, 64, 66, 79, 80, 87 (monoazo-based), 88 (methine-based), and the like (all of which are blue pigments).

Among these chromatic pigments, as the red pigment, from the reason that it is easy to form a film in which spectral characteristics do not easily fluctuate even after heating to a high temperature (for example, 300° C. or higher), C. I. Pigment Red 254, C. I. Pigment Red 264, Pigment Red 272, Pigment Red 122, or Pigment Red 177 is preferable. In addition, as the blue pigment, C. I. Pigment Blue 15:3, C. I. Pigment Blue 15:4, C. I. Pigment Blue 15:6, or C. I. Pigment Blue 16 is preferable.

In addition, as the green coloring material, a halogenated zinc phthalocyanine pigment having an average number of halogen atoms in one molecule of 10 to 14, an average number of bromine atoms in one molecule of 8 to 12, and an average number of chlorine atoms in one molecule of 2 to 5 can also be used. Specific examples thereof include the compounds described in WO2015/118720A. In addition, as the green pigment, a compound described in CN2010-6909027A, a phthalocyanine compound described in WO2012/102395A, which has phosphoric acid ester as a ligand, a phthalocyanine compound described in JP2019-008014A, a phthalocyanine compound described in JP2018-180023A, a compound described in JP2019-038958A, and the like can also be used.

In addition, as the blue coloring material, an aluminum phthalocyanine compound having a phosphorus atom can also be used. Specific examples thereof include the compounds described in paragraph Nos. 0022 to 0030 of JP2012-247591A and paragraph No. 0047 of JP2011-157478A.

In addition, as the yellow coloring material, compounds described in JP2017-201003A, compounds described in JP2017-197719A, compounds described in paragraph Nos. 0011 to 0062 and 0137 to 0276 of JP2017-171912A, compounds described in paragraph Nos. 0010 to 0062 and 0138 to 0295 of JP2017-171913A, compounds described in paragraph Nos. 0011 to 0062 and 0139 to 0190 of JP2017-171914A, compounds described in paragraph Nos. 0010 to 0065 and 0142 to 0222 of JP2017-171915A, quinophthalone compounds described in paragraph Nos. 0011 to 0034 of JP2013-054339A, quinophthalone compounds described in paragraph Nos. 0013 to 0058 of JP2014-026228A, isoindoline compounds described JP2018-062644A, quinophthalone compounds described in JP2018-203798A, quinophthalone compounds described in JP2018-062578A, quinophthalone compounds described in JP6432077B, quinophthalone compounds described in JP6432076B, quinophthalone compounds described in JP2018-155881A, quinophthalone compounds described in JP2018-111757A, quinophthalone compounds described in JP2018-040835A, quinophthalone compounds described in JP2017-197640A, quinophthalone compounds described in JP2016-145282A, quinophthalone compounds described in JP2014-085565A, quinophthalone compounds described in JP2014-021139A, quinophthalone compounds described in JP2013-209614A, quinophthalone compounds described in JP2013-209435A, quinophthalone compounds described in JP2013-181015A, quinophthalone compounds described in JP2013-061622A, quinophthalone compounds described in JP2013-054339A, quinophthalone compounds described in JP2013-032486A, quinophthalone compounds described in JP2012-226110A, quinophthalone compounds described in JP2008-074987A, quinophthalone compounds described in JP2008-081565A, quinophthalone compounds described in JP2008-074986A, quinophthalone compounds described in JP2008-074985A, quinophthalone compounds described in JP2008-050420A, quinophthalone compounds described in JP2008-031281A, quinophthalone compounds described in JP1973-032765A (JP-S48-032765A), quinophthalone compounds described in JP2019-008014A, a compound represented by Formula (QP1), and a compound represented by Formula (QP2) can also be used.

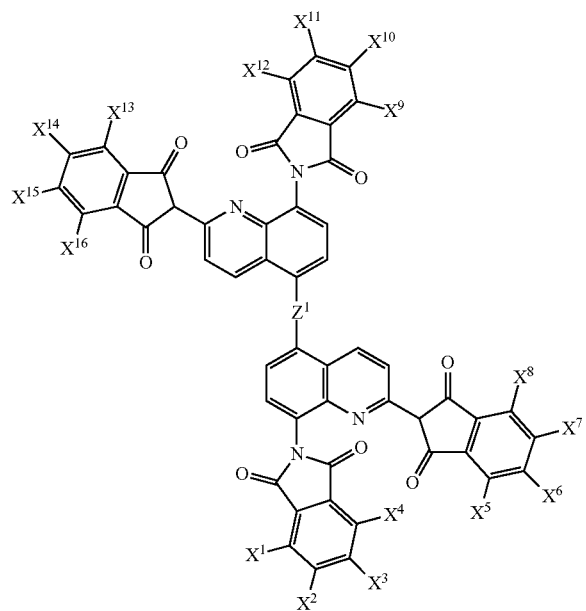

(QP1)

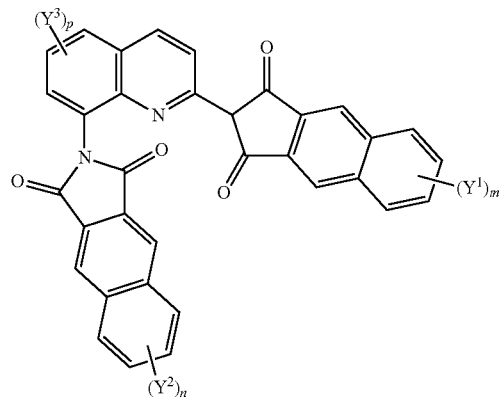

(QP2)

In Formula (QP2), $Y^1$ to $Y^3$ each independently represent a halogen atom. n and m represent an integer of 0 to 6, and p represents an integer of 0 to 5. (n+m) is 1 or more. Specific examples of the compound represented by Formula (QP2) include compounds described in paragraph Nos. 0047 and 0048 of JP6432077B.

As the red coloring material, diketopyrrolopyrrole compounds described in JP2017-201384A, in which the structure has at least one substituted bromine atom, diketopyrrolopyrrole compounds described in paragraph Nos. 0016 to 0022 of JP6248838B, diketopyrrolopyrrole compounds described in WO2012/102399A, diketopyrrolopyrrole compounds described in WO2012/117965A, naphtholazo compounds described in JP2012-229344, compounds described in JP6516119B, compounds described in JP6525101B, and the like can also be used. In addition, as the red coloring material, a compound having a structure that an aromatic ring group in which a group bonded with an oxygen atom, a sulfur atom, or a nitrogen atom is introduced to an aromatic ring is bonded to a diketopyrrolopyrrole skeleton can be used. As the compound, a compound represented by Formula (DPP1) is preferable, and a compound represented by Formula (DPP2) is more preferable.

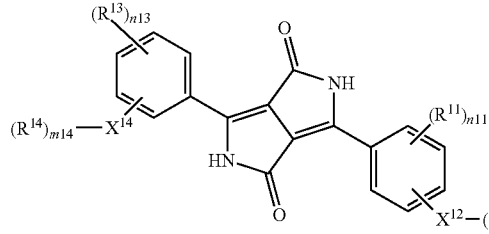

(DPP1)

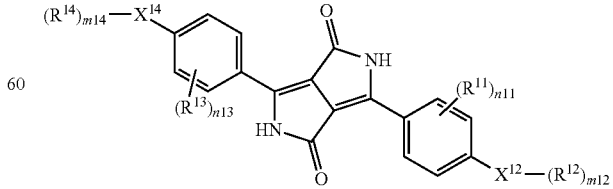

(DPP2)

In Formula (QP1), $X^1$ to $X^{16}$ each independently represent a hydrogen atom or a halogen atom, and $Z^1$ represents an alkylene group having 1 to 3 carbon atoms. Specific examples of the compound represented by Formula (QP1) include compounds described in paragraph No. 0016 of JP6443711B.

In the formulae, $R^{11}$ and $R^{13}$ each independently represent a substituent, $R^{12}$ and $R^{14}$ each independently represent a hydrogen atom, an alkyl group, an aryl group, or a heteroaryl group, n11 and n13 each independently represent an integer of 0 to 4, $X^{12}$ and $X^{14}$ each independently represent an oxygen atom, a sulfur atom, or a nitrogen atom, in a case where $X^{12}$ is an oxygen atom or a sulfur atom, m12 represents 1, in a case where $X^{12}$ is a nitrogen atom, m12 represents 2, in a case where $X^{14}$ is an oxygen atom or a sulfur atom, m14 represents 1, and in a case where $X^{14}$ is a nitrogen atom, m14 represents 2. Preferred specific examples of the substituent represented by $R^{11}$ and $R^{13}$ include an alkyl group, an aryl group, a halogen atom, an acyl group, an alkoxycarbonyl group, an aryloxycarbonyl group, a heteroaryloxycarbonyl group, an amide group, a cyano group, a nitro group, a trifluoromethyl group, a sulfoxide group, and a sulfo group.

Examples of the chromatic dye include a pyrazoleazo compound, an anilinoazo compound, a triarylmethane compound, an anthraquinone compound, an anthrapyridone compound, a benzylidene compound, an oxonol compound, a pyrazolotriazoleazo compound, a pyridoneazo compound, a cyanine compound, a phenothiazine compound, a pyrrolopyrazoleazomethine compound, a xanthene compound, a phthalocyanine compound, a benzopyran compound, an indigo compound, and a pyrromethene compound.

The chromatic coloring material may be used in combination of two or more kinds thereof. In addition, in a case where the chromatic coloring material is used in combination of two or more kinds thereof, the combination of two or more chromatic coloring materials may form black. Examples of such a combination include the following aspects (1) to (7). In a case where two or more chromatic coloring materials are included in the coloring resin composition and the combination of two or more chromatic coloring materials forms black, the coloring resin composition according to the embodiment of the present invention can be preferably used as a near-infrared transmitting filter.
 (1) aspect in which a red coloring material and a blue coloring material are contained.
 (2) aspect in which a red coloring material, a blue coloring material, and a yellow coloring material are contained.
 (3) aspect in which a red coloring material, a blue coloring material, a yellow coloring material, and a violet coloring material are contained.
 (4) aspect in which a red coloring material, a blue coloring material, a yellow coloring material, a violet coloring material, and a green coloring material are contained.
 (5) aspect in which a red coloring material, a blue coloring material, a yellow coloring material, and a green coloring material are contained.
 (6) aspect in which a red coloring material, a blue coloring material, a green coloring material are contained.
 (7) aspect in which a yellow coloring material and a violet coloring material are contained.

[White Coloring Material]

Examples of the white coloring material include inorganic pigments (white pigments) such as titanium oxide, strontium titanate, barium titanate, zinc oxide, magnesium oxide, zirconium oxide, aluminum oxide, barium sulfate, silica, talc, mica, aluminum hydroxide, calcium silicate, aluminum silicate, hollow resin particles, and zinc sulfide. The white pigment is preferably particles having a titanium atom, more preferably titanium oxide. In addition, the white pigment is preferably a particle having a refractive index of 2.10 or more with respect to light having a wavelength of 589 nm. The above-mentioned refractive index is preferably 2.10 to 3.00 and more preferably 2.50 to 2.75.

In addition, as the white pigment, the titanium oxide described in "Titanium Oxide-Physical Properties and Applied Technology, written by Manabu Kiyono, pages 13 to 45, published on Jun. 25, 1991, published by Gihodo Shuppan Co., Ltd." can also be used.

The white pigment is not limited to a compound formed of a single inorganic substance, and may be particles combined with other materials. For example, it is preferable to use a particle having a pore or other materials therein, a particle having a number of inorganic particles attached to a core particle, or a core-shell composite particle composed of a core particle formed of polymer particles and a shell layer formed of inorganic fine nanoparticles. With regard to the core-shell composite particle composed of a core particle formed of polymer particles and a shell layer formed of inorganic fine nanoparticles, reference can be made to, for example, the descriptions in paragraph Nos. 0012 to 0042 of JP2015-047520A, the contents of which are incorporated herein by reference.

As the white pigment, hollow inorganic particles can also be used. The hollow inorganic particles refer to inorganic particles having a structure with a cavity therein, and the cavity is enclosed by an outer shell. As the hollow inorganic particles, hollow inorganic particles described in JP2011-075786A, WO2013/061621A, JP2015-164881A, and the like can be used, the contents of which are incorporated herein by reference.

[Black Coloring Material]

The black coloring material is not particularly limited, and a known black coloring material can be used. Examples thereof include inorganic pigments (black pigments) such as carbon black, titanium black, and graphite, and carbon black or titanium black is preferable and titanium black is more preferable. The titanium black is black particles containing a titanium atom, and is preferably lower titanium oxide or titanium oxynitride. The surface of the titanium black can be modified, as necessary, according to the purpose of improving dispersibility, suppressing aggregating properties, and the like. For example, the surface of the titanium black can be coated with silicon oxide, titanium oxide, germanium oxide, aluminum oxide, magnesium oxide, or zirconium oxide. In addition, a treatment with a water-repellent substance as described in JP2007-302836A can be performed. Examples of the black pigment include Color Index (C. I.) Pigment Black 1 and 7. It is preferable that the titanium black has a small primary particle diameter of the individual particles and has a small average primary particle diameter. Specifically, the average primary particle diameter thereof is preferably 10 to 45 nm. The titanium black can be used as a dispersion. Examples thereof include a dispersion which includes titanium black particles and silica particles and in which the content ratio of Si atoms to Ti atoms is adjusted to a range of 0.20 to 0.50. With regard to the dispersion, reference can be made to the description in paragraphs 0020 to 0105 of JP2012-169556A, the contents of which are incorporated herein by reference. Examples of a commercially available product of the titanium black include Titanium black 10S, 12S, 13R, 13M, 13M-C, 13R-N, 13M-T (trade name; manufactured by Mitsubishi Materials Corporation) and Tilack D (trade name; manufactured by Akokasei Co., Ltd.).

In addition, as the black coloring material, organic black coloring materials such as a bisbenzofuranone compound, an azomethine compound, a perylene compound, and an azo compound can also be used. Examples of the bisbenzofuranone compound include the compounds described in JP2010-534726A, JP2012-515233A, JP2012-515234A, and the like, and the bisbenzofuranone compound is available, for example, as "Irgaphor Black" manufactured by BASF. Examples of the perylene compound include compounds described in paragraph Nos. 0016 to 0020 of JP2017-226821A, and C. I. Pigment Black 31 and 32. Examples of the azomethine compound include the compounds described in JP1989-170601A (JP-H01-170601A) and JP1990-034664A (JP-H02-034664A), and the azomethine compound is available, for example, "CHROMOFINE BLACK A1103" manufactured by Dainichiseika Color & Chemicals Mfg. Co., Ltd.

The coloring material used in the composition according to the embodiment of the present invention may be only the above-described black coloring material, or may further include the chromatic coloring material. According to this aspect, it is easy to obtain a composition with which a film having a high light shielding properties in the visible region can be formed. In a case where the black coloring material and the chromatic coloring material are used in combination as the coloring material, the mass ratio of the two is preferably black coloring material:chromatic coloring material=100:10 to 300, and more preferably 100:20 to 200. In addition, it is preferable to use the black pigment as the black coloring material, and it is preferable to use the chromatic pigment as the chromatic coloring material.

Examples of the chromatic coloring material include a red coloring material, a green coloring material, a blue coloring material, a yellow coloring material, a violet coloring material, and an orange coloring material.

As the chromatic coloring material, a chromatic pigment is preferable, and examples of the chromatic pigment include a red pigment, a green pigment, a blue pigment, a yellow pigment, a violet pigment, and an orange pigment.

In addition, as the chromatic pigment, a material in which an inorganic pigment or an organic-inorganic pigment is substituted with an organic chromophore can also be used. By substituting an inorganic pigment or an organic-inorganic pigment with an organic chromophore, hue design can be easily performed. As the pigment A, a pigment including at least one selected from a red pigment, a blue pigment, or a yellow pigment is preferably used, a pigment including at least one selected from a blue pigment or a yellow pigment is more preferably used, and a pigment including a blue pigment is still more preferably used. According to this aspect, it is easy to form a film having excellent light shielding properties in the visible region. In addition, by using a blue pigment, a film having excellent light resistance can be formed. In addition, by using a yellow pigment, a visible transmittance of the obtained film can be uniform.

From the reason that it is easy to form a film having excellent light resistance, the blue pigment is preferably a phthalocyanine compound. In addition, examples of the blue pigment include Color Index (C. I.) Pigment Blue 1, 2, 15, 15:1, 15:2, 15:3, 15:4, 15:6, 16, 22, 29, 60, 64, 66, 79, 80, 87 (monoazo-based), and 88 (methine/polymethine-based), and at least one selected from C. I. Pigment Blue 15:3, C. I. Pigment Blue 15:6, or C. I. Pigment Blue 16 is preferable and C. I. Pigment Blue 15:6 is more preferable.

In addition, an aluminum phthalocyanine compound having a phosphorus atom can also be used as the blue pigment. Examples of such a compound include an aluminum phthalocyanine compound in which the ligand is a phosphoric acid ester. Specific examples of the aluminum phthalocyanine compound having a phosphorus atom include compounds described in paragraphs 0022 to 0030 of JP2012-247591A and paragraph 0047 of JP2011-157478A.

Examples of the yellow pigment include an azo compound, a quinophthalone compound, an isoindolinone compound, an isoindoline compound, and an anthraquinone compound, and an isoindoline compound is preferable. In addition, examples of the yellow pigment include C. I. Pigment Yellow 1, 2, 3, 4, 5, 6, 10, 11, 12, 13, 14, 15, 16, 17, 18, 20, 24, 31, 32, 34, 35, 35:1, 36, 36:1, 37, 37:1, 40, 42, 43, 53, 55, 60, 61, 62, 63, 65, 73, 74, 77, 81, 83, 86, 93, 94, 95, 97, 98, 100, 101, 104, 106, 108, 109, 110, 113, 114, 115, 116, 117, 118, 119, 120, 123, 125, 126, 127, 128, 129, 137, 138, 139, 147, 148, 150, 151, 152, 153, 154, 155, 156, 161, 162, 164, 166, 167, 168, 169, 170, 171, 172, 173, 174, 175, 176, 177, 179, 180, 181, 182, 185, 187, 188, 193, 194, 199, 213, 214, 231, and 232 (methine/polymethine-based).

In addition, a pigment described in JP2017-201003A and a pigment described in JP2017-197719A can be used as the yellow pigment. In addition, as the yellow pigment, a metal azo pigment which includes at least one kind of an anion selected from an azo compound represented by Formula (I) or an azo compound having a tautomeric structure of the azo compound represented by Formula (I), two or more kinds of metal ions, and a melamine compound can be used.

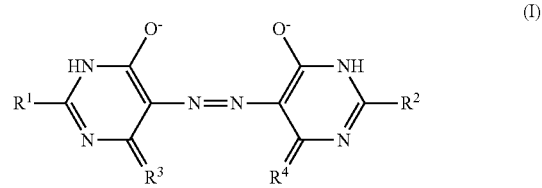

(I)

In the formula, $R^1$ and $R^2$ each independently represent —OH or —$NR^5R^6$, $R^3$ and $R^4$ each independently represent =O or =$NR^7$, and $R^5$ to $R^7$ each independently represent a hydrogen atom or an alkyl group. The alkyl group represented by $R^5$ to $R^7$ preferably has 1 to 10 carbon atoms, more preferably has 1 to 6 carbon atoms, and still more preferably has 1 to 4 carbon atoms. The alkyl group may be linear, branched, or cyclic, and is preferably linear or branched and more preferably linear. The alkyl group may have a substituent. The substituent is preferably a halogen atom, a hydroxy group, an alkoxy group, a cyano group, or an amino group.

The details of the metal azo pigment can be found in paragraph Nos. 0011 to 0062 and 0137 to 0276 of JP2017-171912A, paragraph Nos. 0010 to 0062 and 0138 to 0295 of JP2017-171913A, paragraph Nos. 0011 to 0062 and 0139 to 0190 of JP2017-171914A, and paragraph Nos. 0010 to 0065 and 0142 to 0222 of JP2017-171915A, the contents of which are incorporated herein by reference.

Examples of the red pigment include a diketopyrrolopyrrole compound, an anthraquinone compound, an azo compound, and a quinacridone compound, and a diketopyrrolopyrrole compound is preferable. In addition, examples of the red pigment include C. I. Pigment Red 1, 2, 3, 4, 5, 6, 7, 9, 10, 14, 17, 22, 23, 31, 38, 41, 48:1, 48:2, 48:3, 48:4, 49, 49:1, 49:2, 52:1, 52:2, 53:1, 57:1, 60:1, 63:1, 66, 67, 81:1, 81:2, 81:3, 83, 88, 90, 105, 112, 119, 122, 123, 144, 146, 149, 150, 155, 166, 168, 169, 170, 171, 172, 175, 176, 177, 178, 179, 184, 185, 187, 188, 190, 200, 202, 206, 207, 208, 209, 210, 216, 220, 224, 226, 242, 246, 254, 255, 264, 270, 272, 279, and 294 (xanthene-based, Organo Ultramarine, Bluish Red).

In addition, as the red pigment, a diketopyrrolopyrrole-based pigment described in JP2017-201384A, in which the structure has at least one substituted bromine atom, a diketopyrrolopyrrole-based pigment described in paragraph Nos. 0016 to 0022 of JP6248838B, and the like can also be used. In addition, as the red pigment, a compound having a structure that an aromatic ring group in which a group bonded with an oxygen atom, a sulfur atom, or a nitrogen atom is introduced to an aromatic ring is bonded to a diketopyrrolopyrrole skeleton can be used.

Examples of the orange pigment include C. I. Pigment Orange 2, 5, 13, 16, 17:1, 31, 34, 36, 38, 43, 46, 48, 49, 51, 52, 55, 59, 60, 61, 62, 64, 71, and 73. Examples of the violet pigment include C. I. Pigment Violet 1, 19, 23, 27, 32, 37, 42, 60 (triarylmethane-based), and 61 (xanthene-based). Examples of the green pigment include C. I. Pigment Green 7, 10, 36, 37, 58, 59, 62, and 63. In addition, a halogenated zinc phthalocyanine pigment having an average number of halogen atoms in one molecule of 10 to 14, an average number of bromine atoms in one molecule of 8 to 12, and an average number of chlorine atoms in one molecule of 2 to 5 can also be used as the green pigment. Specific examples thereof include the compounds described in WO2015/118720A.

Examples of preferred combinations of the organic black coloring material and the chromatic coloring material include the following.

(A-1) aspect in which the organic black coloring material and the blue coloring material are contained
(A-2) aspect in which the organic black coloring material, the blue coloring material, and the yellow coloring material are contained
(A-3) aspect in which the organic black coloring material, the blue coloring material, the yellow coloring material, and the red coloring material are contained
(A-4) aspect in which the organic black coloring material, the blue coloring material, the yellow coloring material, and the violet coloring material are contained In the above-described aspect (A-1), the mass ratio of the organic black coloring material and the blue coloring material is preferably organic black coloring material:blue coloring material=100:1 to 70, more preferably 100:5 to 60, and still more preferably 100:10 to 50.

In the above-described aspect (A-2), the mass ratio of the organic black coloring material, the blue coloring material, and the yellow coloring material is preferably organic black coloring material:blue coloring material:yellow coloring material=100:10 to 90:10 to 90, more preferably 100:15 to 85:15 to 80, and still more preferably 100:20 to 80:20 to 70.

In the above-described aspect (A-3), the mass ratio of the organic black coloring material, the blue coloring material, the yellow coloring material, and the red coloring material is preferably organic black coloring material:blue coloring material:yellow coloring material:red coloring material=100:20 to 150:1 to 60:10 to 100, more preferably 100:30 to 130:5 to 50:20 to 90, and still more preferably 100:40 to 120:10 to 40:30 to 80.

In the above-described aspect (A-4), the mass ratio of the organic black coloring material, the blue coloring material, the yellow coloring material, and the violet coloring material is preferably organic black coloring material:blue coloring material:yellow coloring material:violet coloring material=100:20 to 150:1 to 60:10 to 100, more preferably 100:30 to 130:5 to 50:20 to 90, and still more preferably 100:40 to 120:10 to 40:30 to 80.

As the coloring material used in the composition according to the embodiment of the present invention, a coloring material having a maximal absorption wavelength in a wavelength range of more than 700 nm and 800 nm or less can also be used. Such a coloring material is used as a near-infrared ray absorbing pigment. By using a coloring material including a pigment having such spectral characteristics as the coloring material, a wavelength of light transmitted through the obtained film can be shifted to a longer wavelength side. In the pigment having a maximal absorption wavelength in a wavelength range of more than 700 nm and 800 nm or less, a ratio $A^1/A^2$ of an absorbance $A^1$ at a wavelength of 500 nm to an absorbance $A^2$ at the maximal absorption wavelength is preferably 0.08 or less and more preferably 0.04 or less.

Examples of the pigment having a maximal absorption wavelength in a wavelength range of more than 700 nm and 800 nm or less include a pyrrolopyrrole compound, a cyanine compound, a squarylium compound, a phthalocyanine compound, a naphthalocyanine compound, a quaterrylene compound, a merocyanine compound, a croconium compound, an oxonol compound, an iminium compound, a dithiol compound, a triarylmethane compound, a pyrromethene compound, an azomethine compound, an anthraquinone compound, and a dibenzofuranone compound.

The content of the coloring material in the total solid content of the composition according to the embodiment of the present invention is preferably 10 to 60 mass %. The lower limit is preferably 20 mass % or more and more preferably 30 mass % or more.

In addition, the content of the above-described organic black coloring material in the coloring material is 10 mass % or more, preferably 20 mass % or more, more preferably 30 mass % or more, still more preferably 40 mass % or more, and even more preferably 50 mass % or more, and even still more preferably 60 mass % or more. A composition in the related art tends to contaminate an inside of a piping tube as the content of the organic black coloring material increases, but in the composition according to the embodiment of the present invention, since the inside of the piping tube can be less likely to be contaminated even in a case where the content of the organic black coloring material increases, the effects of the present invention are remarkably exhibited as the content of the organic black coloring material is higher.

In addition, the content of a lactam-based pigment as the organic black coloring material in the coloring material is 10 mass % or more, preferably 15 mass % or more, more preferably 20 mass % or more, still more preferably 30 mass % or more, and even more preferably 40 mass % or more, and even still more preferably 50 mass % or more.

In addition, the content of the above-described organic black coloring material in the total solid content of the composition according to the embodiment of the present invention is preferably 5 to 70 mass %. The lower limit is preferably 10 mass % or more and more preferably 15 mass % or more. The upper limit is preferably 65 mass % or less and more preferably 60 mass % or less.

[Near-Infrared Absorbing Coloring Material]

The near-infrared absorbing coloring material is preferably a pigment, and more preferably an organic pigment. In addition, the near-infrared absorbing coloring material preferably has a maximal absorption wavelength in a wavelength range of more than 700 nm and 1400 nm or less. In addition, the maximal absorption wavelength of the near-infrared absorbing coloring material is preferably 1200 nm or less, more preferably 1000 nm or less, and still more preferably 950 nm or less. In addition, in the near-infrared absorbing coloring material, $A_{550}/A_{max}$, which is a ratio of an absorbance $A_{550}$ at a wavelength of 550 nm to an absorbance $A_{max}$ at the maximal absorption wavelength, is preferably 0.1 or less, more preferably 0.05 or less, still more preferably 0.03 or less, and particularly preferably 0.02 or less. The lower limit is not particularly limited, but for example, may be 0.0001 or more or may be 0.0005 or more. In a case where the ratio of the above-described absorbance is within the above-described range, a near-infrared absorbing coloring material excellent in visible light transparency and near-infrared shielding properties can be obtained. In the present invention, the maximal absorption wavelength of the near-infrared absorbing coloring material and values of absorbance at each wavelength are values obtained from an absorption spectrum of a film formed by using a coloring resin composition including the near-infrared absorbing coloring material.

The near-infrared absorbing coloring material is not particularly limited, and examples thereof include a pyrrolopyrrole compound, a cyanine compound, a squarylium compound, a phthalocyanine compound, a naphthalocyanine compound, a quaterrylene compound, a merocyanine compound, a croconium compound, an oxonol compound, an iminium compound, a dithiol compound, a triarylmethane compound, a pyrromethene compound, an azomethine compound, an anthraquinone compound, a dibenzofuranone compound, and a dithiolene metal complex. Examples of the pyrrolopyrrole compound include compounds described in paragraph Nos. 0016 to 0058 of JP2009-263614A, compounds described in paragraph Nos. 0037 to 0052 of JP2011-068731A, and compounds described in paragraph Nos. 0010 to 0033 of WO2015/166873A. Examples of the squarylium compound include compounds described in paragraph Nos. 0044 to 0049 of JP2011-208101A, compounds described in paragraph Nos. 0060 and 0061 of JP6065169B, compounds described in paragraph No. 0040 of WO2016/181987A, compounds described in JP2015-176046A, compounds described in paragraph No. 0072 of WO2016/190162A, compounds described in paragraph Nos. 0196 to 0228 of JP2016-074649A, compounds described in paragraph No. 0124 of JP2017-067963A, compounds described in WO2017/135359A, compounds described in JP2017-114956A, compounds described in JP6197940B, and compounds described in WO2016/120166A. Examples of the cyanine compound include compounds described in paragraph Nos. 0044 and 0045 of JP2009-108267A, compounds described in paragraph Nos. 0026 to 0030 of JP2002-194040A, compounds described in JP2015-172004A, compounds described in JP2015-172102A, compounds described in JP2008-088426A, compounds described in paragraph No. 0090 of WO2016/190162A, and compounds described in JP2017-031394A. Examples of the croconium compound include compounds described in JP2017-082029A. Examples of the iminium compound include compounds described in JP2008-528706A, compounds described in JP2012-012399A, compounds described in JP2007-092060A, and compounds described in paragraph Nos. 0048 to 0063 of WO2018/043564A. Examples of the phthalocyanine compound include compounds described in paragraph No. 0093 of JP2012-077153A, oxytitanium phthalocyanine described in JP2006-343631A, compounds described in paragraph Nos. 0013 to 0029 of JP2013-195480A, and vanadium phthalocyanine compounds described in JP6081771B. Examples of the naphthalocyanine compound include compounds described in paragraph No. 0093 of JP2012-077153A. Examples of the dithiolene metal complex include compounds described in JP5733804B.

In addition, as the near-infrared absorbing coloring material, squarylium compounds described in JP2017-197437A, squarylium compounds described in JP2017-025311A, squarylium compounds described in WO2016/154782A, squarylium compounds described in JP5884953B, squarylium compounds described in JP6036689B, squarylium compounds described in JP5810604B, squarylium compounds described in paragraph Nos. 0090 to 0107 of WO2017/213047A, pyrrole ring-containing compounds described in paragraph Nos. 0019 to 0075 of JP2018-054760A, pyrrole ring-containing compounds described in paragraph Nos. 0078 to 0082 of JP2018-040955A, pyrrole ring-containing compounds described in paragraph Nos. 0043 to 0069 of JP2018-002773A, squarylium compounds having an aromatic ring at the α-amide position described in paragraph Nos. 0024 to 0086 of JP2018-041047A, amide-linked squarylium compounds described in JP2017-179131A, compounds having a pyrrole bis-type squarylium skeleton or a croconium skeleton described in JP2017-141215A, dihydrocarbazole bis-type squarylium compounds described in JP2017-082029, asymmetric compounds described in paragraph Nos. 0027 to 0114 of JP2017-068120A, pyrrole ring-containing compounds (carbazole type) described in JP2017-067963A, phthalocyanine compounds described in JP6251530B, coloring material described in JP2013-77009A, JP2014-130338A, and WO2015/166779A, combinations of coloring material described in these references, and the like can also be used.

The content of the coloring material in the total solid content of the coloring resin composition is 30 mass % or more, preferably 30 to 90 mass %, more preferably 30 to 80 mass %, and still more preferably 30 to 70 mass %.

In addition, the content of the pigment in the total solid content of the coloring resin composition is preferably 30 mass % or more, preferably 30 to 90 mass %, more preferably 30 to 80 mass %, and still more preferably 30 to 70 mass %.

In addition, the content of the dye in the coloring material is preferably 50 mass % or less, more preferably 40 mass % or less, and still more preferably 30 mass % or less.

In addition, from the reason that it is easy to more effectively suppress the change in film thickness in a case where the obtained film is heated to a high temperature, it is also preferable that the coloring resin composition according to the embodiment of the present invention does not substantially include the dye. The case where the coloring resin composition according to the embodiment of the present invention does not substantially include the dye means that the content of the dye in the total solid content of the coloring resin composition according to the embodiment of the present invention is preferably 0.1 mass % or less, more preferably 0.05 mass % or less, and particularly preferably 0 mass %.

<Specific Resin>

The coloring resin composition according to the embodiment of the present invention includes a polyimide or polyimide precursor (specific resin) including a repeating unit represented by Formula (1-1) or Formula (1-2).

$$—R^{11}—\qquad\text{[Formula (1-1)]}$$

In Formula (1-1), $R^{11}$ represents an aromatic hydrocarbon group having 6 to 14 carbon atoms, and a group obtained by removing (n+2) hydrogen atoms from each of a benzene ring, a naphthalene ring, an anthracene ring, a phenanthrene ring, or a fluorene ring is preferable, a group obtained by removing (n+2) hydrogen atoms from each of a benzene ring, a naphthalene ring, or an anthracene ring is more preferable, and a group obtained by removing (n+2) hydrogen atoms from a benzene ring is still more preferable.

$$—R^{12}—$$

In Formula (1-1), $R^{12}$ is a monovalent substituent which is a substituent on the aromatic hydrocarbon group in $R^{11}$, and any one of the following $R^{1a}$ to $R^{1d}$ is preferable.

In addition, it is preferable that at least one of $R^{12}$'s is any one of $R^{1a}$ to $R^{1c}$.

- $R^{1a}$: a group including at least one acid group selected from the group consisting of a carboxy group, a sulfo group, a phosphoric acid group, a sulfonamide group, and a hydroxy group
- $R^{1b}$: a group including at least one curable group selected from the group consisting of a (meth)acryloxy group, a (meth)acrylamide group, an aromatic vinyl group, a maleimide group, an epoxy group, and an oxetanyl group
- $R^{1c}$: a group having 12 or more carbon atoms
- $R^{1d}$: a substituent other than $R^{1a}$, $R^{1b}$, and $R^{1c}$ described above In addition, from the viewpoint of transparency and curability of the coloring resin composition, it is preferable that $R^{12}$ does not have a phenolic hydroxy group.

<<$R^{1a}$>>

$R^{1a}$ is a group including at least one acid selected from the group consisting of a carboxy group, a sulfo group, a phosphoric acid group, a sulfonamide group, and a hydroxy group, and a group including a carboxy group is preferable.

In the present specification, the sulfonamide group refers to a group represented by $—S(=O)_2—NR^{S1}{}_2$ or $R^{S2}—S(=O)_2—NR^{S3}—$. $R^{S1}$'s each independently represent a hydrogen atom or a hydrocarbon group, and it is preferable that at least one of $R^{S1}$'s is a hydrogen atom and it is more preferable that both $R^{S1}$'s are hydrogen atoms. $R^{S2}$ represents a monovalent substituent, and a hydrocarbon group is preferable. $R^{S3}$ represents a hydrogen atom or a hydrocarbon group, and a hydrogen atom is preferable.

$R^{1a}$ is preferably a group represented by Formula (A-1).

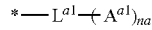

(A-1)

In Formula (A-1), $L^{a1}$ represents a single bond or an (na+1)-valent linking group, $A^{a1}$'s each independently represent a carboxy group, a sulfo group, a phosphoric acid group, a sulfonamide group, or a hydroxy group, na represents an integer of 1 or more, and * represents a bonding site with $R^{11}$.

In Formula (A-1), $L^{a1}$ is preferably a single bond or an (na+1)-valent hydrocarbon group. As the (na+1)-valent hydrocarbon group, an (na+1)-valent aliphatic saturated hydrocarbon group, an (na+1)-valent aromatic hydrocarbon group, or an (na+1)-valent aliphatic hydrocarbon group represented by a bond of an aliphatic saturated hydrocarbon group and an aromatic hydrocarbon group is preferable, and a single bond or an (na+1)-valent aliphatic saturated hydrocarbon group is more preferable.

In the present specification, unless otherwise specified, the description of "alkyl group" or "aliphatic hydrocarbon group" include all alkyl groups or aliphatic hydrocarbon groups having a linear, branched, or a cyclic structure.

As the above-described (na+1)-valent aliphatic saturated hydrocarbon group, a group obtained by removing (na+1) hydrogen atoms from an aliphatic saturated hydrocarbon having 2 to 50 carbon atoms is preferable, a group obtained by removing (na+1) hydrogen atoms from an aliphatic saturated hydrocarbon having 2 to 30 carbon atoms is more preferable, and a group obtained by removing (na+1) hydrogen atoms from an aliphatic saturated hydrocarbon having 2 to 10 carbon atoms is still more preferable.

As the above-described (na+1)-valent aromatic hydrocarbon group, a group obtained by removing (na+1) hydrogen atoms from an aromatic hydrocarbon having 6 to 20 carbon atoms is preferable, a group obtained by removing (na+1) hydrogen atoms from benzene, naphthalene, or anthracene is more preferable, and a group obtained by removing (na+1) hydrogen atoms from benzene is still more preferable.

In Formula (A-1), $A^{a1}$ represents a carboxy group, a sulfo group, a phosphoric acid group, a sulfonamide group, or a hydroxy group, and from the viewpoint of transparency of a resin and curability of the composition, a carboxy group, a sulfo group, a phosphoric acid group, or a sulfonamide group is preferable and a carboxy group is more preferable.

In Formula (A-1), in a case where $A^{a1}$ is a hydroxy group, the above-described hydroxy group is preferably a phenolic hydroxy group. That is, in a case where $A^{a1}$ is a hydroxy group, it is preferable that $L^{a1}$ is a single bond, or a bonding site with $A^{a1}$ in $L^{a1}$ is an aromatic hydrocarbon structure.

In Formula (A-1), na represents an integer of 1 or more, and is preferably an integer of 1 to 10, more preferably an integer of 1 to 4, still more preferably 1 or 2, and particularly preferably 1.

Among these, in Formula (A-1), it is preferable that $L^{a1}$ is a single bond and na is 1, and it is more preferable that $L^{a1}$ is a single bond, na is 1, and $A^{a1}$ is a carboxy group.

<<$R^{1b}$>>

$R^{1b}$ is a group including at least one curable group selected from the group consisting of a (meth)acryloxy group, a (meth)acrylamide group, an aromatic vinyl group, a maleimide group, an epoxy group, and an oxetanyl group, and from the viewpoint of reactivity with a polymerizable compound described later, a group including at least one curable group selected from the group consisting of a (meth)acryloxy group, a (meth)acrylamide group), an aromatic vinyl group, and a maleimide group is preferable, and a group including a (meth)acryloxy group is more preferable.

In addition, in the present specification, the aromatic vinyl group refers to a group in which a vinyl group, which may have a substituent, is directly bonded to an aromatic ring. Examples thereof include a vinylphenyl group, a vinylnaphthyl group, a vinylthienyl group, a vinylpyridyl group, and a vinylimidazolyl group, and a vinylphenyl group is preferable.

$R^{1b}$ is preferably a group represented by Formula (B-1).

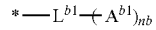

(B-1)

In Formula (B-1), $L^{b1}$ represents a single bond or an (nb+1)-valent linking group, $A^{b1}$'s each independently represent at least one curable group selected from the group consisting of a (meth)acryloxy group, a (meth)acrylamide group, an aromatic vinyl group, a maleimide group, an epoxy group, and an oxetanyl group, nb represents an integer of 1 or more, and * represents a bonding site with $R^{11}$.

In Formula (B-1), $L^{b1}$ represents a single bond or an (nb+1)-valent linking group, and an (nb+1)-valent linking group is preferable. As the above-described (nb+1)-valent linking group, $—O—$, $—S—$, $—C(=O)—$, $—S(=O)_2—$, $P(=O)$, $—NR^N—$, $—N<$, $—CH_2—CH(OH)—CH_2—$, an aliphatic saturated hydrocarbon group, an aromatic hydrocarbon group, or a group in which two or more these groups are bonded is preferable, and a group represented by Formulae (B-2) to (B-7) is more preferable. $R^N$ represents a hydrogen atom or a hydrocarbon group, and a hydrogen atom, an alkyl group, or an aromatic hydrocarbon group is preferable, a hydrogen atom or an alkyl group is more preferable, and a hydrogen atom is particularly preferable.

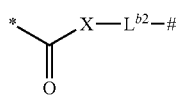
(B-2)

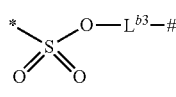
(B-3)

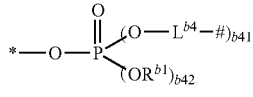
(B-4)

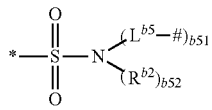
(B-5)

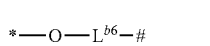
(B-6)

(B-7)

In Formulae (B-2) to (B-7), X represents —O— or —NR$^N$—, L$^{b2}$, L$^{b3}$, L$^{b4}$, L$^{b5}$, L$^{b6}$, and L$^{b7}$ each independently represent a divalent linking group, R$^{b1}$ represents a hydrogen atom or a substituent, R$^{b2}$ represents a hydrogen atom or a substituent, * represents a bonding site with R$^{11}$, #represents a bonding site with A$^{b1}$ in Formula (B-1), b41 is 1 or 2, b42 is 0 or 1, b41+b42 is 2, b51 is 1 or 2, b52 is 0 or 1, and b51+b52 is 2. In addition, R is as described above.

In Formulae (B-2) to (B-7), L$^{b2}$, L$^{b3}$, L$^{b4}$, L$^{b5}$, L$^{b6}$, and L$^{b7}$ each independently represent a divalent linking group, and an alkylene group, a divalent aromatic hydrocarbon ring group, or a group represented by at least two bonds selected from the group consisting of an alkylene group, a divalent aromatic hydrocarbon ring group, —O—, —C(=O)—, —S—, —S(=O)$_2$—, —C(=O)O—, —C(=O)NR$^N$—, —OC(=O)NR$^N$—, —SC(=O)NR$^N$—, —NR$^N$C(=O)NR$^N$—, and —CH$_2$CH(OH)CH$_2$— is preferable. R$^N$ is as described above.

In the present specification, in a case of being simply described as —C(=O)NR$^N$—, —OC(=O)NR$^N$—, and —NR$^N$C(=O)NR$^N$—, the orientation of these bonds in the structure is not particularly limited.

As the above-described alkylene group, an alkylene group having 1 to 20 carbon atoms is preferable, and an alkylene group having 2 to 10 carbon atoms is more preferable.

As the above-described divalent aromatic hydrocarbon ring group, a divalent aromatic hydrocarbon ring group having 6 to 20 carbon atoms is more preferable, and a phenylene group is still more preferable.

In Formula (B-4), R$^{b1}$ represents a hydrogen atom or a substituent, a hydrogen atom or a hydrocarbon group is preferable, a hydrogen atom or an alkyl group is more preferable, and a hydrogen atom is still more preferable.

In Formula (B-5), R$^{b2}$ represents a hydrogen atom or a substituent, a hydrogen atom or a hydrocarbon group is preferable, a hydrogen atom or an alkyl group is more preferable, and a hydrogen atom is still more preferable.

In Formula (B-4), b41 is 1 or 2, and 1 is preferable.
In Formula (B-4), b42 is 0 or 1, and 1 is preferable.
In Formula (B-5), b51 is 1 or 2, and 1 is preferable.
In Formula (B-5), b52 is 0 or 1, and 1 is preferable.
Among these, L$^{b1}$ is preferably a group represented by Formula (B-7).

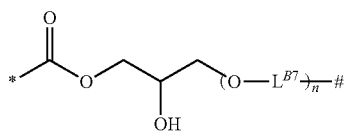
(B-7)

In Formula (B-7), L$^{B7}$'s each independently represent a divalent linking group, n represents an integer of 0 or more, * represents a bonding site with R$^{11}$, and #represents a bonding site with A$^{b1}$ in Formula (B-1).

In Formula (B-7), L$^{B7}$'s each independently represent an alkylene group, a divalent aromatic hydrocarbon ring group, —C(=O)NR$^N$—, —OC(=O)NR$^N$—, —NRC(=O)NR$^N$—, or a group in which two or more these groups are bonded, and an alkylene group is preferable. R$^N$ is as described above.

In Formula (B-7), n represents an integer of 0 or more, and is preferably an integer of 0 to 20, more preferably an integer of 0 to 10, still more preferably 0, 1, or 2, and particularly preferably 0 or 1.

A$^{b1}$'s each independently represent at least one curable group selected from the group consisting of a (meth)acryloxy group, a (meth)acrylamide group, an aromatic vinyl group, a maleimide group, an epoxy group, and an oxetanyl group, and from the viewpoint of reactivity with a polymerizable compound described later, at least one curable group selected from the group consisting of a (meth)acryloxy group, a (meth)acrylamide group), an aromatic vinyl group, and a maleimide group is preferable, and a (meth)acryloxy group is more preferable.

nb represents an integer of 1 or more, and is preferably an integer of 1 to 10, more preferably an integer of 1 to 4, still more preferably 1 or 2, and particularly preferably 1.

<<R$^{1c}$>>

R$^{1c}$ is a group having 12 or more carbon atoms, and does not correspond to R$^{1a}$ and R$^{1b}$ described above.

R$^{1c}$ is preferably a molecular chain having a molecular weight of 1,000 or more and having no acid group and basic group.

In addition, R$^{1c}$ preferably includes at least one selected from the group consisting of a repeating unit derived from a (meth)acrylic acid ester compound, a repeating unit derived from a (meth)acrylamide compound, a repeating unit derived from an aromatic vinyl compound, and a polyester structure.

As the above-described (meth)acrylic acid ester compound, a (meth)acrylic acid alkyl ester compound or a (meth)acrylic acid aryl ester compound is preferable, and a (meth)acrylic acid alkyl ester compound is more preferable.

As the alkyl group in the above-described (meth)acrylic acid alkyl ester compound, an alkyl group having 1 to 20 carbon atoms is preferable, an alkyl group having 1 to 10 carbon atoms is more preferable, an alkyl group having 1 to 4 carbon atoms is still more preferable.

As the aryl group in the above-described (meth)acrylic acid aryl ester compound, an aryl group having 6 to 20 carbon atoms is preferable, a phenyl group or a naphthyl group is more preferable, and a phenyl group is still more preferable.

As the above-described (meth)acrylamide compound, an N,N-dialkyl (meth)acrylamide compound, an N-monoalkyl acrylamide compound, an N-monoaryl acrylamide compound, an N-alkyl-N-aryl (meth)acrylamide compound, or an N,N-diaryl (meth)acrylamide compound is preferable, and a dialkyl (meth)acrylamide compound is more preferable.

As the alkyl group in the above-described N,N-dialkyl (meth)acrylamide compound, N-monoalkyl acrylamide compound, or N-alkyl-N-aryl (meth)acrylamide compound, an alkyl group having 1 to 20 carbon atoms is preferable, an alkyl group having 1 to 10 carbon atoms is more preferable, an alkyl group having 1 to 4 carbon atoms is still more preferable.

As the aryl group in the above-described N-monoaryl acrylamide compound or N,N-diaryl (meth)acrylamide compound, an aryl group having 6 to 20 carbon atoms is preferable, a phenyl group or a naphthyl group is more preferable, and a phenyl group is still more preferable.

As the above-described aromatic vinyl compound, a compound in which a vinyl group is directly bonded to an aromatic hydrocarbon ring or a compound in which a vinyl group is directly bonded to an aromatic heterocyclic ring is preferable, a compound in which a vinyl group is directly bonded to an aromatic hydrocarbon ring is more preferable, and a styrene compound is still more preferable.

As the above-described aromatic hydrocarbon ring, an aromatic hydrocarbon ring having 6 to 20 carbon atoms is preferable, and a benzene ring is more preferable.

As the above-described aromatic heterocyclic ring, an aromatic heterocyclic ring having 5 to 20 ring members is preferable, and a thiophene ring, an imidazole ring, or a pyridine ring is more preferable.

Examples of the above-described styrene compound include styrene, α-methylstyrene, and vinyltoluene, and styrene is preferable.

$R^{1c}$ is preferably a group represented by Formula (C-1) or Formula (C-2).

(C-1)

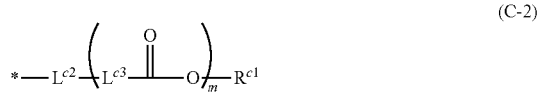

(C-2)

In Formula (C-1) and Formula (C-2), $L^{c1}$ represents a single bond or a divalent linking group, Polymer represents a polymer chain, $L^{c2}$ represents a single bond or a divalent linking group, $L^{c3}$ represents an alkylene group or a divalent aromatic hydrocarbon group, m represents an integer of 1 or more, $R^{c1}$ represents an alkyl group or a monovalent aromatic hydrocarbon group, and * represents a bonding site with $R^{11}$.

In Formula (C-1), $L^{C1}$ is preferably a hydrocarbon group, —O—, —S—, —C(=O)—, —S(=O)$_2$—, P(=O), —NR$^N$—, —N<, or a group in which two or more these groups are bonded.

In addition, in Formula (C-1), $L^{C1}$ is preferably a single bond or a group represented by any one of Formulae (C-3) to (C-8).

(C-3)

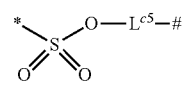

(C-4)

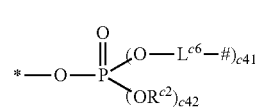

(C-5)

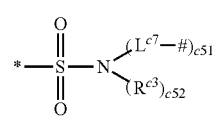

(C-6)

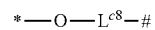

(C-7)

(C-8)

In Formulae (C-3) to (C-8), $L^{c4}$, $L^{c5}$, $L^{c6}$, $L^{c7}$, $L^{c8}$, and $L^{c9}$ each independently represent a divalent linking group, $R^{c2}$ represents a hydrogen atom or a substituent, $R^{c3}$ represents a hydrogen atom or a substituent, * represents a bonding site with $R^{11}$, #represents a bonding site with a sulfur atom in Formula (C-1), c41 is 1 or 2, c42 is 0 or 1, c41+c42 is 2, c51 is 1 or 2, c52 is 0 or 1, and c51+c52 is 2.

In Formulae (C-3) to (C-8), $L^{c4}$, $L^{c5}$, $L^{c6}$, $L^{c7}$, $L^{c8}$, and $L^{c9}$ are each independently preferably an alkylene group, a divalent aromatic hydrocarbon ring group, or a group represented by at least two bonds selected from the group consisting of an alkylene group, a divalent aromatic hydrocarbon ring group, —O—, —C(=O)—, —S—, —S(=O)$_2$—, —C(=O)O—, —C(=O)NR$^N$—, —OC(=O)NR$^N$—, —NR$^N$C(=O)NR$^N$—, and —CH$_2$CH(OH)CH$_2$—, and more preferably an alkylene group. R is as described above.

As the above-described alkylene group, an alkylene group having 1 to 20 carbon atoms is preferable, and an alkylene group having 2 to 10 carbon atoms is more preferable.

As the above-described divalent aromatic hydrocarbon ring group, a divalent aromatic hydrocarbon ring group having 6 to 20 carbon atoms is more preferable, and a phenylene group is still more preferable.

In Formula (C-5), $R^{c2}$ represents a hydrogen atom or a substituent, a hydrogen atom or a hydrocarbon group is preferable, a hydrogen atom or an alkyl group is more preferable, and a hydrogen atom is still more preferable.

In Formula (C-6), $R^{c3}$ represents a hydrogen atom or a substituent, a hydrogen atom or a hydrocarbon group is preferable, a hydrogen atom or an alkyl group is more preferable, and a hydrogen atom is still more preferable.

In Formula (C-5), c41 is 1 or 2, and 1 is preferable.
In Formula (C-5), c42 is 0 or 1, and 1 is preferable.
In Formula (C-6), c51 is 1 or 2, and 1 is preferable.
In Formula (C-6), c52 is 0 or 1, and 1 is preferable.
Among these, $L^{C1}$ is preferably a single bond, a group represented by Formula (C-3), or a group represented by Formula (C-7), and more preferably a group represented by Formula (C-3).

In Formula (C-1), Polymer is preferably a polymer chain including at least one repeating unit selected from the group consisting of a repeating unit derived from a (meth)acrylic acid ester compound, a repeating unit derived from a (meth)acrylamide compound, and a repeating unit derived from an aromatic vinyl compound.

In addition, Polymer is preferably a molecular chain having a molecular weight of 1,000 or more and having no acid group and basic group.

The content of the repeating unit derived from a (meth) acrylic acid ester compound, the repeating unit derived from a (meth)acrylamide compound, and the repeating unit derived from an aromatic vinyl compound in Formula (C-1) is preferably 70 mol % or more, more preferably 80 mol % or more, and still more preferably 90 mol % or more with respect to the total number of moles of repeating units included in the above-described polymer chain. The upper limit of the above-described content is not particularly limited, and may be 100 mol % or less.

In Formula (C-2), $L^{c2}$ has the same meaning as $L^{c1}$, except that, in the explanation in $L^{c1}$, the "bonding site with a sulfur atom in Formula (C-1)" is read as a "bonding site with $L^{c3}$ in Formula (C-2)", and the preferred aspect thereof is also the same.

In Formula (C-2), $L^{c3}$ represents an alkylene group or a divalent aromatic hydrocarbon group, and an alkylene group is preferable.

As the above-described alkylene group, an alkylene group having 2 to 20 carbon atoms is preferable, and an alkylene group having 2 to 10 carbon atoms is more preferable.

As the above-described divalent aromatic hydrocarbon group, a phenylene group is preferable.

In Formula (C-2), m represents an integer of 1 or more, and is preferably an integer of 2 to 50 and more preferably an integer of 2 to 30.

In Formula (C-2), $R^{C1}$ represents an alkyl group or a monovalent aromatic hydrocarbon group, and an alkyl group is more preferable.

As the above-described alkyl group, an alkyl group having 1 to 20 carbon atoms is preferable, and an alkyl group having 1 to 10 carbon atoms is more preferable.

As the above-described monovalent aromatic hydrocarbon group, a phenyl group is preferable.

<<$R^{1d}$>>

$R^{1d}$ is a substituent which does not correspond to $R^{1a}$, $R^{1b}$, and $R^{1c}$ described above.

As $R^{1d}$, an alkyl group having 1 to 10 carbon atoms or an aromatic hydrocarbon group having 6 to 10 carbon atoms is preferable, and an alkyl group having 1 to 4 carbon atoms is more preferable.

In a case where $R^{11}$ has $R^{1d}$, for example, it is possible to adjust solubility in a solvent, and the like.

—Diamine Compound—

In addition, $R^{11}$ substituted with $R^{12}$ preferably has a structure induced by a diamine compound.

Examples of the diamine compound include the following compounds.

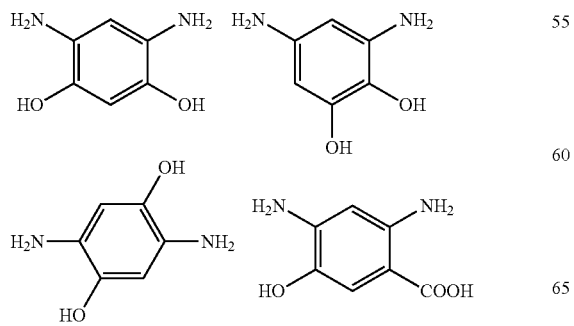

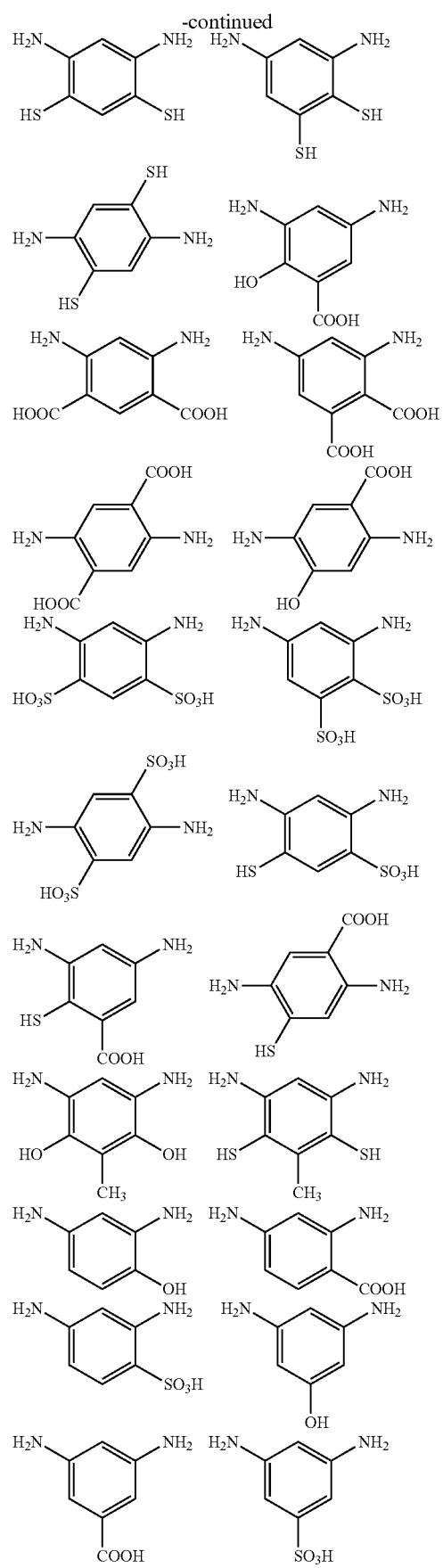

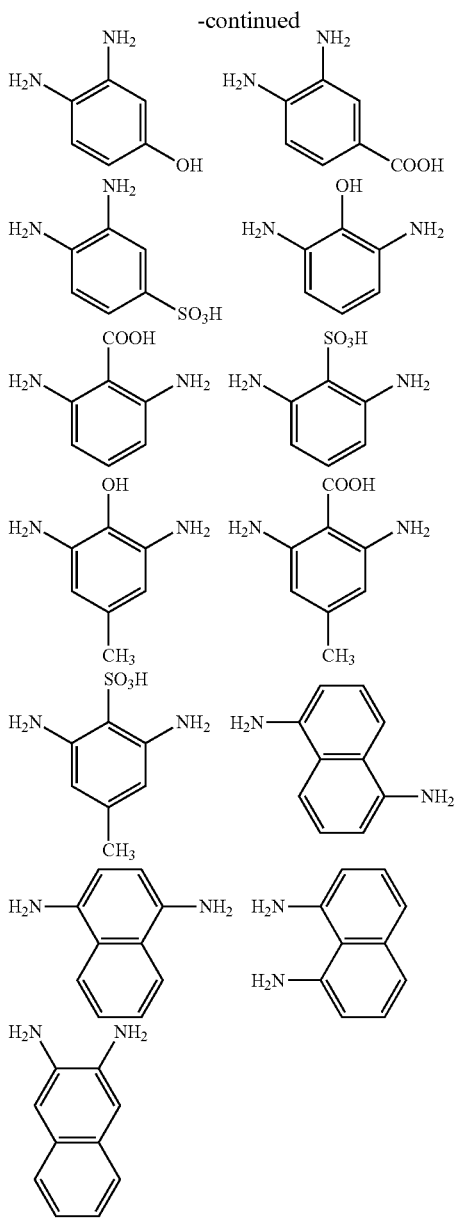

For example, by reacting these compounds with a tetravalent carboxylic acid compound described later, the polyimide or polyimide precursor having the repeating unit according to Formula (1-1) or Formula (1-2) can be synthesized.

In addition, for example, by carrying out a reaction such as esterification with a hydroxy group, a carboxy group, a sulfo group, a thiol group, and the like in these compounds, the substituent described as $R^{12}$ above can be introduced.

Among these, as the diamine compound, 3,5-diaminobenzoic acid is preferable.

—$R^{13}$—

$R^{13}$ represents a tetravalent organic group, and it is preferable to include an alicyclic structure or an aromatic ring structure, and from the viewpoint of transparency of the resin, it is more preferable to be a group including an alicyclic structure or including a fluorine atom and an aromatic ring structure, and it is still more preferable to be a group including an alicyclic structure.

In addition, from the viewpoint of transparency and curability of the coloring resin composition, in a case where $R^{13}$ includes an aromatic ring structure, it is preferable that $R^{13}$ does not have a phenolic hydroxy group.

<<Group Including Alicyclic Structure>>

The alicyclic structure in the group including an alicyclic structure may be a saturated alicyclic structure, but is preferably an unsaturated alicyclic structure.

The number of ring members in the above-described alicyclic structure is preferably 4 to 20 and more preferably 6 to 10.

In addition, the above-described alicyclic structure may be any of a monocyclic structure, a fused ring structure, a crosslinked ring structure, or a spiro ring structure, but a monocyclic structure or a crosslinked ring structure is preferable.

The group including an alicyclic structure is preferably a group represented by Formulae (D-1) to (D-3).

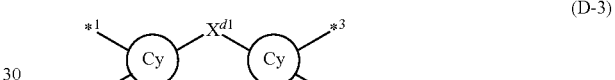

In Formulae (D-1) to (D-3), Cy's each independently represent an alicyclic structure, $R^{d1}$ represents a linear or branched aliphatic hydrocarbon group, $X^{d1}$ represents a single bond or a divalent linking group, and *$^1$ to *$^4$ each independently represent a bonding site with other structures.

In Formulae (D-1) to (D-3), a preferred aspect of the alicyclic structure represented by Cy is the same as the preferred aspect of the alicyclic structure described above.

In Formula (D-1), it is preferable that *$^1$ and *2, or *3 and *4 exist at adjacent positions in the alicyclic structure Cy.

In the present specification, the fact that a certain bonding site and another bonding site exist at adjacent positions means that a ring member in the above-described cyclic structure in which a certain bonding site exists and a ring member in the cyclic structure in which another bonding site exists are adjacent ring members in the cyclic structure. For example, in a case where the cyclic structure is a benzene ring structure, the adjacent position is the ortho position.

In Formula (D-2), $R^{d1}$ represents a linear or branched aliphatic hydrocarbon group, and an aliphatic saturated hydrocarbon group is preferable.

The number of carbon atoms in the above-described aliphatic hydrocarbon group is preferably 2 to 10, more preferably 2 to 4, and still more preferably 2.

In Formula (D-2), it is preferable that *$^3$ and *$^4$ exist one by one at the adjacent carbon atom in the aliphatic hydrocarbon group $R^{d1}$.

In Formula (D-2), it is preferable that *$^3$ and *$^4$ exist at adjacent positions in the alicyclic structure Cy.

In Formula (D-3), $X^{d1}$ represents a single bond or a divalent linking group, and a single bond, an aliphatic hydrocarbon group having 1 to 10 carbon atoms, which may be substituted with a fluorine atom, —O—, —C(=O)—, —S—, —S(=O)$_2$—, —NHCO—, or a group of a combination of two or more these groups is preferable, an alkylene group having 1 to 3 carbon atoms, which may be substituted with a fluorine atom, —O—, —C(=O)—, —S—, or —S(=O)$_2$— is more preferable, and —CH$_2$—, —O—, —S—, —S(=O)$_2$—, —C(CF$_3$)$_2$—, or —C(CH$_3$)$_2$— is still more preferable.

<<Group Including Fluorine Atom and Aromatic Ring Structure>>

As the aromatic ring structure in the group including a fluorine atom and an aromatic ring structure, an aromatic ring structure having 6 to 30 carbon atoms is preferable, an aromatic ring structure having 6 to 20 carbon atoms is more preferable, and a benzene ring structure is still more preferable. In addition, the above-described aromatic ring structure may be an aromatic heterocyclic ring structure, but is preferably an aromatic hydrocarbon ring structure.

The group including a fluorine atom and an aromatic ring structure may be a structure in which two or more of the above-described aromatic ring structures are linked by a single bond or a linking group. As the above-described linking group, an aliphatic hydrocarbon group having 1 to 10 carbon atoms, which may be substituted with a fluorine atom, —O—, —C(=O)—, —S—, —S(=O)$_2$—, —NHCO—, or a group of a combination of two or more these groups is preferable, an alkylene group having 1 to 3 carbon atoms, which may be substituted with a fluorine atom, —O—, —C(=O)—, —S—, or —S(=O)$_2$— is more preferable, —CH$_2$—, —O—, —S—, —S(=O)$_2$—, —C(CF$_3$)$_2$—, or —C(CH$_3$)$_2$— is still more preferable, and —C(CF$_3$)$_2$— is particularly preferable.

The fluorine atom may be directly bonded to the aromatic ring structure, but is preferably included as an alkyl fluoride group and more preferably included as an alkyl fluoride group in the above-described linking group. Examples of a preferred alkyl fluoride group include a group represented by —C$_x$F$_{2x+1}$. x is an integer of 1 or more, preferably an integer of 1 to 10, more preferably an integer of 1 to 4, still more preferably 1 or 2, and particularly preferably 1.

As the group including a fluorine atom and an aromatic ring structure, a structure represented by Formula (E-1) is preferable.

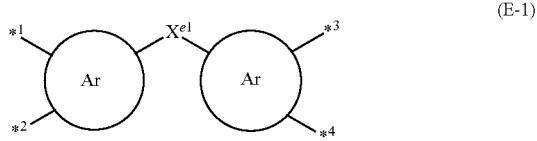

(E-1)

In Formula (E-1), Ar's each independently represent an aromatic ring structure, $X^{e1}$ represents a divalent linking group including a fluorine atom, and *$^1$ to *$^4$ each independently represent a bonding site with other structures.

Ar in Formula (E-1) has the same meaning as the aromatic ring structure in the above-described group including a fluorine atom and an aromatic ring structure, and the preferred aspect thereof is also the same.

$X^{e1}$ in Formula (E-1) is preferably an alkylene group having 1 to 10 carbon atoms, which is substituted with a fluorine atom, more preferably an alkylene group having 1 to 5 carbon atoms, which is substituted with a fluorine atom, still more preferably —C(CF$_3$)$_2$—, —C(CF$_3$)(C$_2$F$_5$)—, or —C(C$_2$F$_5$)$_2$—, and particularly preferably —C(CF$_3$)$_2$—.

In Formula (E-1), it is preferable that *$^1$ and *$^2$, or *$^3$ and *$^4$ exist at adjacent positions in the aromatic ring structure Ar.

<<Other Tetravalent Linking Group>>

$R^{13}$ may be a tetravalent linking group other than the above-described alicyclic structure or group including a fluorine atom and an aromatic ring structure.

Examples of the other tetravalent linking group include a group including an aliphatic hydrocarbon group which does not have an alicyclic structure and a group including an aromatic ring structure and not including a fluorine atom.

As the saturated aliphatic hydrocarbon group in the above-described group including an aliphatic hydrocarbon group which does not have an alicyclic structure, an aliphatic hydrocarbon group having 2 to 20 carbon atoms is preferable and an aliphatic hydrocarbon group having 2 to 10 carbon atoms is more preferable. In addition, as the above-described aliphatic hydrocarbon group, a saturated aliphatic hydrocarbon group is preferable.

The group including an aliphatic hydrocarbon group which does not have an alicyclic structure may be a structure in which two or more of the above-described aliphatic hydrocarbon groups are linked by a single bond or a linking group. As the above-described linking group, an aliphatic hydrocarbon group having 1 to 10 carbon atoms, which may be substituted with a fluorine atom, —O—, —C(=O)—, —S—, —S(=O)$_2$—, —NHCO—, or a group of a combination of two or more these groups is preferable, and an alkylene group having 1 to 3 carbon atoms, which may be substituted with a fluorine atom, —O—, —C(=O)—, —S—, or —S(=O)$_2$— is more preferable.

As the aromatic ring structure in the above-described group including an aromatic ring structure and not including a fluorine atom, an aromatic ring structure having 6 to 30 carbon atoms is preferable, an aromatic ring structure having 6 to 20 carbon atoms is more preferable, and a benzene ring structure is still more preferable. In addition, the above-described aromatic ring structure may be an aromatic heterocyclic ring structure, but is preferably an aromatic hydrocarbon ring structure.

The group including an aromatic ring structure and not including a fluorine atom may be a structure in which two or more of the above-described aromatic ring structures are linked by a single bond or a linking group. As the above-described linking group, an aliphatic hydrocarbon group having 1 to 10 carbon atoms, which is not substituted with a fluorine atom, —O—, —C(=O)—, —S—, —S(=O)$_2$—, —NHCO—, or a group of a combination of two or more these groups is preferable, and an alkylene group having 1 to 3 carbon atoms, which is not substituted with a fluorine atom, —O—, —C(=O)—, —S—, or —S(=O)$_2$— is more preferable.

In addition, $R^{13}$ is preferably a structure represented by any one of Formulae (I-1) to (I-28).

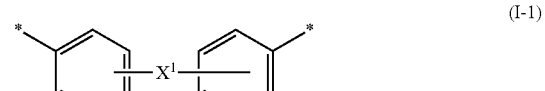

(I-1)

(I-2)

(I-3)

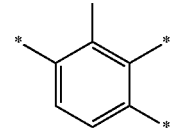

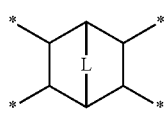 (I-4)
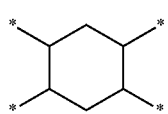 (I-5)
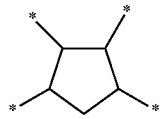 (I-6)
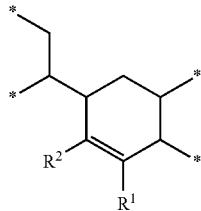 (I-7)
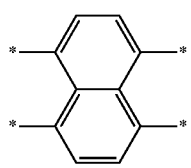 (I-8)
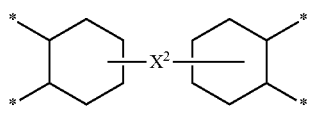 (I-9)
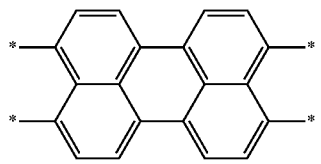 (I-10)
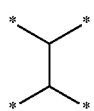 (I-11)
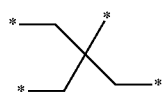 (I-12)
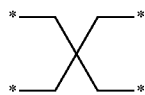 (I-13)
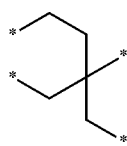 (I-14)
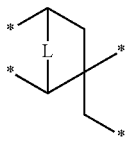 (I-15)
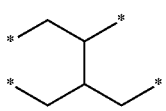 (I-16)
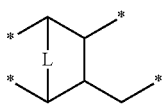 (I-17)
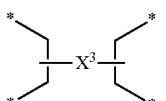 (I-18)
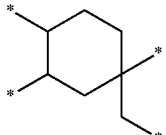 (I-19)
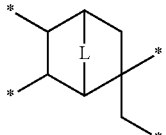 (I-20)
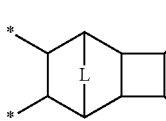 (I-21)
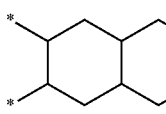 (I-22)
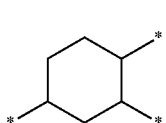 (I-23)
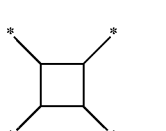 (I-24)
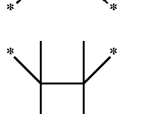 (I-25)
(I-26)

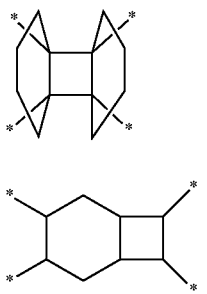

(I-27)

(I-28)

In Formulae (I-1) to (I-28), $X^1$ to $X^3$ represent a single bond or a divalent linking group, L represents —CH=CH— or —CH$_2$—, $R^1$ and $R^2$ each independently represent a hydrogen atom or a substituent, $R^1$ and $R^2$ may be bonded to each other to form a ring structure, and * represents a bonding site with other structures.

In Formulae (I-1) to (I-28), $X^1$ to $X^3$ represent a single bond or a divalent linking group, and a single bond, —C(Rx)$_2$— (Rx represents a hydrogen atom or a substituent; in a case where Rx is a substituent, Rx's may be bonded to each other to form a ring), —O—, —S(=O)$_2$—, —C(=O), —S—, —NR$^N$—, a phenylene group, or a combination thereof is preferable, and a single bond or —C(RX)$_2$— is more preferable. In a case where Rx represents a substituent, specific examples thereof include an alkyl group which may be substituted with a fluorine atom.

In Formulae (I-1) to (I-28), L represents —CH=CH— or —CH$_2$—, and —CH=CH— is preferable.

In Formulae (I-1) to (I-28), $R^1$ and $R^2$ each independently preferably represent a hydrogen atom or an alkyl group, more preferably represent a hydrogen atom, a methyl group, or an ethyl group, and still more preferably represent a hydrogen atom.

Among these, $R^{13}$ is preferably a group represented by Formulae (I-29) to (I-32), more preferably a group represented by Formulae (I-30) to (I-32), and still more preferably a group represented by Formula (I-31) or Formula (I-32).

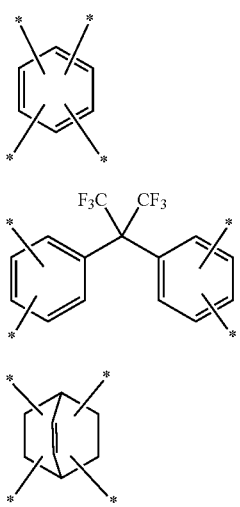

(I-29)

(I-30)

(I-31)

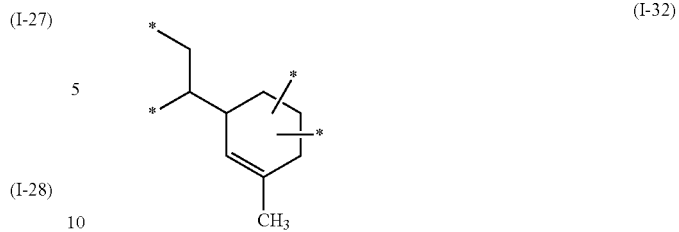

(I-32)

$R^{13}$ is preferably a structure induced from a tetravalent carboxylic acid.

Examples of the above-described tetravalent carboxylic acid include compounds of Formulae (I-1) to (I-31), in which * is replaced with a carboxy group. In addition, in the above-described compounds, at least two of the carboxy groups may be anhydrideized, the carboxy group may form a salt with another compound, the carboxy group may form an ester with another structure, or the carboxy group may be halogenated to a carboxylic acid halide (for example, carboxylic acid chloride).

[Formula (1-2)]
—$R^{21}$, $R^{22}$, m, and $R^{23}$—

$R^{21}$, $R^{22}$, m, and $R^{23}$ in Formula (1-2) have the same meaning as $R^{11}$, $R^{12}$, n, and $R^{13}$ in Formula (1-1), respectively, and the preferred aspects thereof are also the same.

The description of "$R^{11}$" in the above description of $R^{12}$ is read as "$R^{21}$" in $R^{22}$.

—$R^{24}$—

In Formula (1-2), $R^{24}$'s are each independently a monovalent substituent, and a group $R^{2a}$ including at least one acid group selected from the group consisting of a carboxy group, a sulfo group, a phosphoric acid group, a sulfonamide group, and a hydroxy group, a group $R^{2b}$ including at least one curable group selected from the group consisting of a (meth)acryloxy group, a (meth)acrylamide group, an aromatic vinyl group, a maleimide group, an epoxy group, and an oxetanyl group, or a group $R^{2c}$ having 12 or more carbon atoms is preferable. In addition, $R^{24}$ may be a substituent $R^{2d}$ other than $R^{2a}$, $R^{2b}$, and $R^{2c}$ described above.

<<$R^{2a}$>>

$R^{2a}$ is a group including at least one acid group selected from the group consisting of a carboxy group, a sulfo group, a phosphoric acid group, a sulfonamide group, and a hydroxy group, and a hydroxy group or a group represented by Formula (A2-1) is preferable and a hydroxy group is more preferable.

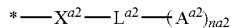

(A2-1)

*—$X^{a2}$—$L^{a2}$—($A^{a2}$)$_{na2}$

In Formula (A2-1), $X^{a2}$ represents —O— or —NR$^N$—, $L^{a2}$ represents a single bond or an (na2+1)-valent linking group, $A^{a2}$'s each independently represent a carboxy group, a sulfo group, a phosphoric acid group, a sulfonamide group, or a hydroxy group, na2 represents an integer of 1 or more, * represents a bonding site with a carbonyl group to which $R^{24}$ in Formula (1-2) is bonded, and $R^N$ is as described above.

In Formula (A2-1), $X^{a2}$ represents —O— or —NR$^N$—, and —O— is preferable.

$L^{a2}$, $A^{a2}$, and na2 in Formula (A2-1) have the same meanings as $L^{a1}$, $A^{a1}$, and na in Formula (A-1) described above, respectively, and the preferred aspects thereof are also the same.

<<$R^{2b}$>>

$R^{2b}$ is a group including at least one curable group selected from the group consisting of a (meth)acryloxy group, a (meth)acrylamide group, an aromatic vinyl group, a maleimide group, an epoxy group, and an oxetanyl group, and from the viewpoint of reactivity with a polymerizable compound described later, a group including at least one curable group selected from the group consisting of a (meth)acryloxy group, a (meth)acrylamide group), an aromatic vinyl group, and a maleimide group is preferable, and a group including a (meth)acryloxy group is more preferable.

In addition, $R^{2b}$ is preferably a group represented by Formula (B2-1).

(B2-1)

In Formula (B2-1), $X^{b2}$ represents a single bond, —O—, or —NR$^N$—, $L^{b21}$ represents a single bond or an (nb2+1)-valent linking group, $A^{b2}$'s each independently represent at least one curable group selected from the group consisting of a (meth)acryloxy group, a (meth)acrylamide group, an aromatic vinyl group, a maleimide group, an epoxy group, and an oxetanyl group, nb2 represents an integer of 1 or more, * represents a bonding site with a carbonyl group to which $R^{24}$ in Formula (1-2) is bonded, and $R^N$ is as described above.

In Formula (B2-1), $X^{b2}$ represents a single bond, —O—, or —NR$^N$—, and —O— is preferable.

In Formula (B2-1), $L^{b21}$ represents a single bond or an (nb2+1)-valent linking group, and an (nb2+1)-valent linking group is preferable. As the above-described (nb2+1)-valent linking group, an alkylene group, a divalent aromatic hydrocarbon ring group, or a group represented by at least two bonds selected from the group consisting of an alkylene group, a divalent aromatic hydrocarbon ring group, —O—, —C(=O)—, —S—, —S(=O)$_2$—, —C(=O)O—, —C(=O)NR$^N$—, —OC(=O)NR$^N$—, —NR$^N$C(=O)NR$^N$—, and —CH$_2$CH(OH)CH$_2$— is preferable. $R^N$ is as described above.

As the above-described alkylene group, an alkylene group having 1 to 20 carbon atoms is preferable, and an alkylene group having 2 to 10 carbon atoms is more preferable.

As the above-described divalent aromatic hydrocarbon ring group, a divalent aromatic hydrocarbon ring group having 6 to 20 carbon atoms is more preferable, and a phenylene group is still more preferable.

$A^{b2}$'s each independently represent at least one curable group selected from the group consisting of a (meth)acryloxy group, a (meth)acrylamide group, an aromatic vinyl group, a maleimide group, an epoxy group, and an oxetanyl group, and from the viewpoint of reactivity with a polymerizable compound described later, at least one curable group selected from the group consisting of a (meth)acryloxy group, a (meth)acrylamide group), an aromatic vinyl group, and a maleimide group is preferable, and a (meth)acryloxy group is more preferable.

nb2 represents an integer of 1 or more, and is preferably an integer of 1 to 10, more preferably an integer of 1 to 4, still more preferably 1 or 2, and particularly preferably 1.

<<$R^{2c}$>>

$R^{2c}$ is a group having 12 or more carbon atoms, and does not correspond to $R^{2a}$ and $R^{2b}$ described above.

$R^{2c}$ is preferably a molecular chain having a molecular weight of 1,000 or more and having no acid group and basic group.

In addition, $R^{2c}$ preferably includes at least one selected from the group consisting of a repeating unit derived from a (meth)acrylic acid ester compound, a repeating unit derived from a (meth)acrylamide compound, a repeating unit derived from an aromatic vinyl compound, and a polyester structure. Preferred aspects of these compounds in $R^{2c}$ are the same as the preferred aspects of these compounds in $R^{c1}$ described above.

In addition, $R^{2c}$ is preferably a group represented by Formula (C2-1) or Formula (C2-2).

(C2-1)

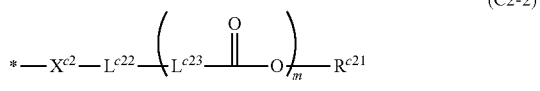
(C2-2)

In Formula (C2-1) and Formula (C2-2), $X^{c2}$ represents —O— or —NR$^N$ $L^{c21}$ represents a divalent linking group, Polymer represents a polymer chain, $L^{c22}$ represents a single bond or a divalent linking group, $L^{c23}$ represents an alkylene group or a divalent aromatic hydrocarbon group, m represents an integer of 1 or more, $R^{c21}$ represents an alkyl group or a monovalent aromatic hydrocarbon group, * represents a bonding site with a carbonyl group to which $R^{24}$ in Formula (1-2) is bonded, and $R^N$ is as described above.

In Formulae (C2-1) and Formula (C2-2), $X^{c2}$ represents —O— or —NR$^N$—, and —O— is preferable.

In Formula (C2-1), $L^{c21}$ represents a divalent linking group, and an alkylene group, a divalent aromatic hydrocarbon ring group, or a group represented by at least two bonds selected from the group consisting of an alkylene group, a divalent aromatic hydrocarbon ring group, —O—, —C(=O)—, —S—, —S(=O)$_2$—, —C(=O)O—, —C(=O)NR$^N$—, —OC(=O)NR$^N$—, —NR$^N$C(=O) NR$^N$—, and —CH$_2$CH(OH)CH$_2$— is preferable, and an alkylene group is more preferable. $R^N$ is as described above.

Polymer in Formula (C2-1) has the same meaning as Polymer in Formula (C-1), and the preferred aspect thereof is also the same.

In Formula (C2-2), $L^{c22}$ represents a single bond or a divalent linking group, and a divalent linking group is preferable. The above-described divalent linking group has the same meaning as the divalent linking group in $L^{c21}$ described above, and the preferred aspect thereof is also the same.

$L^{c23}$, m, and $R^{c21}$ in Formula (C2-2) have the same meaning as $L^{c3}$, m, and $R^{c1}$ in Formula (C-2), respectively, and the preferred aspects thereof are also the same.

<<$R^{2d}$>>

$R^{2d}$ is a substituent which does not correspond to $R^{2a}$, $R^{2b}$, and $R^{2c}$ described above.

As $R^{2d}$, an alkoxy group having 1 to 10 carbon atoms or an aryloxy group having 6 to 10 carbon atoms is preferable, and an alkoxy group having 1 to 4 carbon atoms is more preferable.

—n— n represents an integer of 0 to nA, and is preferably 1 to 3, more preferably 1 or 2, and still more preferably 1.

nA is the maximum number of substitutions of the aromatic hydrocarbon group in $R^{11}$.

The maximum number of substitutions of $R^{11}$ refers to the maximum number of substituents which can be included in the aromatic group having 5 to 30 ring members, represented by $R^{11}$, and in a case where $R^{11}$ is a benzene ring structure, the maximum number of substitutions is 4. Hereinafter, the above-described contents are the same in the description of the maximum number of substitutions.

—m— m represents an integer of 0 to mA, and is preferably 1 to 3, more preferably 1 or 2, and still more preferably 1. mA is the maximum number of substitutions of the aromatic hydrocarbon group in $R^{21}$.

Among these aspects, from the viewpoint of developability, the polyimide or polyimide precursor including a repeating unit represented by Formula (1-1) or Formula (1-2) preferably includes at least one repeating unit selected from the group consisting of a repeating unit 1-1a which is the repeating unit represented by Formula (1-1) and in which $R^{12}$ in Formula (1-1) is a group $R^{1a}$ including at least one acid group selected from the group consisting of a carboxy group, a sulfo group, a phosphoric acid group, a sulfonamide group, and a hydroxy group, and a repeating unit 1-2a which is the repeating unit represented by Formula (1-2) and in which $R^{22}$ in Formula (1-2) is $R^{1a}$.

From the viewpoint of pattern formability, the polyimide or polyimide precursor including a repeating unit represented by Formula (1-1) or Formula (1-2) preferably includes at least one repeating unit selected from the group consisting of a repeating unit 1-1b which is the repeating unit represented by Formula (1-1) and in which $R^{12}$ in Formula (1-1) is a group $R^{1b}$ including at least one curable group selected from the group consisting of a (meth)acryloxy group, a (meth)acrylamide group, an aromatic vinyl group, a maleimide group, an epoxy group, and an oxetanyl group, and a repeating unit 1-2b which is the repeating unit represented by Formula (1-2) and in which $R^{22}$ in Formula (1-2) is $R^{1b}$.

From the viewpoint of dispersion storage stability, the polyimide or polyimide precursor including a repeating unit represented by Formula (1-1) or Formula (1-2) preferably includes at least one repeating unit selected from the group consisting of a repeating unit 1-1c which is the repeating unit represented by Formula (1-1) and in which $R^{12}$ in Formula (1-1) is a group $R^{1c}$ having 12 or more carbon atoms, and a repeating unit 1-2c which is the repeating unit represented by Formula (1-2) and in which $R^{22}$ in Formula (1-2) is $R^{1c}$.

[Formula (2-1) or Formula (2-2)]

In addition, the specific resin is preferably a polyimide or polyimide precursor including a repeating unit represented by Formula (2-1) or Formula (2-2).

The repeating unit represented by Formula (2-1) is a preferred aspect of the repeating unit represented by Formula (1-1), and the repeating unit represented by Formula (2-2) is a preferred aspect of the repeating unit represented by Formula (1-2).

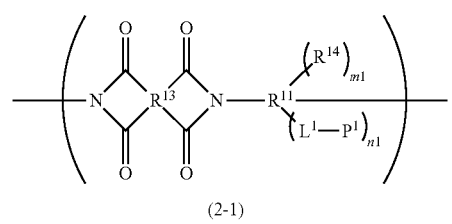

(2-1)

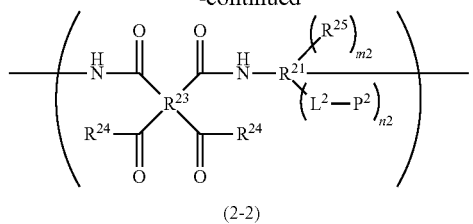

(2-2)

In Formula (2-1), $R^{11}$ represents an aromatic hydrocarbon group having 6 to 14 carbon atoms, $L^1$ represents a group represented by Formula (L-1), Formula (L-2), or Formula (L-3), $P^1$ represents a molecular chain having a molecular weight of 1,000 to 10,000 and having no acid group and basic group, n1 is 1 or 2, $R^{14}$ represents a monovalent substituent which is a substituent on the aromatic hydrocarbon group in $R^{11}$, m1 represents an integer of 0 to nA1, nA1 is a number obtained by subtracting n1 from a maximum number of substitutions of the aromatic hydrocarbon group in $R^{11}$, and $R^{13}$ represents a tetravalent organic group, in Formula (2-2), $R^{21}$ represents an aromatic hydrocarbon group having 6 to 14 carbon atoms, $L^2$ represents a group represented by Formula (L-1), Formula (L-2), or Formula (L-3), $P^2$ represents a molecular chain having a molecular weight of 1,000 to 10,000 and having no acid group and basic group, n2 is 1 or 2, $R^{25}$ represents a monovalent substituent which is a substituent on the aromatic hydrocarbon group in $R^{21}$, m2 represents an integer of 0 to nA2, nA2 is a number obtained by subtracting n2 from a maximum number of substitutions of the aromatic hydrocarbon group in $R^{21}$, $R^{23}$ represents a tetravalent organic group, and $R^{24}$'s each independently represent a monovalent substituent.

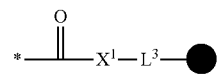 (L-1)

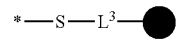 (L-2)

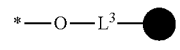 (L-3)

In Formula (L-1), Formula (L-2), or Formula (L-3), $X^1$ represents —O— or —$NR^N$—, $L^3$ represents a single bond, —O—, —$NR^N$—, —S—, —C(=O)—, —$NR^N$(C=O)O—, —$CH_2$—CH(OH)—$CH_2$—, a hydrocarbon group, or a group of a combination of two or more these groups, * represents a bonding site with $R^{11}$ or $R^{21}$, ● represents a bonding site with $P^1$ or $P^2$, and $R^N$ represents a hydrogen atom or a hydrocarbon group.

—$R^{11}$, $R^{13}$, $R^{21}$, $R^{23}$, and $R^{24}$—

$R^{11}$, $R^{13}$, $R^{21}$, $R^{23}$, and $R^{24}$ in Formula (2-1) and Formula (2-2) have the same meaning as $R^{11}$, $R^{13}$, $R^{21}$, $R^{23}$, and $R^{24}$ in Formula (1-1) or Formula (1-2), respectively, and the preferred aspects thereof are also the same.

—$L^1$—

In Formula (2-1), $L^1$ is preferably a group represented by Formula (L-1).

In Formula (L-1), $X^1$ represents —O— or —$NR^N$—, and —O— is preferable. $R^N$ is as described above.

In Formulae (L-1) to (L-3), $L^3$ represents a single bond, —O—, —$NR^N$—, —S—, —C(=O)—, —$NR^N$(C=O)O—, —$CH_2$—CH(OH)—$CH_2$—, a hydrocarbon group, or a group of a combination of two or more these groups, and —O—, —C(=O)—, a hydrocarbon group, a group of a combination of two or more these groups, a single bond, or a group represented by Formula (L-4) is preferable.

In particular, In a case where $P^1$ is the same group as the polymer chain represented by Polymer in Formula (C-1) described above, $L^3$ is preferably a group represented by Formula (C-4), and in a case where $P^1$ is Formula (C-2) described above and $L^{c2}$ is a group of a single bond, $L^3$ is preferably —O—, —C(=O)—, a hydrocarbon group, a group of a combination of two or more these groups, or a single bond.

As the above-described hydrocarbon group, an alkylene group having 1 to 20 carbon atoms or an aromatic hydrocarbon group having 6 to 20 carbon atoms is preferable, an alkylene group having 1 to 20 carbon atoms is more preferable, and an alkylene group having 1 to 4 carbon atoms is still more preferable.

$$*-L^4-S-\bullet \quad (L\text{-}4)$$

In Formula (L-4), $L^4$ represents a single bond, —O—, —$NR^N$—, —S—, —C(=O)—, —NR(C=O)O—, —CH$_2$—CH(OH)—CH$_2$—, a hydrocarbon group, or a group of a combination of two or more these groups, and —O—, —C(=O)—, a hydrocarbon group, or a group of a combination of two or more these groups is preferable.

As the above-described hydrocarbon group, an alkylene group having 1 to 20 carbon atoms or an aromatic hydrocarbon group having 6 to 20 carbon atoms is preferable, an alkylene group having 1 to 20 carbon atoms is more preferable, and an alkylene group having 1 to 4 carbon atoms is still more preferable.

In addition, in Formula (L-4), * represents a bonding site with $X^1$ in Formula (L-1), a sulfur atom in Formula (L-2), or an oxygen atom in Formula (L-3), and ● has the same meaning as ● in Formulae (L-1) to (L-3).

—$P^1$—

$P^1$ represents a molecular chain having a molecular weight of 1,000 to 10,000 and having no acid group and basic group, and a molecular chain including at least one selected from the group consisting of a repeating unit derived from a (meth)acrylic acid ester compound, a repeating unit derived from a (meth)acrylamide compound, a repeating unit derived from an aromatic vinyl compound, and a polyester structure is preferable.

Preferred aspects of these compounds in $P^1$ are the same as the preferred aspects of these compounds in $R^{c1}$ described above.

In addition, $P^1$ is preferably the same group as the polymer chain represented by Polymer in Formula (C-1) described above, or a group which is Formula (C-2) described above in which $L^{c2}$ is a single bond.

$R^{14}$ represents a monovalent substituent, and examples of the monovalent substituent include the group corresponding to $R^{1d}$ described above.

—n1—

In Formula (2-1), n1 represents 1 or 2, and 1 is preferable.

—m1— m1 represents an integer of 0 to nA1 and is preferably an integer of 0 to 3 and more preferably 0.

—$L^2$, $P^2$, $R^{25}$, n2, and m2—

L2, P2, $R^{25}$, n2, and m2 in Formula (2-2) have the same meaning as $L^1$, $P^1$, $R^{14}$, n1, and m1 in Formula (2-1), respectively, and the preferred aspects thereof are also the same.

[Other Repeating Units]

The polyimide or polyimide precursor in the present invention may further include a repeating unit other than Formula (1-1), Formula (1-2), Formula (2-1), or Formula (2-2) described above.

Examples of the other repeating units include a repeating unit represented by Formula (3-1) or Formula (3-2).

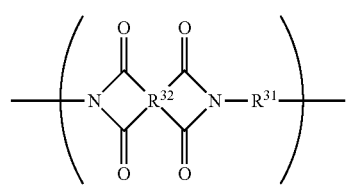

(3-1)

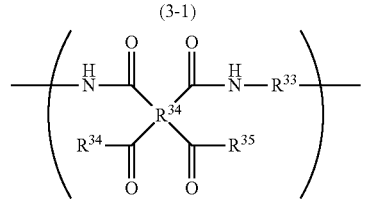

(3-2)

In Formula (3-1), $R^{31}$ represents a divalent linking group other than an aromatic hydrocarbon group having 6 to 14 carbon atoms, and $R^{32}$ represents a tetravalent organic group, in Formula (3-2), $R^{33}$ represents a divalent linking group other than the aromatic hydrocarbon group having 6 to 14 carbon atoms, $R^{34}$ represents a tetravalent organic group, and $R^{35}$'s each independently represent a monovalent substituent.

In Formula (3-1), $R^{31}$ represents a divalent linking group other than an aromatic hydrocarbon group having 6 to 14 carbon atoms, and preferred examples thereof include an aliphatic hydrocarbon group and a group in which two or more hydrocarbon groups are bonded by a single bond or a linking group.

As the above-described aliphatic hydrocarbon group, a linear alkylene group having 2 to 20 carbon atoms or a branched or cyclic alkylene group having 3 to 20 carbon atoms is preferable, and an alkylene group having 2 to 10 carbon atoms or a branched or cyclic alkylene group having 3 to 10 carbon atoms is more preferable.

The above-described hydrocarbon groups bonded by a linking group may be either an aliphatic hydrocarbon group or an aromatic hydrocarbon group, and examples thereof include a linear alkylene group having 2 to 20 carbon atoms, a branched or cyclic alkylene group having 3 to 20 carbon atoms, and an aromatic group having 6 to 30 carbon atoms.

Examples of the above-described linking group include —O—, —S—, —C(CH$_3$)$_2$—, —C(CF$_3$)$_2$—, —C(=O)—, —S(=O)$_2$—, —SiR$_2$— (R's each independently represent a hydrocarbon group, and an alkyl group having 1 to 4 carbon atoms or a phenyl group is preferable), and a polysiloxane group (—Si(R)—(O—Si)$_n$—; R represents a hydrocarbon group, and an alkyl group having 1 to 4 carbon atoms or a phenyl group is preferable; n represents an integer of 1 or more, and 1 to 10 is preferable).

In Formula (3-1), $R^{31}$ may have the substituent shown in $R^{1a}$ to $R^{1d}$ described above.

In addition, from the viewpoint of solubility in a solvent, $R^{31}$ is also preferably a group including a fluorine atom and an aromatic group.

As the above-described group including a fluorine atom and an aromatic group, a group in which two or more aromatic groups are bonded by a linking group and the linking group is a linking group including a fluorine atom, or a group in which two or more aromatic groups are bonded by a single bond or a linking group and the aromatic group is a group substituted with a fluorine atom is preferable.

Examples of the above-described linking group including a fluorine atom include —C(CF$_3$)$_2$— and —C(C$_2$F$_5$)$_2$—, and —C(CF$_3$)$_2$— is preferable.

As the above-described group including a fluorine atom, an alkyl fluoride group is preferable, and a trifluoromethyl group is more preferable.

In a case where $R^{31}$ is group including a fluorine atom and an aromatic group, for example, groups having the following structures are preferable.

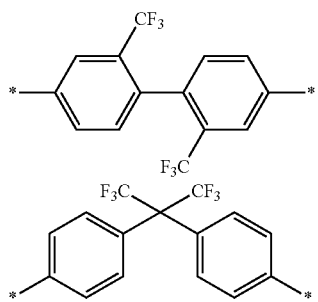

In the above structures, *'s each independently represent a bonding site with other structures.

In addition, $R^{31}$ preferably has a structure induced by a diamine compound.

Examples of the diamine compound include the following compounds, but the diamine compound is not limited thereto.

In addition, among these, from the viewpoint of solubility in a solvent, a diamine compound having a fluorine atom is preferable.

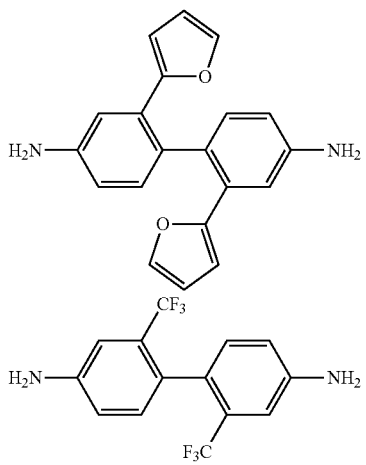

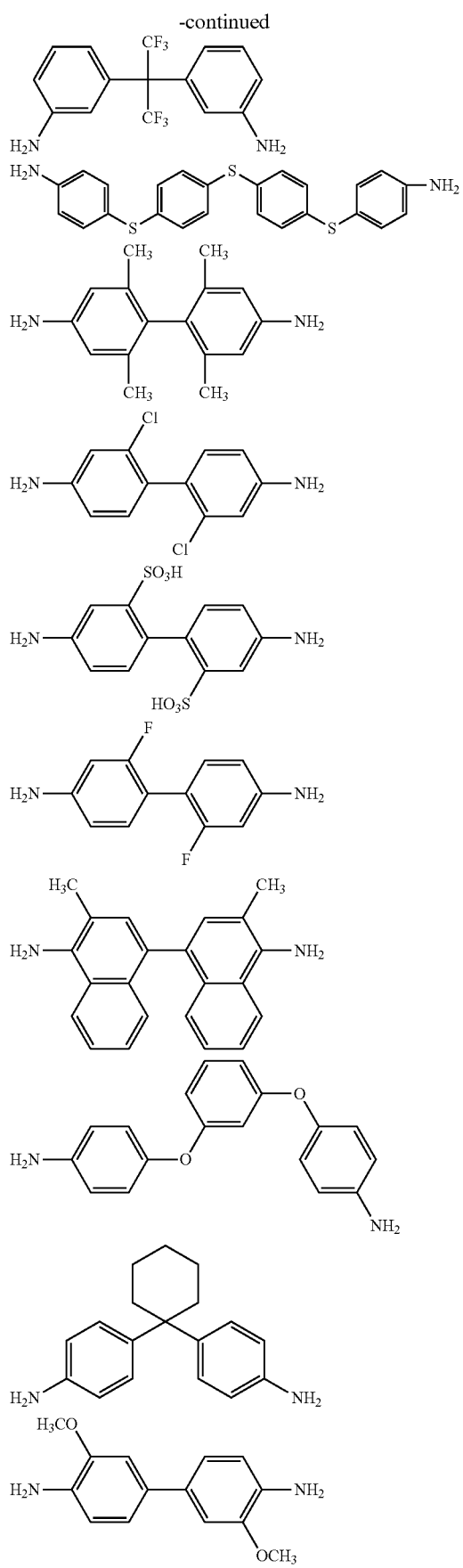

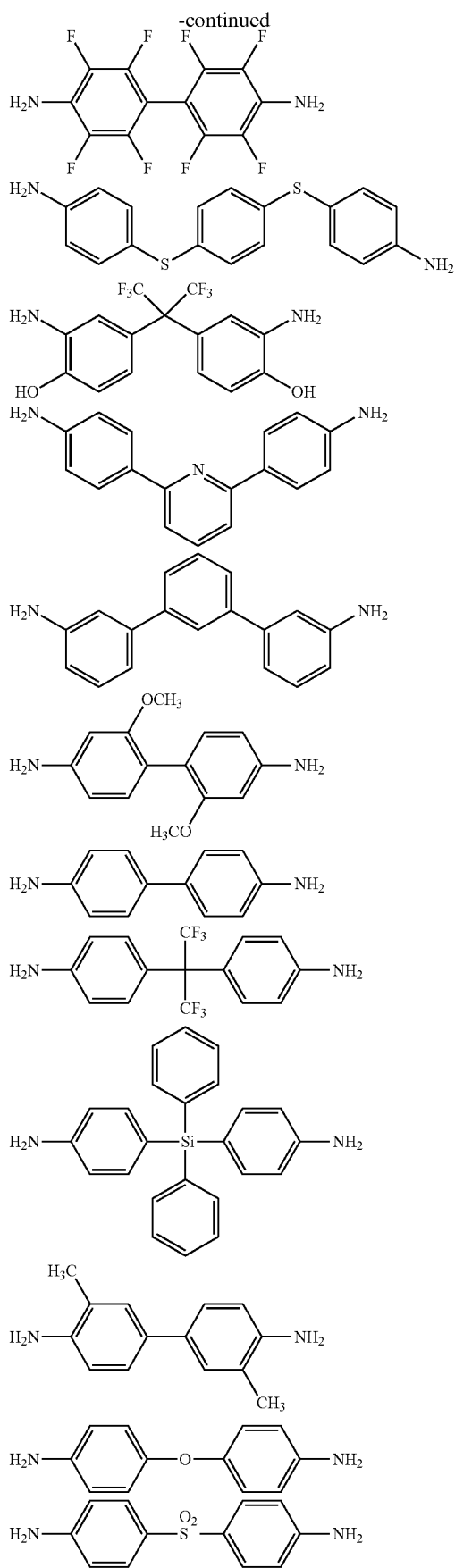

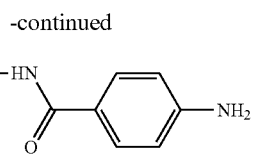

R³² in Formula (3-1) has the same meaning as R¹³ in Formula (1-1), and the preferred aspect thereof is also the same.

R³³ in Formula (3-2) has the same meaning as R³¹ in Formula (3-1), and the preferred aspect thereof is also the same.

R³⁴ in Formula (3-2) has the same meaning as R²³ in Formula (1-2), and the preferred aspect thereof is also the same.

R³⁵ in Formula (3-2) has the same meaning as R²⁴ in Formula (1-2), and the preferred aspect thereof is also the same.

[Content of Each Repeating Unit]

The specific resin includes the repeating unit represented by Formula (1-1) and the repeating unit represented by Formula (3-1) in a total amount of preferably 50 mol % or more, more preferably 80 mol % or more, still more preferably 90 mol % or more, particularly preferably 95 mol % or more, and most preferably 100 mol % with respect to all repeating units of the specific resin.

In addition, the specific resin may include the repeating unit represented by Formula (1-2) or the repeating unit represented by Formula (3-2), but the total amount of these repeating units is preferably 50 mol % or less, more preferably 20 mol % or less, still more preferably 10 mol % or less, particularly preferably 5 mol % or less, and most preferably 0 mol % with respect to all repeating units of the specific resin.

In addition, in the specific resin, the content of the repeating unit represented by Formula (3-1) or Formula (3-2) may also be preferably 5 mol % or less (preferably 3 mol % or less, more preferably 1 mol % or less, and still more preferably 0 mol %) with respect to all repeating units of the specific resin.

In this case, the specific resin includes the repeating unit represented by Formula (1-1) in a total amount of preferably 50 mol % or more, more preferably 80 mol % or more, still more preferably 90 mol % or more, particularly preferably 95 mol % or more, and most preferably 100 mol % with respect to all repeating units of the specific resin. In addition, the total amount of the repeating unit represented by Formula (1-2) in this case is preferably 50 mol % or less, more preferably 20 mol % or less, still more preferably 10 mol % or less, particularly preferably 5 mol % or less, and most preferably 0 mol % with respect to all repeating units of the specific resin.

The total content of the repeating unit represented by Formula (2-1) and the repeating unit represented by Formula (2-2) in the specific resin is preferably 10 to 90 mol %, more preferably 20 to 80 mol %, and still more preferably 30 to 70 mol % with respect to all repeating units of the specific resin.

In addition, in a case where the specific resin is a polyimide precursor, the specific resin includes the repeating unit represented by Formula (1-2) and the repeating unit represented by Formula (3-2) in a total amount of preferably 50 mol % or more, more preferably 80 mol % or more, still more preferably 90 mol % or more, particularly preferably 95 mol % or more, and most preferably 100 mol % with respect to all repeating units of the specific resin.

In addition, in a case where the specific resin is a polyimide precursor, the content of the repeating unit represented by Formula (3-2) may also be preferably 5 mol % or less (preferably 3 mol % or less, more preferably 1 mol % or less, and still more preferably 0 mol %) with respect to all repeating units of the specific resin.

In this case, the specific resin includes the repeating unit represented by Formula (1-2) in a total amount of preferably 50 mol % or more, more preferably 80 mol % or more, still more preferably 90 mol % or more, particularly preferably 95 mol % or more, and most preferably 100 mol % with respect to all repeating units of the specific resin.

[Imidization Rate]

From the viewpoint of suppressing heat contraction, an imidization rate (also referred to as a "ring closure rate") of the specific resin is preferably 70% or more, more preferably 80% or more, still more preferably 90% or more, and particularly preferably 95% or more.

The upper limit of the above-described imidization rate is not particularly limited, and may be 100% or less.

For example, the above-described imidization rate is measured by the following method.

An infrared absorption spectrum of an alkali-soluble polyimide is measured to obtain a peak intensity P1 near 1377 cm$^{-1}$, which is an absorption peak derived from the imide structure. Next, the alkali-soluble polyimide is heat-treated at 350° C. for 1 hour, and then the infrared absorption spectrum is measured again to obtain a peak intensity P2 near 1377 cm$^{-1}$. Using the obtained peak intensities P1 and P2, the imidization rate of the alkali-soluble polyimide can be determined based on the following expression.

Imidization rate (%)=(Peak intensity $P1$/Peak intensity $P2$)×100

[Acid Group]

From the viewpoint of improving alkali developability, the specific resin preferably has an acid group. Examples of the acid group include a carboxy group, a sulfo group, a phosphoric acid group, a sulfonamide group, and a hydroxy group.

It is preferable that these acid groups are introduced into the specific resin as $R^{1a}$ or $R^{2a}$ described above.

From the viewpoint of improving film-forming properties and alkali developability, the acid value of the specific resin is preferably 0 to 500 mgKOH/g.

The lower limit of the above-described acid value is preferably 20 mgKOH/g or more, more preferably 30 mgKOH/g or more, and still more preferably 50 mgKOH/g or more.

The upper limit of the above-described acid value is preferably 300 mgKOH/g or less, more preferably 200 mgKOH/g or less, and still more preferably 150 mgKOH/g or less.

The acid value of the specific resin is calculated by the same method as a measuring method in Examples described later.

[Ethylenically Unsaturated Bond]

The specific resin preferably has an ethylenically unsaturated bond.

In addition, the specific resin preferably includes a group having an ethylenically unsaturated bond.

Examples of the group having an ethylenically unsaturated bond include an acryloyl group, an acryloyloxy group, an acrylamide group, a vinylphenyl group, and an allyl group, and from the viewpoint of reactivity, an acryloyloxy group is preferable.

It is preferable that these groups having an ethylenically unsaturated bond are introduced into the specific resin as $R^{1b}$ or $R^{2b}$ described above.

From the viewpoint of storage stability and curability, the C=C value of the specific resin is preferably 0 to 5 mmol/g.

The lower limit of the above-described C=C value is preferably 0.01 mmol/g or more, more preferably 0.03 mmol/g or more, still more preferably 0.05 mmol/g or more, and particularly preferably 0.1 mmol/g or more.

The upper limit of the above-described C=C value is preferably 3 mmol/g or less, more preferably 2 mmol/g or less, still more preferably 1.5 mmol/g or less, and particularly preferably 1 mmol/g or less.

In the present invention, the C=C value of the specific resin refers to the number of ethylenically unsaturated bonds included in 1 g of the specific resin, and is a value measured by the method in Examples described later.

The coloring resin composition according to the embodiment of the present invention preferably includes, as the specific resin, at least one resin selected from the group consisting of the following resin 1 and the following resin 2, and preferably includes the resin 1 and the resin 2.

By including the resin 1, developability of the coloring resin composition is improved.

By including the resin 2, storage stability of the coloring resin composition is improved.

Resin 1: a resin including at least one acid group selected from the group consisting of a carboxy group, a sulfo group, a phosphoric acid group, a sulfonamide group, and a hydroxy group and at least one curable group selected from the group consisting of a (meth)acryloxy group, a (meth)acrylamide group, an aromatic vinyl group, a maleimide group, an epoxy group, and an oxetanyl group Resin 2: a resin including at least one acid group selected from the group consisting of a carboxy group, a sulfo group, a phosphoric acid group, a sulfonamide group, and a hydroxy group and a group having 12 or more carbon atoms The above-described resin 1 may further include a group having 12 or more carbon atoms.

The above-described resin 2 may further include at least one curable group selected from the group consisting of a (meth)acryloxy group, a (meth)acrylamide group, an aromatic vinyl group, a maleimide group, an epoxy group, and an oxetanyl group.

In addition, the above-described resin 2 preferably includes the repeating unit represented by Formula (2-1) or Formula (2-2).

In the above-described resin 1 and resin 2, the at least one acid group selected from the group consisting of a carboxy group, a sulfo group, a phosphoric acid group, a sulfonamide group, and a hydroxy group is preferably an acid group included as $R^{1a}$ or $R^{2a}$ described above, and more preferably an acid group included as $R^{1a}$ described above.

In the above-described resin 1 and resin 2, the at least one curable group selected from the group consisting of a (meth)acryloxy group, a (meth)acrylamide group, an aromatic vinyl group, a maleimide group, an epoxy group, and an oxetanyl group is preferably a curable group included as $R^{1b}$ or $R^{2b}$ described above, and more preferably a curable group included as $R^{1b}$ described above.

In the above-described resin 1 and resin 2, the group having 12 or more carbon atoms is preferably a curable group included as $R^{1c}$ or $R^{2c}$ described above, and more preferably a curable group included as $R^{1c}$ described above.

It is preferable that the resin 1 includes the repeating unit represented by Formula (1-1) in which $R^{12}$ is $R^{1a}$, the repeating unit represented by Formula (1-2), in which $R^{22}$ is $R^{1a}$ or $R^{24}$ is $R^{2a}$, and Formula (1-1) in which $R^{12}$ is $R^{1b}$, or the repeating unit represented by Formula (1-2) in which $R^{22}$ is $R^{1b}$ or $R^{24}$ is $R^{2b}$, and it is more preferable that the resin 1 includes the repeating unit represented by Formula (1-1) in which $R^{12}$ is $R^{1a}$ and the repeating unit represented by Formula (1-1) in which $R^{12}$ is $R^{1b}$.

In addition, the resin 1 may include the repeating unit represented by Formula (1-1) in which $R^{12}$ is $R^{1c}$, or the repeating unit represented by Formula (1-2) in which $R^{22}$ is $R^{1c}$ or $R^{24}$ is $R^{2c}$.

It is preferable that the resin 2 includes the repeating unit represented by Formula (1-1) in which $R^{12}$ is $R^{1a}$, the repeating unit represented by Formula (1-2), in which $R^{22}$ is $R^{1a}$ or $R^{24}$ is $R^{2a}$, and the repeating unit represented by Formula (1-1) in which $R^{12}$ is $R^{1c}$, or the repeating unit represented by Formula (1-2) in which $R^2$ is $R^{1c}$ or $R^{24}$ is $R^{2c}$, and it is more preferable that the resin 2 includes the repeating unit represented by Formula (1-1) in which $R^{12}$ is $R^{1a}$ and the repeating unit represented by Formula (1-1) in which $R^{12}$ is $R^{1c}$.

In addition, the resin 2 may include the repeating unit represented by Formula (1-1) in which $R^{12}$ is $R^{1b}$, or the repeating unit represented by Formula (1-2) in which $R^{22}$ is $R^{1b}$ or $R^{24}$ is $R^{2b}$.

[Molecular Weight]

The weight-average molecular weight (Mw) of the specific resin is preferably 3,000 to 100,000, more preferably 4,000 to 50,000, and most preferably 5,000 to 20,000.

From the viewpoint of solubility in a solvent and alkali solubility, the upper limit of Mw is preferably 100,000 or less, more preferably 50,000 or less, and most preferably 20,000 or less. The lower limit of Mw is not particularly limited as long as film-forming properties of the resin are not impaired, but from the viewpoint of film-forming properties, radical curability, and pigment dispersibility, Mw is preferably 3,000 or more, more preferably 5,000 or more, and still more preferably 10,000 or more.

[Molar Absorption Coefficient]

The maximum value of the molar absorption coefficient of the specific resin at a wavelength of 400 to 1100 nm is preferably 0 to 1000 l/(mol·cm) and more preferably 0 to 100 l/(mol·cm).

[Heat Resistance]

The specific resin preferably has a 5 mass % reduction temperature of 350° C. or higher, more preferably 400° C. or higher, and still more preferably 450° C. or higher by a thermogravimetry/differential thermal analysis (TG/DTA) under a nitrogen atmosphere. The upper limit of the above-described 5 mass % reduction temperature is not particularly limited, and for example, may be 1,000° C. or lower. The 5 mass % reduction temperature is determined by a known TG/DTA measuring method as a temperature at which the mass reduction rate is 5% in a case of being allowed to stand at a specific temperature for 5 hours under a nitrogen atmosphere.

In addition, the specific resin preferably has a mass reduction rate of 10% or less, more preferably 5% or less, and still more preferably 2% or less in a case of being allowed to stand at 300° C. for 5 hours under a nitrogen atmosphere. The lower limit of the above-described mass reduction rate is not particularly limited, and may be 0% or more.

The mass reduction rate is a value calculated as a proportion of mass reduction in the specific resin before and after being allowed to stand at 300° C. for 5 hours under a nitrogen atmosphere.

[Synthesis Method]

A method for synthesizing the specific resin is not particularly limited, and the specific resin can be synthesized by a known method. For example, the specific resin can be synthesized by the method described in Examples described later.

For example, the polyimide precursor can be obtained by reacting the above-described diamine compound with the above-described tetravalent carboxylic acid compound. In addition, the polyimide precursor can be heat-treated or chemically treated (cyclization using a catalyst) to obtain a polyimide.

One or two carboxy groups in the above-described tetravalent carboxylic acid compound may form an ester bond, an amide bond, or the like with a structure having a curable group, a thiol group, or the like.

In addition, as the above-described diamine compound, a diamine compound having a structure such as a carboxy group, a thiol group, or the like may be used, and the carboxy group may form an ester bond, an amide bond, or the like with a structure having a curable group, a thiol group, or the like. In addition, the polymer chain can be introduced using, as a chain transfer agent, the thiol group or the like present in the above-described diamine compound in the above-described polyimide or polyimide precursor.

—Condensing Agent—

In the synthesis of polyimide, it is preferable use a condensing agent in order to carry out imidization in an amide acid (polyimide precursor) reaction solution at a low temperature. The condensing agent is not particularly limited, and a known condensing agent can be used. For example, acetic acid anhydride and pyridine, triphenyl phosphite and pyridine, and the like can be used.

—Terminal Blocking Agent—

In the synthesis of polyimide or polyimide precursor, it is preferable to use a terminal blocking agent for adjusting the molecular weight. The terminal blocking agent is not particularly limited, and a known terminal blocking agent can be used. Examples thereof include a monoamine, an acid anhydride, a monocarboxylic acid, a monocarboxylic acid salt, a monocarboxylic acid halide compound, and a monocarboxylic acid active ester, and for example, a mono-substituted acid anhydride or a mono-substituted amine can be used. For example, cis-cyclohexanedicarboxylic acid anhydride, phthalic acid anhydride, or the like can be used.

In addition, as the terminal blocking agent, for example, compounds described in paragraphs 0034 to 0036 of JP2019-101440A can also be used.

In addition, by sealing the terminal of the resin with a terminal blocking agent having a hydroxy group, a carboxy group, a sulfo group, a thiol group, a vinyl group, an ethynyl group, or an allyl group, a dissolution rate of the resin in an alkali solution and mechanical properties of the obtained cured film can be easily adjusted within a preferred range.

The amount of the terminal blocking agent used may be adjusted according to the molecular weight of the target specific resin, but for example, the terminal blocking agent can be used in an amount of 1 mol % to 30 mol %, preferably 2 mol % to 20 mol %, and more preferably 3 mol % to 10 mol % with respect to the total amount of a compound bonded to the terminal blocking agent among the above-described diamine compound and the above-described tetravalent carboxylic acid compound.

In addition, by using the terminal blocking agent in the synthesis of the specific resin, it is possible to improve storage stability of the specific resin or storage stability of a composition including the specific resin.

Specific Example

Specific examples of the specific resin are shown below, but the present invention is not limited thereto.

In the following chemical formulae, the parenthesized subscript indicating the main chain structure represents the content ratio (molar ratio) of each repeating unit, and the parenthesis subscript in the side chain structure represents the number of repetitions of each constitutional unit. In each resin, among x, y, z, z1, z2, the total value of those described in each resin is 50.

In the tables below, the acid value (mgKOH/g) of the specific resin is described in the column of "Acid value", and the C=C value (mmol/g) of the specific resin is described in the column of "C=C value".

In addition, in the following chemical formulae, for example, the description of "polymer" in Formula (A-22) shows that a polymer chain in which a repeating unit derived from diethylacrylamide and a repeating unit derived from styrene are randomly bonded to a sulfur atom described in Formula (A-22) at a content ratio (molar ratio) of the parenthesized subscript is bonded.

In each specific example, the terminal of the polymer may be sealed with the above-described terminal blocking agent.

In addition, for example, in a case where the resin represented by Formula (A-2) has x=25 and y=25, the resin represented by Formula (A-2) is a resin including the repeating units represented by Formula (A-2A) and Formula (A-2B) in a molar ratio of 50:50.

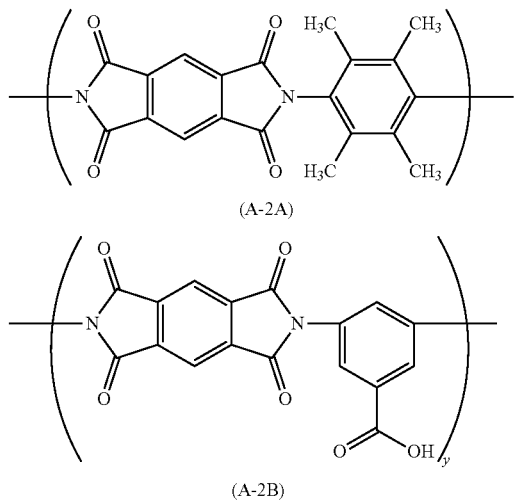

(A-2A)

(A-2B)

TABLE 1

| Resin | | Acid value | C=C value |
|---|---|---|---|
| (A-1) Mw = 46,000 | | 0 | 0 |
| (A-2) Mw = 34,000 | | 45 | 0 |

TABLE 1-continued
| Resin | Acid value | C=C value |
|---|---|---|
| 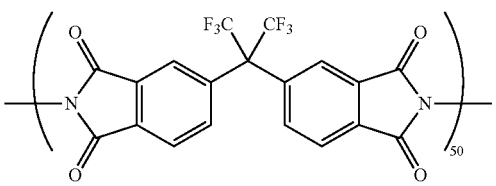 (A-3) Mw = 27,000 | 0 | 0 |
| 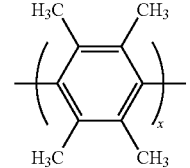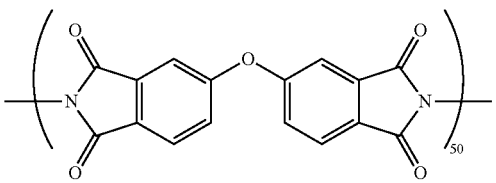 (A-4) Mw = 63,000 | 78 | 0 |
| 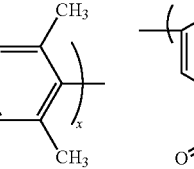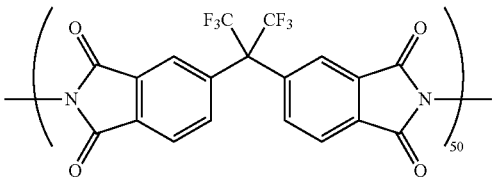 (A-5) Mw = 18,000 | 62 | 0 |
| 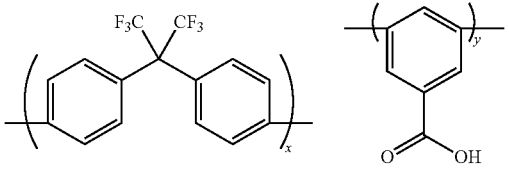 | 80 | 0 |

TABLE 1-continued
| Resin | Acid value | C=C value |
|---|---|---|
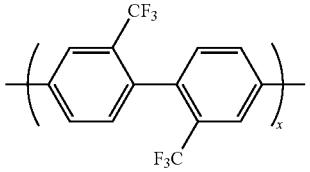
(A-6)
Mw = 17,500
TABLE 2
| Resin | Acid value | C=C value |
|---|---|---|
| (A-7) Mw = 19,500 | 110 | 0 |
| (A-8) Mw = 23,00 | 50 | 1.5 |
| | 33 | 1.9 |
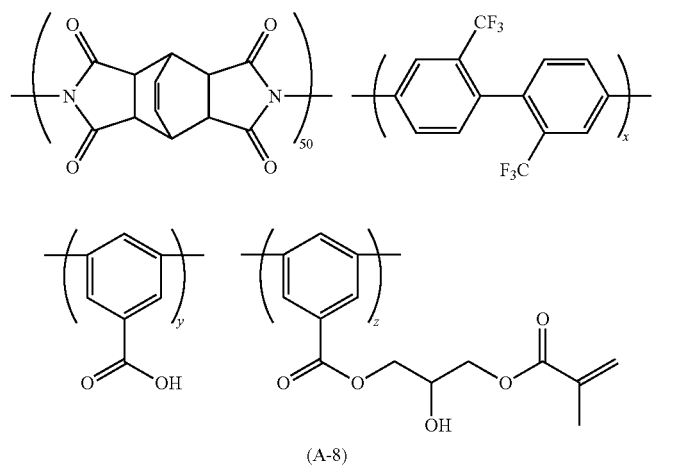
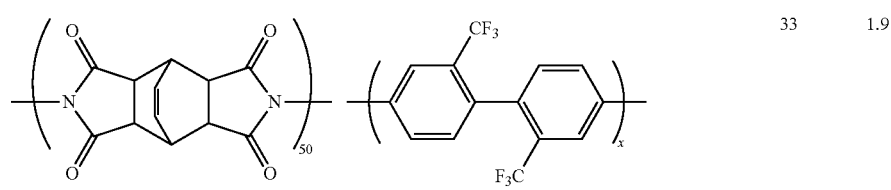

TABLE 2-continued
| Resin | Acid value | C=C value |
|---|---|---|
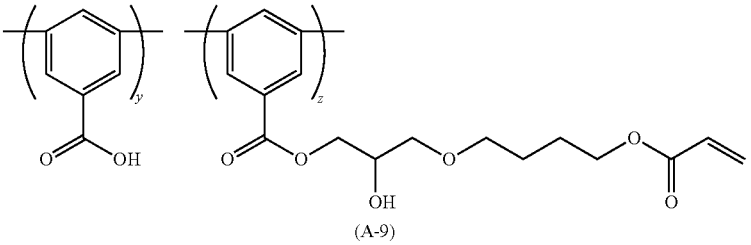
(A-9)
Mw = 25,000
TABLE 3
| Resin | Acid value | C=C value |
|---|---|---|
| (A-10) | 38 | 0.7 |
| (A-11) | 29 | 0.8 |
(A-10)
Mw = 17,400
(A-11)
Mw = 21,500

TABLE 3-continued
| Resin | Acid value | C=C value |
|---|---|---|
| 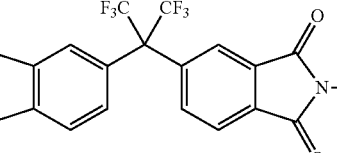 (A-12) Mw = 45,800 | 35 | 0 |
TABLE 4
| Resin | Acid value | C=C value |
|---|---|---|
| 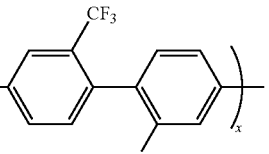 (A-13) Mw = 39,000 | 57 | 0 |
| 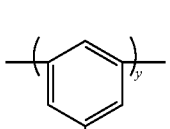 | 40 | 0 |

TABLE 4-continued
| Resin | Acid value | C=C value |
|---|---|---|
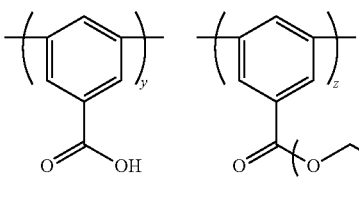
(A-14)
Mw = 26,000
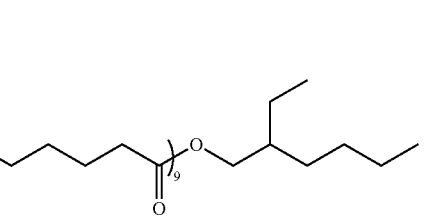
| | 25 | 0 |
(A-15)
Mw = 57,000
TABLE 5
| Resin | Acid value | C=C value |
|---|---|---|
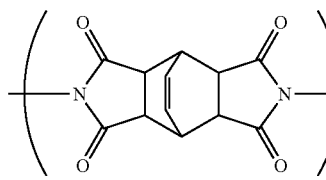
| | 70 | 0 |
(A-16)
Mw = 19,000

TABLE 5-continued
| Resin | Acid value | C=C value |
|---|---|---|
| 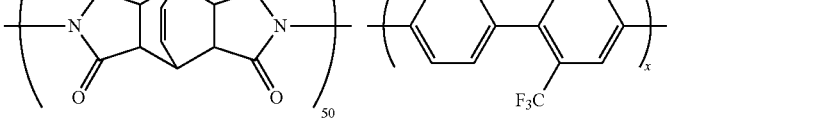 (A-17) Mw = 18,500 | 61 | 0.5 |
| 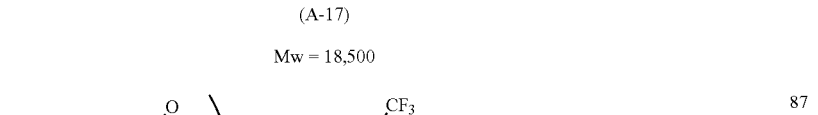 (A-18) Mw = 34,000 | 87 | 0 |
TABLE 6
| Resin | Acid value | C=C value |
|---|---|---|
| 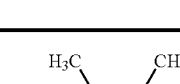 (A-19) Mw = 69,200 | 140 | 0 |

TABLE 6-continued
| Resin | Acid value | C=C value |
|---|---|---|
| 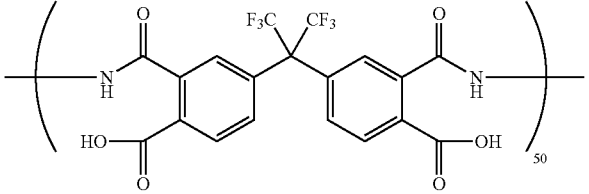 (A-20) Mw = 47,000 | 180 | 0 |
| 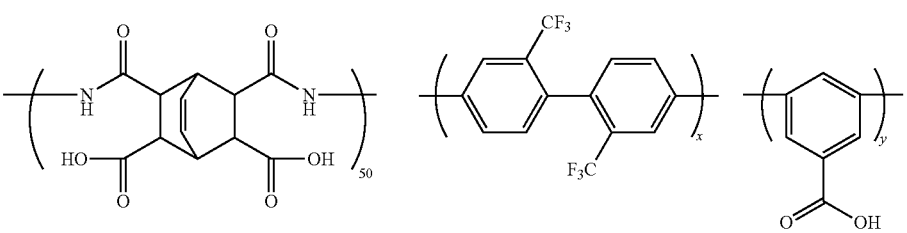 (A-21) Mw = 33,000 | 195 | 0 |
| 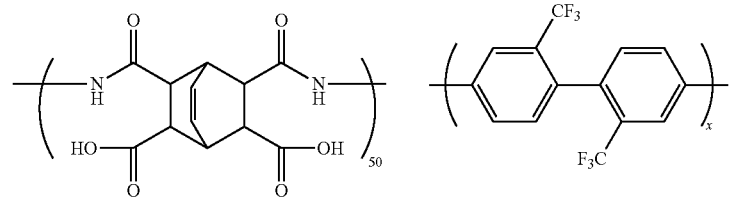 Polymer: 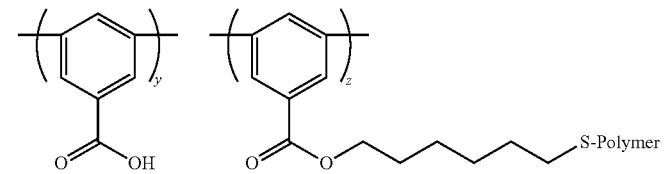 (A-22) Mw = 30,500 | 100 | 0 |

TABLE 7
| Resin | Acid value | C=C value |
|---|---|---|
| 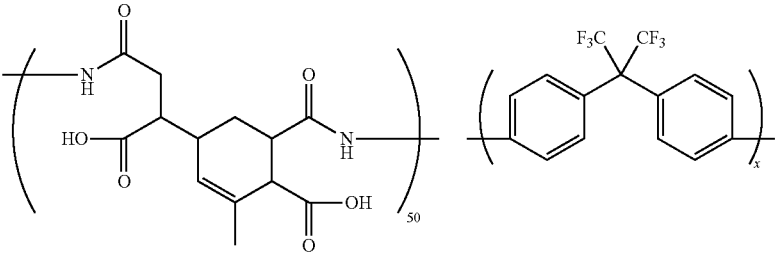<br>(A-23)<br>Mw = 18,200 | 175 | 0 |
| 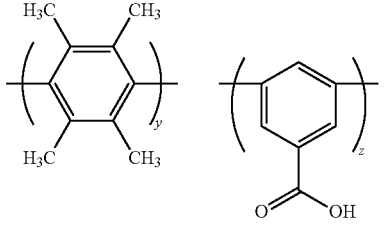 | 36 | 0.4 |
| 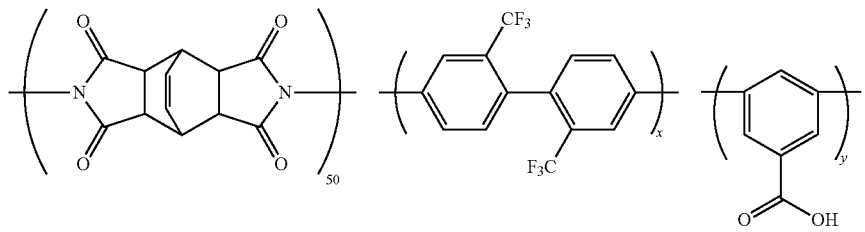<br>(A-24)<br>Mw = 25,000 | | |

TABLE 7-continued
| Resin | Acid value | C=C value |
|---|---|---|
| 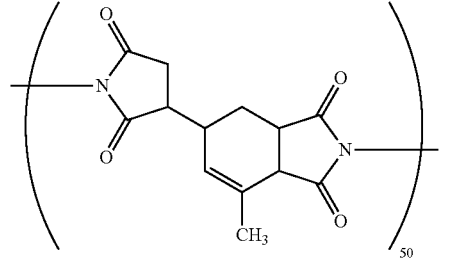 (A-25) Mw = 17,200 | 46 | 0 |
| 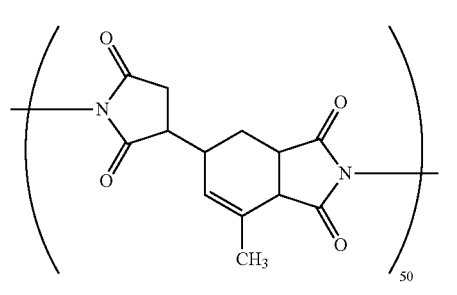 (A-26) Mw = 19,700 | 33 | 0.5 |
Table 8
| Resin | Acid value | C=C value |
|---|---|---|
| 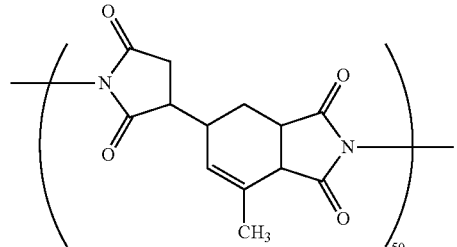 | 96 | 0 |

TABLE 8-continued
| Resin | Acid value | C=C value |
|---|---|---|
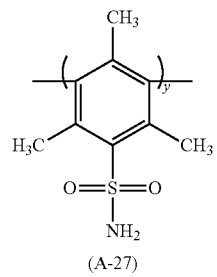
(A-27)
Mw = 16,000
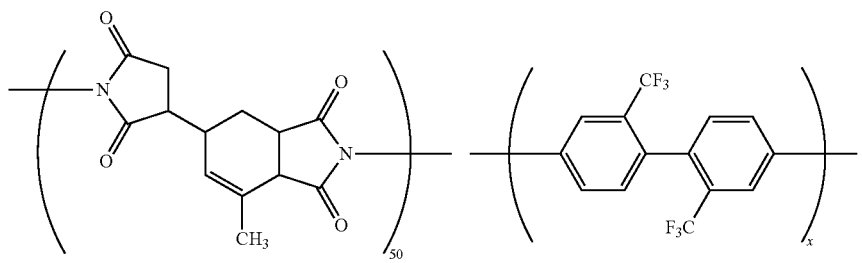
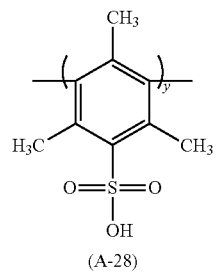
(A-28)
90     0
Mw = 13,500
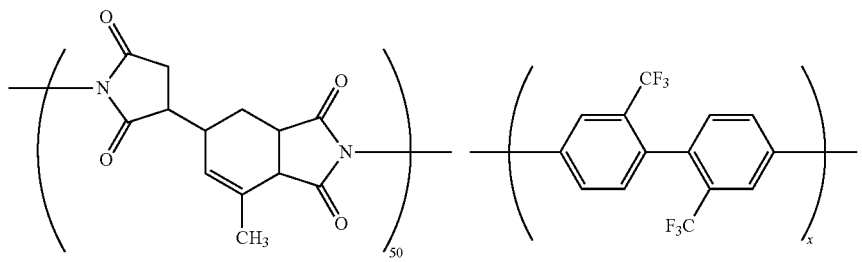
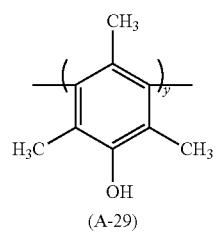
(A-29)
50     0
Mw = 16,700

Table 8-continued

| Resin | Acid value | C=C value |
|---|---|---|
| (A-30) Mw = 21,200 | 100 | 0 |

TABLE 9

| Resin | Acid value | C=C value |
|---|---|---|
| (A-31) Mw = 27,000 | 35 | 0 |
|  | 40 | 0 |

TABLE 9-continued

| Resin | Acid value | C=C value |
|---|---|---|
| 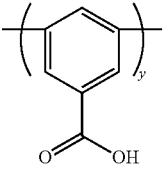 (A-32) Mw = 18,000 | | |
| 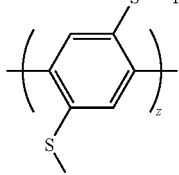 (A-33) Mw = 24,000 | 30 | 0.6 |

[Content]

The content of the specific resin in the coloring resin composition according to the embodiment of the present invention is preferably 10 to 95 mass % with respect to the total solid content of the coloring resin composition. The lower limit is more preferably 20 mass % or more and still more preferably 30 mass % or more. The upper limit is more preferably 90 mass % or less and still more preferably 85 mass % or less.

The coloring resin composition according to the embodiment of the present invention may contain the specific resin alone or in combination of two or more kinds thereof. In a case where two or more kinds of specific resins are used in combination, the total amount thereof is preferably within the above-described range.

In addition, in a case where the coloring resin composition according to the embodiment of the present invention contains the above-described resin 1 as the specific resin, the content of the resin 1 is preferably 1 to 30 mass % with respect to the total solid content of the coloring resin composition. The lower limit is more preferably 3 mass % or more and still more preferably 5 mass % or more. The upper limit is more preferably 25 mass % or less and still more preferably 20 mass % or less.

In addition, in a case where the coloring resin composition according to the embodiment of the present invention contains the above-described resin 2 as the specific resin, the content of the resin 2 is preferably 10 to 60 mass % with respect to the total solid content of the coloring resin composition. The lower limit is more preferably 15 mass % or more and still more preferably 20 mass % or more. The upper limit is more preferably 55 mass % or less and still more preferably 50 mass % or less.

In addition, in a case where the coloring resin composition according to the embodiment of the present invention contains the above-described resin 2 as the specific resin and includes the pigment as the coloring material, the content of the resin 2 is preferably 25 to 85 mass % with respect to the total mass of the pigment included in the coloring resin composition. The lower limit is more preferably 28 mass % or more and still more preferably 30 mass % or more. The upper limit is more preferably 80 mass % or less and still more preferably 50 mass % or less.

In addition, in the present invention, in the components in which the coloring material is excepted from the total solid content of the coloring resin composition, the specific resin is included preferably in an amount of 20 mass % or more, more preferably in an amount of 30 mass % or more, and still more preferably in an amount of 40 mass % or more. The upper limit may be 100 mass %, 90 mass % or less, or 85 mass % or less. In a case where the content of the specific resin is within the above-described range, it is easy to form a film having excellent heat resistance, and it is easy to suppress film contraction after heating. Further, in a case where an inorganic film is formed on a surface of the film obtained using the coloring resin composition according to the embodiment of the present invention, it is also possible to suppress the occurrence of cracks in the inorganic film even in a case where this laminate is exposed to a high temperature.

In addition, the total content of the coloring material and the above-described resin A in the total solid content of the coloring resin composition is preferably 25 to 100 mass %. The lower limit is more preferably 30 mass % or more and still more preferably 40 mass % or more. The upper limit is more preferably 90 mass % or less and still more preferably 80 mass % or less.

<Other Resins>

The coloring resin composition according to the embodiment of the present invention may include other resins.

A compound corresponding to the specific resin does not correspond to the above-described other resins.

Examples of the other resins include a resin having alkali developability and a resin as a dispersant.

Here, in a case where the coloring resin composition according to the embodiment of the present invention includes other resins, the aspect shown in the following (1) or the following (2) is also preferable.

(1) the above-described resin 1 and the resin as a dispersant are included.
(2) the resin having alkali developability and the above-described resin 2 are included.

In addition, in the aspect of (1), the above-described resin 2 may be further included, and in the aspect of (2), the above-described resin 1 may be further included.

[Resin Having Alkali Developability]

The weight-average molecular weight (Mw) of the resin having alkali developability is preferably 3,000 to 2,000,000. The upper limit is more preferably 1,000,000 or less and still more preferably 500,000 or less. The lower limit is more preferably 4,000 or more and still more preferably 5,000 or more.

Examples of the resin having alkali developability include a (meth)acrylic resin, a polyimine resin, a polyether resin, a polyolefin resin, a cyclic olefin resin, a polyester resin, and a styrene resin, and a (meth)acrylic resin or a polyimine resin is preferable and a (meth)acrylic resin is more preferable. In addition, as the other resin, resins described in paragraph Nos. 0041 to 0060 of JP2017-206689A, resins described in paragraph Nos. 0022 to 0071 of JP2018-010856A, resins described in JP2017-057265A, resins described in JP2017-032685A, resins described in JP2017-075248A, and resins described in JP2017-066240A can also be used.

In addition, as the resin having alkali developability, it is preferable to use a resin having an acid group. According to this aspect, developability of the coloring resin composition can be further improved. Examples of the acid group include a phenolic hydroxy group, a carboxy group, a sulfo group, a phosphoric acid group, a phosphonic acid group, an active imide group, and a sulfonamide group, and a carboxy group is preferable. The resin having an acid group can be used, for example, as an alkali-soluble resin.

The resin having an acid group preferably includes a repeating unit having an acid group in the side chain, and more preferably includes 1 to 70 mol % of repeating units having an acid group in the side chain with respect to the total repeating units of the resin. The upper limit of the content of the repeating unit having an acid group in the side chain is preferably 50 mol % or less and more preferably 40 mol % or less. The lower limit of the content of the repeating unit having an acid group in the side chain is preferably 2 mol % or more and more preferably 5 mol % or more.

The acid value of the resin having an acid group is preferably 200 mgKOH/g or less, more preferably 150 mgKOH/g or less, still more preferably 120 mgKOH/g or less, and particularly preferably 100 mgKOH/g or less. In addition, the acid value of the resin having an acid group is preferably 5 mgKOH/g or more, more preferably 10 mgKOH/g or more, and still more preferably 20 mgKOH/g or more.

The resin having an acid group also preferably has an ethylenically unsaturated bond-containing group. Examples of the ethylenically unsaturated bond-containing group include a vinyl group, an allyl group, and a (meth)acryloyl group, and an allyl group or a (meth)acryloyl group is preferable and a (meth)acryloyl group is more preferable.

The resin having an ethylenically unsaturated bond-containing group preferably includes a repeating unit having an ethylenically unsaturated bond-containing group in the side chain, and more preferably includes 5 to 80 mol % of the repeating unit having an ethylenically unsaturated bond-containing group in the side chain with respect to the total repeating units of the resin. The upper limit of the content of the repeating unit having an ethylenically unsaturated bond-containing group in the side chain is preferably 60 mol % or less and more preferably 40 mol % or less. The lower limit of the content of the repeating unit having an ethylenically unsaturated bond-containing group in the side chain is preferably 10 mol % or more and more preferably 15 mol % or more.

It is also preferable that the resin having alkali developability includes a repeating unit derived from a monomer component including a compound represented by Formula (ED1) and/or a compound represented by Formula (ED2) (hereinafter, these compounds may be referred to as an "ether dimer").

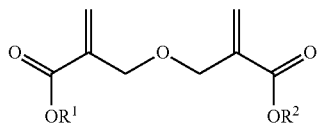
(ED1)

In Formula (ED1), $R^1$ and $R^2$ each independently represent a hydrogen atom or a hydrocarbon group having 1 to 25 carbon atoms, which may have a substituent.

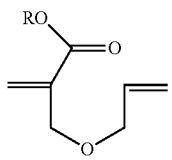
(ED2)

In Formula (ED2), R represents a hydrogen atom or an organic group having 1 to 30 carbon atoms. With regard to details of Formula (ED2), reference can be made to the description in JP2010-168539A, the contents of which are incorporated herein by reference.

With regard to the specific examples of the ether dimer, reference can be made to the description in paragraph No. 0317 of JP2013-029760A, the contents of which are incorporated herein by reference.

It is also preferable that the resin having alkali developability includes a repeating unit derived from a compound represented by Formula (X).

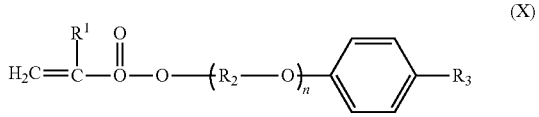
(X)

In Formula (X), $R_1$ represents a hydrogen atom or a methyl group, $R_2$ represents an alkylene group having 2 to 10 carbon atoms, and $R_3$ represents a hydrogen atom or an alkyl group having 1 to 20 carbon atoms which may include a benzene ring. n represents an integer of 1 to 15.

Examples of the resin having an acid group include a resin having the following structures. In the following structural formulae, Me represents a methyl group.

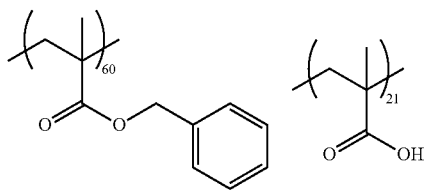

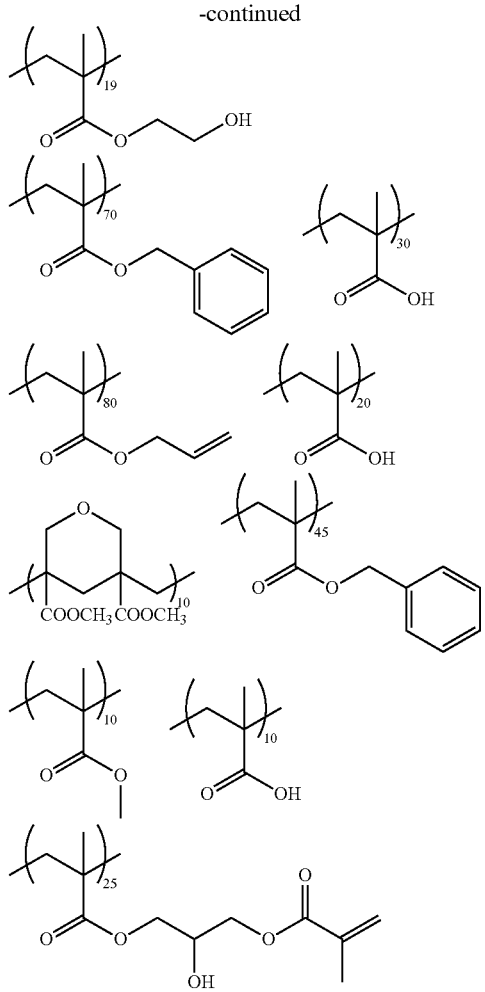

[Dispersant]

The coloring resin composition according to the embodiment of the present invention can also include a resin as a dispersant. Examples of the dispersant include an acidic dispersant (acidic resin) and a basic dispersant (basic resin). Here, the acidic dispersant (acidic resin) represents a resin in which the amount of the acid group is larger than the amount of the basic group. The acidic dispersant (acidic resin) is preferably a resin in which the amount of the acid group occupies 70 mol % or more in a case where the total amount of the acid group and the basic group is 100 mol %, and more preferably a resin substantially consisting of only an acid group. The acid group included in the acidic dispersant (acidic resin) is preferably a carboxy group. The acid value of the acidic dispersant (acidic resin) is preferably 40 to 105 mgKOH/g, more preferably 50 to 105 mgKOH/g, and still more preferably 60 to 105 mgKOH/g. In addition, the basic dispersant (basic resin) represents a resin in which the amount of the basic group is larger than the amount of the acid group. The basic dispersant (basic resin) is preferably a resin in which the amount of the basic group is more than 50 mol % in a case where the total amount of the acid group and the basic group is 100 mol %. The basic group included in the basic dispersant is preferably an amino group.

The resin used as a dispersant preferably includes a repeating unit having an acid group.

It is also preferable that the resin used as a dispersant is a graft resin. Examples of the graft resin include resins described in paragraph Nos. 0025 to 0094 of JP2012-255128A, the contents of which are incorporated herein by reference.

It is also preferable that the resin used as a dispersant is a polyimine-based dispersant (polyimine resin) including a nitrogen atom in at least one of the main chain or the side chain. As the polyimine-based dispersant, a resin having a main chain which has a partial structure having a functional group of pKa 14 or less, and a side chain which has 40 to 10000 atoms, in which at least one of the main chain or the side chain has a basic nitrogen atom, is preferable. The basic nitrogen atom is not particularly limited as long as it is a nitrogen atom exhibiting basicity. Examples of the polyimine-based dispersant include resins described in paragraph Nos. 0102 to 0166 of JP2012-255128A, the contents of which are incorporated herein by reference.

It is also preferable that the resin used as a dispersant is a resin having a structure in which a plurality of polymer chains are bonded to a core portion. Examples of such a resin include dendrimers (including star polymers). In addition, specific examples of the dendrimer include polymer compounds C-1 to C-31 described in paragraph Nos. 0196 to 0209 of JP2013-043962A.

A commercially available product is also available as the dispersant, and specific examples thereof include DISPERBYK series (for example, DISPERBYK-111, 161, and the like) manufactured by BYK Chemie, and Solsperse series (for example, Solsperse 36000) manufactured by Lubrizol Corporation. The dispersing agents described in paragraph Nos. 0041 to 0130 of JP2014-130338A can also be used, the contents of which are incorporated herein by reference. In addition, as the dispersant, compounds described in JP2018-150498A, JP2017-100116A, JP2017-100115A, JP2016-108520A, JP2016-108519A, and JP2015-232105A may be used.

The resin described as a dispersant can be used for an application other than the dispersant. For example, the resin can also be used as a binder.

The content of the total resin component in the total solid content of the coloring resin composition is preferably 10 to 95 mass %. The lower limit is more preferably 20 mass % or more and still more preferably 30 mass % or more. The upper limit is more preferably 90 mass % or less and still more preferably 85 mass % or less.

In addition, in the coloring resin composition, the content of the other resins described above is preferably 230 parts by mass or less, more preferably 200 parts by mass or less, and still more preferably 150 parts by mass or less with respect to 100 parts by mass of the above-described specific resin. The lower limit may be 0 part by mass, 5 parts by mass or more, or 10 parts by mass or more. In addition, it is also preferable that the coloring resin composition does not substantially include the above-described other resins. According to this aspect, it is easy to form a film having more excellent heat resistance. The case where the resin composition does not substantially include the other resins means that the content of the other resins in the total solid content of the resin composition is 0.1 mass % or less, preferably 0.05 mass % or less, and more preferably 0 mass %.

<Solvent>

The coloring resin composition according to the embodiment of the present invention contains a solvent. As the solvent, an organic solvent is preferable. Basically, the organic solvent is not particularly limited as long as it satisfies the solubility of the respective components and the application properties of the coloring resin composition. Examples of the organic solvent include an ester-based solvent, a ketone-based solvent, an alcohol-based solvent, an ether-based solvent, and a hydrocarbon-based solvent. With regard to details thereof, reference can be made to the description in paragraph No. 0223 of WO2015/166779A, the contents of which are incorporated herein by reference. In addition, an ester-based solvent substituted with a cyclic alkyl group or a ketone-based solvent substituted with a cyclic alkyl group can also be preferably used. Specific examples of the organic solvent include polyethylene glycol monomethyl ether, dichloromethane, methyl 3-ethoxypropionate, ethyl 3-ethoxypropionate, ethyl cellosolve acetate, ethyl lactate, diethylene glycol dimethyl ether, butyl acetate, methyl 3-methoxypropionate, 2-heptanone, cyclohexanone, cyclohexyl acetate, cyclopentanone, ethyl carbitol acetate, butyl carbitol acetate, propylene glycol monomethyl ether, propylene glycol monomethyl ether acetate, γ-butyrolactone, 3-methoxybutanol, methyl isobutyl ketone, and dipropylene glycol monomethyl ether. In this case, it may be preferable that the content of aromatic hydrocarbons (such as benzene, toluene, xylene, and ethylbenzene) as the organic solvent is low (for example, 50 parts per million (ppm) by mass or less, 10 ppm by mass or less, or 1 ppm by mass or less with respect to the total amount of the organic solvent) in consideration of environmental aspects and the like.

Among these, the solvent preferably includes at least one solvent selected from the group consisting of propylene glycol monomethyl ether acetate, propylene glycol monomethyl ether, cyclohexanone, cyclopentanone, butyl acetate, ethyl 3-ethoxypropionate, propylene glycol monoethyl ether acetate, ethyl lactate, 3-methoxybutanol, methyl isobutyl ketone, and dipropylene glycol monomethyl ether.

In addition, in the present invention, it is preferable that the solvent does not substantially include an amide-based solvent.

Examples of the amide-based solvent include dimethylformamide, dimethylacetamide, N-methyl-2-pyrrolidone, and N-ethyl-2-pyrrolidone.

The fact that the amide-based solvent is substantially not included means that the amide-based solvent is included in an amount of 1 mass % or less, preferably 0.5 mass % or less, more preferably 0.1 mass % or less, and still more preferably 0 mass % with respect to the total mass of the composition.

In the present invention, an organic solvent having a low metal content is preferably used. For example, the metal content in the organic solvent is preferably 10 mass parts per billion (ppb) or less. Optionally, an organic solvent having a metal content at a mass parts per trillion (ppt) level may be used. For example, such an organic solvent is available from Toyo Gosei Co., Ltd. (The Chemical Daily, Nov. 13, 2015). Examples of a method for removing impurities such as a metal from the organic solvent include distillation (such as molecular distillation and thin-film distillation) and filtration using a filter. The filter pore size of the filter used for the filtration is preferably 10 μm or less, more preferably 5 μm or less, and still more preferably 3 μm or less. As a material of the filter, polytetrafluoroethylene, polyethylene, or nylon is preferable.

The organic solvent may include an isomer (a compound having the same number of atoms and a different structure). In addition, only one kind of isomers may be included, or a plurality of isomers may be included.

The organic solvent preferably has the content of peroxides of 0.8 mmol/L or less, and more preferably, the organic solvent does not substantially include peroxides.

The content of the organic solvent in the coloring resin composition is preferably 10 to 95 mass %, more preferably 20 to 90 mass %, and still more preferably 30 to 90 mass %.

<Pigment Derivative>

The coloring resin composition according to the embodiment of the present invention can contain a pigment derivative. Examples of the pigment derivative include a compound having a structure in which a part of a chromophore is substituted with an acid group, a basic group, or a phthalimidomethyl group. Examples of the chromophore constituting the pigment derivative include a quinoline skeleton, a benzimidazolone skeleton, a diketopyrrolopyrrole skeleton, an azo skeleton, a phthalocyanine skeleton, an anthraquinone skeleton, a quinacridone skeleton, a dioxazine skeleton, a perinone skeleton, a perylene skeleton, a thioindigo skeleton, an isoindoline skeleton, an isoindolinone skeleton, a quinophthalone skeleton, a threne skeleton, and a metal complex skeleton. Among these, a quinoline skeleton, a benzimidazolone skeleton, a diketopyrrolopyrrole skeleton, an azo skeleton, a quinophthalone skeleton, an isoindoline skeleton, or a phthalocyanine skeleton is preferable, and an azo skeleton or a benzimidazolone skeleton is more preferable. As the acid group included in the pigment derivative, a sulfo group or a carboxy group is preferable and a sulfo group is more preferable. As the basic group included in the pigment derivative, an amino group is preferable and a tertiary amino group is more preferable.

As the pigment derivative, a pigment derivative having excellent visible light transparency (hereinafter, also referred to as a transparent pigment derivative) can be used. The maximum value (εmax) of the molar absorption coefficient of the transparent pigment derivative in a wavelength region of 400 to 700 nm is preferably 3000 $L \cdot mol^{-1} \cdot cm^{-1}$ or less, more preferably 1000 $L \cdot mol^{-1} \cdot cm^{-1}$ or less, and still more preferably 100 $L \cdot mol^{-1} \cdot cm^{-1}$ or less. The lower limit of εmax is, for example, 1 $L \cdot mol^{-1} \cdot cm^{-1}$ or more and may be 10 $L \cdot mol^{-1} \cdot cm^{-1}$ or more.

Specific examples of the pigment derivative include compounds described in JP1981-118462A (JP-S56-118462A), JP1988-264674A (JP-S63-264674A), JP1989-217077A (JP-H01-217077A), JP1991-009961A (JP-H03-009961A), JP1991-026767A (JP-H03-026767A), JP1991-153780A (JP-H03-153780A), JP1991-045662A (JP-H03-045662A), JP1992-285669A (JP-H04-285669A), JP1994-145546A (JP-H06-145546A), JP1994-212088A (JP-H06-212088A), JP1994-240158A (JP-H06-240158A), JP1998-030063A (JP-H10-030063A), JP1998-195326A (JP-H10-195326A), paragraph Nos. 0086 to 0098 of WO2011/024896A, paragraph Nos. 0063 to 0094 of WO2012/102399A, paragraph No. 0082 of WO2017/038252A, paragraph No. 0171 of JP2015-151530A, paragraph Nos. 0162 to 0183 of JP2011-252065A, JP2003-081972A, JP5299151B, JP2015-172732A, JP2014-199308A, JP2014-085562A, JP2014-035351A, JP2008-081565A, and JP2019-109512A.

The content of the pigment derivative is preferably 1 to 30 parts by mass and still more preferably 3 to 20 parts by mass with respect to 100 parts by mass of the pigment. The pigment derivative may be used singly or in combination of two or more kinds thereof.

<Polymerizable Compound>

The coloring resin composition according to the embodiment of the present invention can contain a polymerizable compound. The polymerizable compound is preferably, for example, a compound having an ethylenically unsaturated bond-containing group. Examples of the ethylenically unsaturated bond-containing group include a vinyl group, a (meth)allyl group, and a (meth)acryloyl group. The polymerizable compound used in the present invention is preferably a radically polymerizable compound.

Any chemical forms of a monomer, a prepolymer, an oligomer, or the like may be used as the polymerizable compound, but a monomer is preferable. The molecular weight of the polymerizable compound is preferably 100 to 3000. The upper limit is more preferably 2000 or less and still more preferably 1500 or less. The lower limit is more preferably 150 or more and still more preferably 250 or more.

The polymerizable compound is preferably a compound including 3 or more ethylenically unsaturated bond-containing groups, more preferably a compound including 3 to 15 ethylenically unsaturated bond-containing groups, and still more preferably a compound including 3 to 6 ethylenically unsaturated bond-containing groups. In addition, the polymerizable compound is preferably a trifunctional to pentadecafunctional (meth)acrylate compound and more preferably a trifunctional to hexafunctional (meth)acrylate compound. Specific examples of the polymerizable compound include the compounds described in paragraph Nos. 0095 to 0108 of JP2009-288705A, paragraph No. 0227 of JP2013-029760A, paragraph Nos. 0254 to 0257 of JP2008-292970A, paragraph Nos. 0034 to 0038 of JP2013-253224A, paragraph No. 0477 of JP2012-208494A, JP2017-048367A, JP6057891B, JP6031807B, and JP2017-194662A, the contents of which are incorporated herein by reference.

As the polymerizable compound, dipentaerythritol triacrylate (as a commercially available product, KAYARAD D-330 manufactured by Nippon Kayaku Co., Ltd.), dipentaerythritol tetraacrylate (as a commercially available product, KAYARAD D-320 manufactured by Nippon Kayaku Co., Ltd.), dipentaerythritol penta(meth)acrylate (as a commercially available product, KAYARAD D-310 manufactured by Nippon Kayaku Co., Ltd.), dipentaerythritol hexa(meth)acrylate (as a commercially available product, KAYARAD DPHA manufactured by Nippon Kayaku Co., Ltd., NK ESTER A-DPH-12E manufactured by Shin-Nakamura Chemical Co., Ltd.), or a compound having a structure in which these (meth)acryloyl groups are bonded through an ethylene glycol and/or a propylene glycol residue (for example, SR454 and SR499 which are commercially available products from Sartomer) is preferable. In addition, as the polymerizable compound, diglycerin ethylene oxide (EO)-modified (meth)acrylate (as a commercially available product, M-460 manufactured by TOAGOSEI CO., LTD.), pentaerythritol tetraacrylate (NK ESTER A-TMMT manufactured by Shin-Nakamura Chemical Co., Ltd.), 1,6-hexanediol diacrylate (KAYARAD HDDA manufactured by Nippon Kayaku Co., Ltd.), RP-1040 (manufactured by Nippon Kayaku Co., Ltd.), ARONIX TO-2349 (manufactured by TOAGOSEI CO., LTD.), NK OLIGO UA-7200 (manufactured by Shin-Nakamura Chemical Co., Ltd.), 8UH-1006 and 8UH-1012 (manufactured by Taisei Fine Chemical Co., Ltd.), Light Acrylate POB-A0 (manufactured by KYOEISHA CHEMICAL Co., Ltd.), and the like can also be used.

In addition, as the polymerizable compound, it is also preferable to use a trifunctional (meth)acrylate compound such as trimethylolpropane tri(meth)acrylate, trimethylolpropane propyleneoxide-modified tri(meth)acrylate, trimethylolpropane ethyleneoxide-modified tri(meth)acrylate, isocyanuric acid ethyleneoxide-modified tri(meth)acrylate, and pentaerythritol tri(meth)acrylate. Examples of a commercially available product of the trifunctional (meth)acrylate compound include ARONIX M-309, M-310, M-321, M-350, M-360, M-313, M-315, M-306, M-305, M-303, M-452, and M-450 (manufactured by TOAGOSEI CO., LTD.), NK ESTER A9300, A-GLY-9E, A-GLY-20E, A-TMM-3, A-TMM-3L, A-TMM-3LM-N, A-TMPT, and TMPT (manufactured by Shin-Nakamura Chemical Co., Ltd.), and KAYARAD GPO-303, TMPTA, THE-330, TPA-330, and PET-30 (manufactured by Nippon Kayaku Co., Ltd.).

As the polymerizable compound, a compound having an acid group can also be used. By using a polymerizable compound having an acid group, the polymerizable compound in a non-exposed portion is easily removed during development and the generation of the development residue can be suppressed. Examples of the acid group include a carboxy group, a sulfo group, and a phosphoric acid group, and a carboxy group is preferable. Examples of a commercially available product of the polymerizable compound having an acid group include ARONIX M-305, M-510, M-520, and ARONIX TO-2349 (manufactured by TOAGOSEI CO., LTD.). The acid value of the polymerizable compound having an acid group is preferably 0.1 to 40 mgKOH/g and more preferably 5 to 30 mgKOH/g. In a case where the acid value of the polymerizable compound is 0.1 mgKOH/g or more, solubility in a developer is good, and in a case where the acid value of the polymerizable compound is 40 mgKOH/g or less, it is advantageous in production and handling.

The polymerizable compound is preferably a compound having a caprolactone structure. Examples of the polymerizable compound having a caprolactone structure include DPCA-20, DPCA-30, DPCA-60, and DPCA-120, each of which is commercially available as KAYARAD DPCA series from Nippon Kayaku Co., Ltd.

As the polymerizable compound, a polymerizable compound having an alkyleneoxy group can also be used. The polymerizable compound having an alkyleneoxy group is preferably a polymerizable compound having an ethyleneoxy group and/or a propyleneoxy group, more preferably a polymerizable compound having an ethyleneoxy group, and still more preferably a trifunctional to hexafunctional (meth) acrylate compound having 4 to 20 ethyleneoxy groups. Examples of a commercially available product of the polymerizable compound having an alkyleneoxy group include SR-494 manufactured by Sartomer, which is a tetrafunctional (meth)acrylate having 4 ethyleneoxy groups, and KAYARAD TPA-330 manufactured by Nippon Kayaku Co., Ltd., which is a trifunctional (meth)acrylate having 3 isobutyleneoxy groups.

As the polymerizable compound, a polymerizable compound having a fluorene skeleton can also be used. Examples of a commercially available product of the polymerizable compound having a fluorene skeleton include OGSOL EA-0200, EA-0300 (manufactured by Osaka Gas Chemicals Co., Ltd., (meth)acrylate monomer having a fluorene skeleton).

As the polymerizable compound, it is also preferable to use a compound which does not substantially include environmentally regulated substances such as toluene. Examples of a commercially available product of such a compound include KAYARAD DPHA LT and KAYARAD DPEA-12 LT (manufactured by Nippon Kayaku Co., Ltd.).

The urethane acrylates described in JP1973-041708B (JP-S48-041708B), JP1976-037193A (JP-S51-037193A), JP1990-032293B (JP-H02-032293B), or JP1990-016765B (JP-H02-016765B), or the urethane compounds having an ethylene oxide skeleton described in JP1983-049860B (JP-S58-049860B), JP1981-017654B (JP-S56-017654B), JP1987-039417B (JP-S62-039417B), or JP1987-039418B (JP-S62-039418B) are also suitable as the polymerizable compound. In addition, the polymerizable compounds having an amino structure or a sulfide structure in the molecule, described in JP1988-277653A (JP-S63-277653A), JP1988-260909A (JP-S63-260909A), or JP1989-105238A (JP-H01-105238A), are also preferably used. In addition, as the polymerizable compound, commercially available products such as UA-7200 (manufactured by Shin-Nakamura Chemical Co., Ltd.), DPHA-40H (manufactured by Nippon Kayaku Co., Ltd.), and UA-306H, UA-306T, UA-3061, AH-600, T-600, AI-600, and LINC-202UA (manufactured by KYOEISHA CHEMICAL Co., Ltd.) can also be used.

In a case of containing a polymerizable compound, the content of the polymerizable compound in the total solid content of the coloring resin composition is preferably 0.1 to 50 mass %. The lower limit is more preferably 0.5 mass % or more and still more preferably 1 mass % or more. The upper limit is more preferably 45 mass % or less and still more preferably 40 mass % or less. The polymerizable compound may be used singly or in combination of two or more kinds thereof.

<Photopolymerization Initiator>

The coloring resin composition according to the embodiment of the present invention can contain a photopolymerization initiator. The photopolymerization initiator is not particularly limited, and can be appropriately selected from known photopolymerization initiators. For example, a compound having photosensitivity to light in a range from an ultraviolet ray range to a visible range is preferable. The photopolymerization initiator is preferably a photoradical polymerization initiator.

Examples of the photopolymerization initiator include a halogenated hydrocarbon derivative (for example, a compound having a triazine skeleton, a compound having an oxadiazole skeleton, a compound having an imidazole skeleton, and the like), an acylphosphine compound, a hexaarylbiimidazole, an oxime compound, an organic peroxide, a thio compound, a ketone compound, an aromatic onium salt, an α-hydroxyketone compound, and an α-aminoketone compound. From the viewpoint of exposure sensitivity, as the photopolymerization initiator, a trihalomethyltriazine compound, a biimidazole compound, a benzyldimethylketal compound, an α-hydroxyketone compound, an α-aminoketone compound, an acylphosphine compound, a phosphine oxide compound, a metallocene compound, an oxime compound, a triarylimidazole dimer, an onium compound, a benzothiazole compound, a benzophenone compound, an acetophenone compound, a cyclopentadiene-benzene-iron complex, a halomethyl oxadiazole compound, or a 3-aryl-substituted coumarin compound is preferable, a compound selected from a biimidazole compound, an oxime compound, an α-hydroxyketone compound, an α-aminoketone compound, or an acylphosphine compound is more preferable, and an oxime compound is still more preferable. Examples of the photopolymerization initiator include compounds described in paragraphs 0065 to 0111 of JP2014-130173A, and JP6301489B, the contents of which are incorporated herein by reference.

Examples of the biimidazole compound include 2,2-bis (2-chlorophenyl)-4,4',5,5'-tetraphenylbiimidazole, 2,2'-bis (o-chlorophenyl)-4,4',5,5-tetrakis(3,4,5-trimethoxyphenyl)-1,2'-biimidazole, 2,2'-bis(2,3-dichlorophenyl)-4,4',5,5'-tetraphenylbiimidazole, and 2,2'-bis (o-chlorophenyl)-4,4,5, 5'-tetraphenyl-1,2'-biimidazole. Examples of a commercially available product of the α-hydroxyketone compound include Omnirad 184, Omnirad 1173, Omnirad 2959, and Omnirad 127 (all of which are manufactured by IGM Resins B.V.), Irgacure 184, Irgacure 1173, Irgacure 2959, and Irgacure 127 (all of which are manufactured by BASF). Examples of a commercially available product of the α-aminoketone compound include Omnirad 907, Omnirad 369, Omnirad 369E, and Omnirad 379EG (all of which are manufactured by IGM Resins B.V.), Irgacure 907, Irgacure 369, Irgacure 369E, and Irgacure 379EG (all of which are manufactured by BASF). Examples of a commercially available product of the acylphosphine compound include Omnirad 819 and Omnirad TPO (both of which are manufactured by IGM Resins B.V.), Irgacure 819 and Irgacure TPO (both of which are manufactured by BASF).

Examples of the oxime compound include the compounds described in JP2001-233842A, the compounds described in JP2000-080068A, the compounds described in JP2006-342166A, the compounds described in J. C. S. Perkin II (1979, pp. 1653-1660), the compounds described in J. C. S. Perkin II (1979, pp. 156-162), the compounds described in Journal of Photopolymer Science and Technology (1995, pp. 202-232), the compounds described in JP2000-066385A, the compounds described in JP2004-534797A, the compounds described in JP2006-342166A, the compounds described in JP2017-019766A, the compounds described in JP6065596B, the compounds described in WO2015/152153A, the compounds described in WO2017/051680A, the compounds described in JP2017-198865A, the compounds described in paragraph Nos. 0025 to 0038 of WO2017/164127A, and the compounds described in WO2013/167515A. Specific examples of the oxime compound include 3-benzoyloxyiminobutane-2-one, 3-acetoxyiminobutane-2-one, 3-propionyloxyiminobutane-2-one, 2-acetoxyiminopentane-3-one, 2-acetoxyimino-1-phenylpropane-1-one, 2-benzoyloxyimino-1-phenylpropane-1-one, 3-(4-toluene sulfonyloxy)iminobutane-2-one, and 2-ethoxycarbonyloxyimino-1-phenylpropane-1-one. Examples of a commercially available product thereof include Irgacure OXE01, Irgacure OXE02, Irgacure OXE03, and Irgacure OXE04 (all of which are manufactured by BASF), TR-PBG-304 (manufactured by TRONLY), and ADEKA OPTOMER N-1919 (manufactured by ADEKA Corporation; photopolymerization initiator 2 described in JP2012-014052A). In addition, as the oxime compound, it is also preferable to use a compound having no colorability or a compound having high transparency and being resistant to discoloration. Examples of a commercially available product include ADEKA ARKLS NCI-730, NCI-831, and NCI-930 (all of which are manufactured by ADEKA Corporation).

An oxime compound having a fluorene ring can also be used as the photopolymerization initiator. Specific examples of the oxime compound having a fluorene ring include the compounds described in JP2014-137466A.

In addition, as the photopolymerization initiator, an oxime compound having a skeleton in which at least one benzene ring of a carbazole ring is a naphthalene ring can also be used. Specific examples of such an oxime compound include the compounds described in WO2013/083505A.

An oxime compound having a fluorine atom can also be used as the photopolymerization initiator. Specific examples of the oxime compound having a fluorine atom include the compounds described in JP2010-262028A, the compounds 24, and 36 to 40 described in JP2014-500852A, and the compound (C-3) described in JP2013-164471A.

As the photopolymerization initiator, an oxime compound in which a substituent having a hydroxy group is bonded to a carbazole skeleton can also be used. Examples of such a photopolymerization initiator include compounds described in WO2019/088055A.

An oxime compound having a nitro group can be used as the photopolymerization initiator. It is preferable that the oxime compound having a nitro group is a dimer. Specific examples of the oxime compound having a nitro group include the compounds described in paragraph Nos. 0031 to 0047 of JP2013-114249A and paragraph Nos. 0008 to 0012 and 0070 to 0079 of JP2014-137466A, the compounds described in paragraph Nos. 0007 to 0025 of JP4223071B, and ADEKAARKLS NCI-831 (manufactured by ADEKA Corporation).

An oxime compound having a benzofuran skeleton can also be used as the photopolymerization initiator. Specific examples thereof include OE-01 to OE-75 described in WO2015/036910A.

Specific examples of the oxime compound are shown below, but the present invention is not limited thereto.

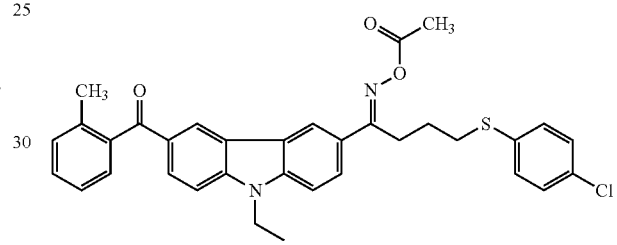

(C-1)

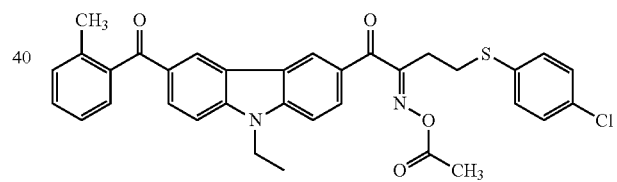

(C-2)

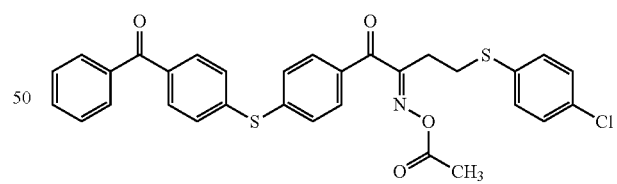

(C-3)

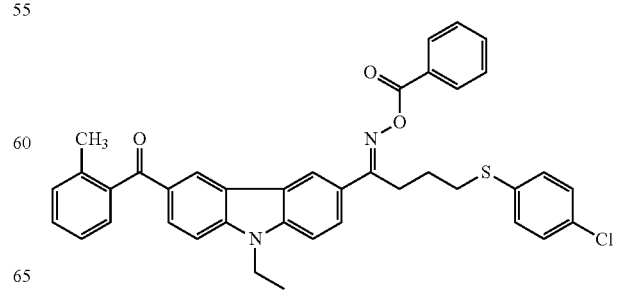

(C-4)

(C-5)
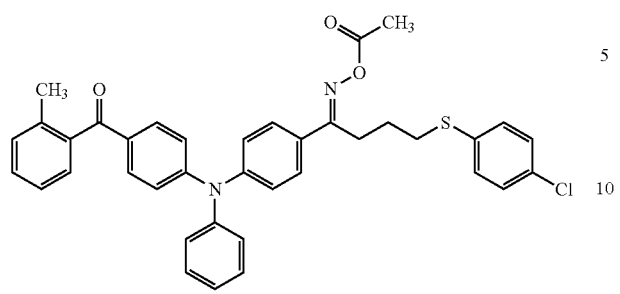
(C-6)
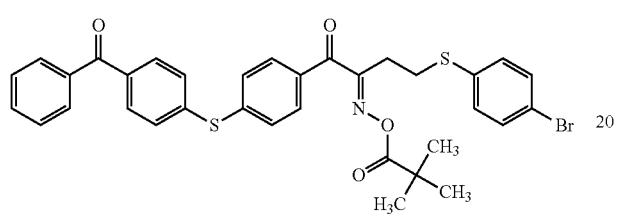
(C-7)
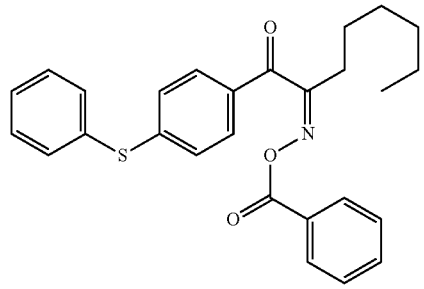
(C-8)
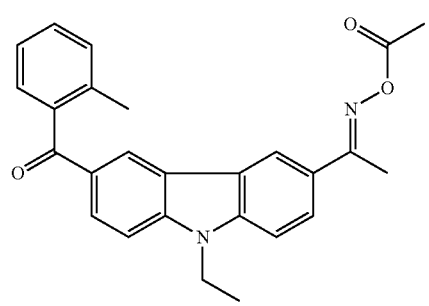
(C-9)
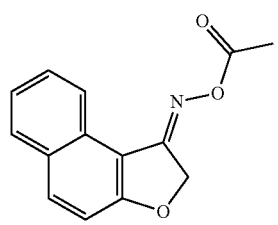
(C-10)
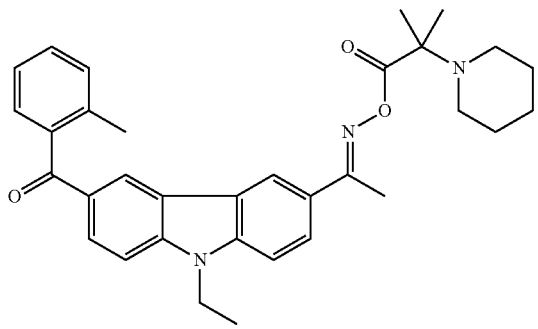
(C-11)
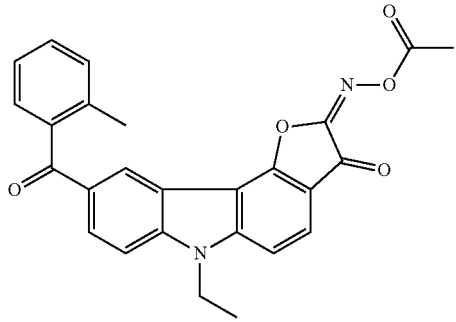
(C-12)
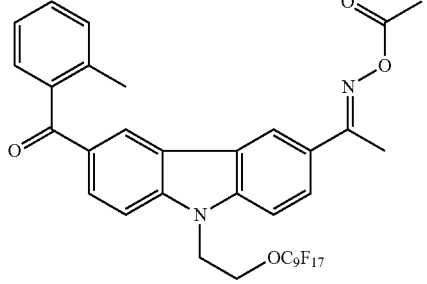
(C-13)
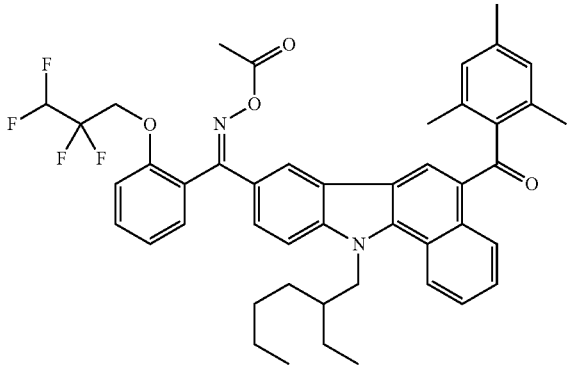
(C-14)
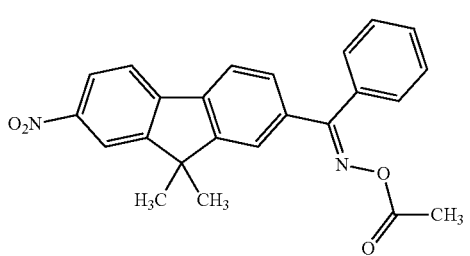

(C-15)

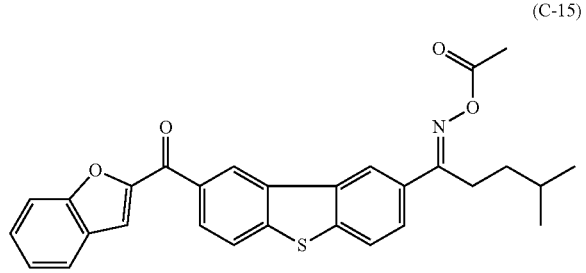

(C-16)

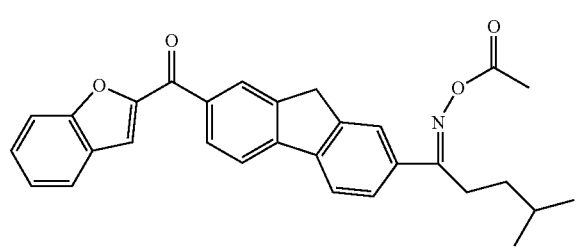

The oxime compound is preferably a compound having a maximal absorption wavelength in a wavelength range of 350 to 500 nm and more preferably a compound having a maximal absorption wavelength in a wavelength range of 360 to 480 nm. In addition, from the viewpoint of sensitivity, the molar absorption coefficient of the oxime compound at a wavelength of 365 nm or 405 nm is preferably high, more preferably 1000 to 300000, still more preferably 2000 to 300000, and particularly preferably 5000 to 200000. The molar absorption coefficient of a compound can be measured using a well-known method. For example, it is preferable that the molar absorption coefficient can be measured using a spectrophotometer (Cary-5 spectrophotometer, manufactured by Varian Medical Systems, Inc.) and ethyl acetate at a concentration of 0.01 g/L.

As the photopolymerization initiator, a bifunctional or tri- or higher functional photoradical polymerization initiator may be used. By using such a photoradical polymerization initiator, two or more radicals are generated from one molecule of the photoradical polymerization initiator, and as a result, good sensitivity is obtained. In addition, in a case of using a compound having an asymmetric structure, crystallinity is reduced so that solubility in a solvent or the like is improved, precipitation is to be difficult over time, and temporal stability of the coloring resin composition can be improved. Specific examples of the bifunctional or tri- or higher functional photoradical polymerization initiator include dimers of the oxime compounds described in JP2010-527339A, JP2011-524436A, WO2015/004565A, paragraph Nos. 0407 to 0412 of JP2016-532675A, and paragraph Nos. 0039 to 0055 of WO2017/033680A; the compound (E) and compound (G) described in JP2013-522445A; Cmpd 1 to 7 described in WO2016/034963A; the oxime ester photoinitiators described in paragraph No. 0007 of JP2017-523465A; the photoinitiators described in paragraph Nos. 0020 to 0033 of JP2017-167399A; the photopolymerization initiator (A) described in paragraph Nos. 0017 to 0026 of JP2017-151342A; and the oxime compound described in JP6469669B.

In a case of containing a photopolymerization initiator, the content of the photopolymerization initiator in the total solid content of the coloring resin composition is preferably 0.1 to 30 mass %. The lower limit is preferably 0.5 mass % or more and more preferably 1 mass % or more. The upper limit is preferably 20 mass % or less and more preferably 15 mass % or less. The photopolymerization initiator may be used singly or in combination of two or more kinds thereof.

<Silane Coupling Agent>

The coloring resin composition according to the embodiment of the present invention can contain a silane coupling agent. In the present invention, the silane coupling agent means a silane compound having a hydrolyzable group and other functional groups. In addition, the hydrolyzable group refers to a substituent directly linked to a silicon atom and capable of forming a siloxane bond due to at least one of a hydrolysis reaction or a condensation reaction. Examples of the hydrolyzable group include a halogen atom, an alkoxy group, and an acyloxy group, and an alkoxy group is preferable. That is, it is preferable that the silane coupling agent is a compound having an alkoxysilyl group. Examples of the functional group other than the hydrolyzable group include a vinyl group, a (meth)allyl group, a (meth)acryloyl group, a mercapto group, an epoxy group, an oxetanyl group, an amino group, a ureido group, a sulfide group, an isocyanate group, and a phenyl group, and an amino group, a (meth)acryloyl group, or an epoxy group is preferable. Specific examples of the silane coupling agent include the compounds described in paragraph Nos. 0018 to 0036 of JP2009-288703A and the compounds described in paragraph Nos. 0056 to 0066 of JP2009-242604A, the contents of which are incorporated herein by reference.

The content of the silane coupling agent in the total solid content of the coloring resin composition is preferably 0.1 to 5 mass %. The upper limit is preferably 3 mass % or less and more preferably 2 mass % or less. The lower limit is preferably 0.5 mass % or more and more preferably 1 mass % or more. The silane coupling agent may be used singly or in combination of two or more kinds thereof.

<Curing Accelerator>

For the purpose of promoting the reaction of the resin and the polymerizable compound and lowering the curing temperature, the coloring resin composition according to the embodiment of the present invention can further contain a curing accelerator. As the curing accelerator, a methylol-based compound (for example, the compounds exemplified as a crosslinking agent in paragraph No. 0246 of JP2015-034963A), amines, phosphonium salts, amidine salts, and amide compounds (each of which is the curing agent described in, for example, paragraph No. 0186 of JP2013-041165A), base generators (for example, the ionic compounds described in JP2014-055114A), cyanate compounds (for example, the compounds described in paragraph No. 0071 of JP2012-150180A), alkoxysilane compounds (for example, the alkoxysilane compounds having an epoxy group, described in JP2011-253054A), onium salt compounds (for example, the compounds exemplified as an acid generator in paragraph No. 0216 of JP2015-034963A, and the compounds described in JP2009-180949A), or the like can also be used.

In a case where the coloring resin composition according to the embodiment of the present invention contains a curing accelerator, the content of the curing accelerator is preferably 0.3 to 8.9 mass % and more preferably 0.8 to 6.4 mass % with respect to the total solid content of the coloring resin composition.

<Polymerization Inhibitor>

The coloring resin composition according to the embodiment of the present invention can contain a polymerization inhibitor. Examples of the polymerization inhibitor include hydroquinone, p-methoxyphenol, di-tert-butyl-p-cresol, pyrogallol, tert-butyl catechol, benzoquinone, 4,4'-thiobis(3-methyl-6-tert-butylphenol), 2,2'-methylenebis(4-methyl-6-t-butylphenol), and an N-nitrosophenylhydroxylamine salt (an ammonium salt, a cerous salt, or the like). Among these, p-methoxyphenol is preferable. The content of the polymerization inhibitor in the total solid content of the coloring resin composition is preferably 0.0001 to 5 mass %.
<Surfactant>

The coloring resin composition according to the embodiment of the present invention can contain a surfactant. As the surfactant, various surfactants such as a fluorine-based surfactant, a nonionic surfactant, a cationic surfactant, an anionic surfactant, or a silicon-based surfactant can be used. Examples of the surfactant include surfactants described in paragraph Nos. 0238 to 0245 of WO2015/166779A, the contents of which are incorporated herein by reference.

It is preferable that the surfactant is a fluorine-based surfactant. By containing a fluorine-based surfactant in the coloring resin composition, liquid characteristics (particularly, fluidity) are further improved, and liquid saving properties can be further improved. In addition, it is possible to form a film with a small thickness unevenness.

The fluorine content in the fluorine-based surfactant is suitably 3 to 40 mass %, and more preferably 5 to 30 mass % and particularly preferably 7% to 25 mass %. The fluorine-based surfactant in which the fluorine content is within the above-described range is effective in terms of the evenness of the thickness of the coating film or liquid saving properties and the solubility of the surfactant in the coloring resin composition is also good.

Examples of the fluorine-based surfactant include surfactants described in paragraph Nos. 0060 to 0064 of JP2014-041318A (paragraph Nos 0060 to 0064 of the corresponding WO2014/017669A) and the like, and surfactants described in paragraph Nos 0117 to 0132 of JP2011-132503A, the contents of which are incorporated herein by reference. Examples of a commercially available product of the fluorine-based surfactant include: MEGAFACE F171, F172, F173, F176, F177, F141, F142, F143, F144, R30, F437, F475, F479, F482, F554, F780, EXP, and MFS-330 (all of which are manufactured by DIC Corporation); FLUORAD FC430, FC431, and FC171 (all of which are manufactured by Sumitomo 3M Ltd.); SURFLON S-382, SC-101, SC-103, SC-104, SC-105, SC-1068, SC-381, SC-383, S-393, and KH-40 (all of which are manufactured by Asahi Glass Co., Ltd.); and POLYFOX PF636, PF656, PF6320, PF6520, and PF7002 (all of which are manufactured by OMNOVA Solutions Inc.).

In addition, it is also preferable that a polymer of a fluorine atom-containing vinyl ether compound having a fluorinated alkyl group or a fluorinated alkylene ether group, and a hydrophilic vinyl ether compound is used as the fluorine-based surfactant. With regard to such a fluorine-based surfactant, reference can be made to the description in JP2016-216602A, the contents of which are incorporated herein by reference.

A block polymer can also be used as the fluorine-based surfactant. Examples thereof include the compounds described in JP2011-089090A. As the fluorine-based surfactant, a fluorine-containing polymer compound including a repeating unit derived from a (meth)acrylate compound having a fluorine atom and a repeating unit derived from a (meth)acrylate compound having 2 or more (preferably 5 or more) alkyleneoxy groups (preferably ethyleneoxy groups or propyleneoxy groups) can also be preferably used. The following compounds are also exemplified as the fluorine-based surfactant used in the present invention.

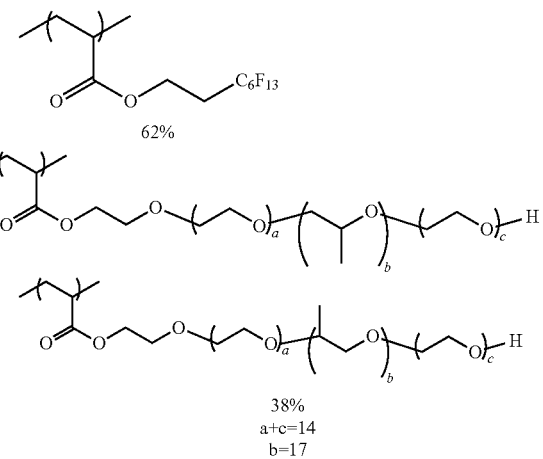

The weight-average molecular weight of the above-described compound is preferably 3000 to 50000, and is, for example, 14000. In the compound, "%" representing the proportion of a repeating unit is mol %.

In addition, as the fluorine-based surfactant, a fluorine-containing polymer having an ethylenically unsaturated bond-containing group in the side chain can be used. Specific examples thereof include the compounds described in paragraph Nos. 0050 to 0090 and paragraph Nos. 0289 to 0295 of JP2010-164965A, and for example, MEGAFACE RS-101, RS-102, RS-718K, and RS-72-K manufactured by DIC Corporation. As the fluorine-based surfactant, the compounds described in paragraph Nos. 0015 to 0158 of JP2015-117327A can also be used.

The content of the surfactant in the total solid content of the coloring resin composition is preferably 0.001 mass % to 5.0 mass % and more preferably 0.005 to 3.0 mass %. The surfactant may be used singly or in combination of two or more kinds thereof. In a case of using two or more kinds thereof, the total amount thereof is preferably within the above-described range.
<Ultraviolet Absorber>

The coloring resin composition according to the embodiment of the present invention can contain an ultraviolet absorber. As the ultraviolet absorber, a conjugated diene compound, an aminodiene compound, a salicylate compound, a benzophenone compound, a benzotriazole compound, an acrylonitrile compound, a hydroxyphenyltriazine compound, an indole compound, a triazine compound, or the like can be used. With regard to details thereof, reference can be made to the description in paragraph Nos. 0052 to 0072 of JP2012-208374A, paragraph Nos. 0317 to 0334 of JP2013-068814A, and paragraph Nos. 0061 to 0080 of JP2016-162946A, the contents of which are incorporated herein by reference. Examples of a commercially available product of the ultraviolet absorber include UV-503 (manufactured by Daito Chemical Co., Ltd.). In addition, examples of the benzotriazole compound include MYUA series manufactured by Miyoshi Oil & Fat Co., Ltd. (The Chemical Daily, Feb. 1, 2016). In addition, as the ultraviolet absorber, compounds described in paragraph Nos. 0049 to 0059 of JP6268967B can also be used. The content of the ultraviolet absorber in the total solid content of the coloring resin composition is preferably 0.01 to 10 mass % and more preferably 0.01 to 5 mass %. The ultraviolet absorber may be used singly or in combination of two or more kinds thereof. In a case where two or more kinds thereof are used, it is preferable that the total amount thereof is within the above-described range.

<Antioxidant>

The coloring resin composition according to the embodiment of the present invention can contain an antioxidant. Examples of the antioxidant include a phenol compound, a phosphite ester compound, and a thioether compound. As the phenol compound, any phenol compound which is known as a phenol-based antioxidant can be used. Preferred examples of the phenol compound include a hindered phenol compound. A compound having a substituent at a site (ortho position) adjacent to a phenolic hydroxy group is preferable. As the substituent, a substituted or unsubstituted alkyl group having 1 to 22 carbon atoms is preferable. In addition, as the antioxidant, a compound having a phenol group and a phosphite ester group in the same molecule is also preferable. In addition, as the antioxidant, a phosphorus antioxidant can also be suitably used. The content of the antioxidant in the total solid content of the coloring resin composition is preferably 0.01 to 20 mass % and more preferably 0.3 to 15 mass %. The antioxidant may be used singly or in combination of two or more kinds thereof. In a case where two or more kinds thereof are used, it is preferable that the total amount thereof is within the above-described range.

<Other Components>

Optionally, the coloring resin composition according to the embodiment of the present invention may further contain a sensitizer, a filler, a thermal curing accelerator, a plasticizer, and other auxiliary agents (for example, conductive particles, an anti-foaming agent, a flame retardant, a leveling agent, a peeling accelerator, an aromatic chemical, a surface tension adjuster, or a chain transfer agent). By appropriately containing these components, properties such as film properties can be adjusted. The details of the components can be found in, for example, paragraph No. 0183 of JP2012-003225A (corresponding to paragraph No. 0237 of US2013/0034812A) and paragraph Nos. 0101 to 0104 and 0107 to 0109 of JP2008-250074A, the contents of which are incorporated herein by reference. In addition, optionally, the coloring resin composition may contain a potential antioxidant. Examples of the potential antioxidant include a compound in which a site functioning as an antioxidant is protected by a protective group, and the protective group is eliminated by heating the compound at 100° C. to 250° C. or heating the compound at 80° C. to 200° C. in the presence of an acid or base catalyst so that the compound functions as an antioxidant. Examples of the potential antioxidant include the compounds described in WO2014/021023A, WO2017/030005A, and JP2017-008219A. Examples of a commercially available product thereof include ADEKA ARKLS GPA-5001 (manufactured by ADEKA Corporation). In addition, as described in JP2018-155881A, C. I. Pigment Yellow 129 may be added for the purpose of improving weather fastness.

In order to adjust the refractive index of a film to be obtained, the coloring resin composition according to the embodiment of the present invention may contain a metal oxide. Examples of the metal oxide include $TiO_2$, $ZrO_2$, $Al_2O_3$, and $SiO_2$. The primary particle diameter of the metal oxide is preferably 1 to 100 nm, more preferably 3 to 70 nm, and still more preferably 5 to 50 nm. The metal oxide may have a core-shell structure. In addition, in this case, the core portion may be hollow.

The coloring resin composition according to the embodiment of the present invention may include a light-resistance improver. Examples of the light-resistance improver include the compounds described in paragraph Nos. 0036 and 0037 of JP2017-198787A, the compounds described in paragraph Nos. 0029 to 0034 of JP2017-146350A, the compounds described in paragraph Nos. 0036 and 0037, and 0049 to 0052 of JP2017-129774A, the compounds described in paragraph Nos. 0031 to 0034 and 0058 and 0059 of JP2017-129674A, the compounds described in paragraph Nos. 0036 and 0037, and 0051 to 0054 of JP2017-122803A, the compounds described in paragraph Nos. 0025 to 0039 of WO2017/164127A, the compounds described in paragraph Nos. 0034 to 0047 of JP2017-186546A, the compounds described in paragraph Nos. 0019 to 0041 of JP2015-025116A, the compounds described in paragraph Nos. 0101 to 0125 of JP2012-145604A, the compounds described in paragraph Nos. 0018 to 0021 of JP2012-103475A, the compounds described in paragraph Nos. 0015 to 0018 of JP2011-257591A, the compounds described in paragraph Nos. 0017 to 0021 of JP2011-191483A, the compounds described in paragraph Nos. 0108 to 0116 of JP2011-145668A, and the compounds described in paragraph Nos. 0103 to 0153 of JP2011-253174A.

In the coloring resin composition according to the embodiment of the present invention, the content of liberated metal which is not bonded to or coordinated with a pigment or the like is preferably 100 ppm or less, more preferably 50 ppm or less, and still more preferably 10 ppm or less, it is particularly preferable to not contain the liberated metal substantially. According to this aspect, effects such as stabilization of pigment dispersibility (restraint of aggregation), improvement of spectral characteristics due to improvement of dispersibility, restraint of conductivity fluctuation due to stabilization of curable components or elution of metal atoms and metal ions, and improvement of display characteristics can be expected. In addition, the effects described in JP2012-153796A, JP2000-345085A, JP2005-200560A, JP1996-043620A (JP-H08-043620A), JP2004-145078A, JP2014-119487A, JP2010-083997A, JP2017-090930A, JP2018-025612A, JP2018-025797A, JP2017-155228A, JP2018-036521A, and the like can also be obtained. Examples of the types of the above-described liberated metals include Na, K, Ca, Sc, Ti, Mn, Cu, Zn, Fe, Cr, Co, Mg, Al, Sn, Zr, Ga, Ge, Ag, Au, Pt, Cs, Ni, Cd, Pb, and Bi. In addition, in the coloring resin composition according to the embodiment of the present invention, the content of liberated halogen which is not bonded to or coordinated with a pigment or the like is preferably 100 ppm or less, more preferably 50 ppm or less, and still more preferably 10 ppm or less, it is particularly preferable to not contain the liberated halogen substantially. Examples of halogen include F, Cl, Br, I, and anions thereof. Examples of a method for reducing liberated metals and halogens in the coloring resin composition include washing with ion exchange water, filtration, ultrafiltration, and purification with an ion exchange resin.

It is also preferable that the coloring resin composition according to the embodiment of the present invention does not substantially include terephthalic acid ester. Here, the "does not substantially include" means that the content of terephthalic acid ester is 1000 mass ppb or less in the total amount of the coloring resin composition, and it is more preferable to be 100 mass ppb or less and particularly preferable to be 0.

<Storage Container>

A storage container of the coloring resin composition according to the embodiment of the present invention is not particularly limited, and a known storage container can be used. In addition, as the storage container, it is also preferable to use a multilayer bottle having an interior wall constituted with six layers from six kinds of resins or a bottle having a 7-layer structure from 6 kinds of resins for the purpose of suppressing infiltration of impurities into raw materials or coloring resin compositions. Examples of such a container include the containers described in JP2015-123351A. In addition, for the purpose of preventing metal elution from the container interior wall, improving storage stability of the coloring resin composition, and suppressing the alteration of components, it is also preferable that the container interior wall is formed of glass, stainless steel, or the like.

<Method for Preparing Coloring Resin Composition>

The coloring resin composition according to the embodiment of the present invention can be prepared by mixing the above-described components with each other. During the preparation of the coloring resin composition, all the components may be dissolved and/or dispersed in an organic solvent at the same time to prepare the coloring resin composition. Optionally, two or more solutions or dispersion liquids in which the respective components are appropriately blended may be prepared, and the solutions or dispersion liquids may be mixed with each other during use (during application) to prepare the coloring resin composition.

In addition, in the preparation of the coloring resin composition, a process of dispersing the pigment is preferably included. In the process for dispersing the pigment, examples of a mechanical force which is used for dispersing the pigment include compression, pressing, impact, shear, and cavitation. Specific examples of these processes include a beads mill, a sand mill, a roll mill, a ball mill, a paint shaker, a microfluidizer, a high-speed impeller, a sand grinder, a flow jet mixer, high-pressure wet atomization, and ultrasonic dispersion. In addition, in the pulverization of the pigment in a sand mill (beads mill), it is preferable to perform a treatment under the condition for increasing a pulverization efficiency by using beads having small diameters; increasing the filling rate of the beads; or the like. Incidentally, it is preferable to remove coarse particles by filtration, centrifugation, or the like after the pulverization treatment. In addition, as the process and the dispersing machine for dispersing the pigment, the process and the dispersing machine described in "Dispersion Technology Comprehension, published by Johokiko Co., Ltd., Jul. 15, 2005", "Actual comprehensive data collection on dispersion technology and industrial application centered on suspension (solid/liquid dispersion system), published by Publication Department, Management Development Center, Oct. 10, 1978", and paragraph No. 0022 of JP2015-157893A can be suitably used. In addition, in the process for dispersing the pigment, a refining treatment of particles in a salt milling step may be performed. With regard to the materials, equipment, treatment conditions, and the like used in the salt milling step, reference can be made to, for example, the description in JP2015-194521A and JP2012-046629A.

During the preparation of the coloring resin composition, it is preferable that the coloring resin composition is filtered through a filter, for example, in order to remove foreign matter or to reduce defects. As the filter, any filters that have been used in the related art for filtration use and the like may be used without particular limitation. Examples of a material of the filter include: a fluororesin such as polytetrafluoroethylene (PTFE); a polyamide resin such as nylon (for example, nylon-6 or nylon-6,6); and a polyolefin resin (including a polyolefin resin having a high density and an ultrahigh molecular weight) such as polyethylene or polypropylene (PP). Among these materials, polypropylene (including a high-density polypropylene) and nylon are preferable.

The pore size of the filter is preferably 0.01 to 7.0 μm, more preferably 0.01 to 3.0 μm, and still more preferably 0.05 to 0.5 μm. In a case where the pore size of the filter is within the above-described range, fine foreign matters can be reliably removed. With regard to the pore size value of the filter, reference can be made to a nominal value of filter manufacturers. As the filter, various filters provided by Nihon Pall Corporation (DFA4201NIEY and the like), Toyo Roshi Kaisha., Ltd., Nihon Entegris K.K. (formerly Nippon Microlith Co., Ltd.), Kitz Micro Filter Corporation, and the like can be used.

In addition, it is preferable that a fibrous filter material is used as the filter. Examples of the fibrous filter material include a polypropylene fiber, a nylon fiber, and a glass fiber. Examples of a commercially available product include SBP type series (SBP008 and the like), TPR type series (TPR002, TPR005, and the like), or SHPX type series (SHPX003 and the like), all manufactured by Roki Techno Co., Ltd.

In a case of using a filter, different filters (for example, a first filter, a second filter, and the like) may be combined. In this case, the filtration with each of the filters may be performed once or may be performed twice or more times. In addition, filters having different pore sizes within the above-described range may be combined. In addition, the filtration through the first filter may be performed with only a dispersion liquid, the other components may be mixed therewith, and then the filtration through the second filter may be performed.

(Film)

The film according to the embodiment of the present invention is a film obtained from the above-described coloring resin composition according to the embodiment of the present invention. The film according to the embodiment of the present invention can be used for a color filter, a near-infrared transmitting filter, a near-infrared cut filter, a black matrix, a light-shielding film, and the like. For example, the film according to an embodiment of the present invention can be preferably used as a colored layer of a color filter.

The thickness of the film according to the embodiment of the present invention can be adjusted according to the purpose. For example, the film thickness is preferably 20 μm or less, more preferably 10 μm or less, and still more preferably 5 μm or less. The lower limit of the film thickness is preferably 0.1 μm or more, more preferably 0.2 μm or more, and still more preferably 0.3 μm or more.

In the film according to the embodiment of the present invention, a thickness of the film after performing a heating treatment of the film at 300° C. for 5 hours in a nitrogen atmosphere is preferably 70% or more of a thickness of the film before the heating treatment, more preferably 80% or more thereof, and still more preferably 90% or more.

In addition, a thickness of the film after performing a heating treatment of the film at 350° C. for 5 hours in a nitrogen atmosphere is preferably 70% or more of a thickness of the film before the heating treatment, more preferably 80% or more thereof, and still more preferably 90% or more.

In addition, a thickness of the film after performing a heating treatment of the film at 400° C. for 5 hours in a nitrogen atmosphere is preferably 70% or more of a thickness of the film before the heating treatment, more preferably 80% or more thereof, and still more preferably 90% or more.

In the film according to the embodiment of the present invention, it is preferable that a maximum value of a transmittance of the film at a wavelength of 400 to 1100 nm is 70% or more (preferably 75% or more, more preferably 80% or more, and still more preferably 85% or more), and a minimum value thereof is 30% or less (preferably 25% or less, more preferably 20% or less, and still more preferably 15% or less).

(Method for Manufacturing Film)

The film according to the embodiment of the present invention can be manufactured through a step of applying the coloring resin composition according to the embodiment of the present invention on a support. The method for manufacturing the film according to the embodiment of the present invention preferably further includes a step of forming a pattern (pixel). Examples of a method for forming the pattern (pixel) include a photolithography method and a dry etching method, and a photolithography method is preferable.

<Photolithography Method>

First, a case of forming the pattern by a photolithography method to manufacture a film will be described. Pattern formation by the photolithography method preferably includes a step of forming a coloring resin composition layer on a support using the coloring resin composition according to the embodiment of the present invention, a step of exposing the coloring resin composition layer in a patterned manner, and a step of removing a non-exposed portion of the coloring resin composition layer by development to form a pattern (pixel). A step (pre-baking step) of baking the coloring resin composition layer and a step (post-baking step) of baking the developed pattern (pixel) may be provided, optionally.

In the step of forming a coloring resin composition layer, the coloring resin composition layer is formed on a support using the coloring resin composition according to the embodiment of the present invention. The support is not particularly limited, and can be appropriately selected depending on applications. Examples thereof include a glass substrate and a silicon substrate, and a silicon substrate is preferable. In addition, a charge coupled device (CCD), a complementary metal-oxide semiconductor (CMOS), a transparent conductive film, or the like may be formed on the silicon substrate. In some cases, a black matrix for isolating each pixel is formed on the silicon substrate. In addition, an undercoat layer may be provided on the silicon substrate so as to improve adhesiveness to an upper layer, prevent the diffusion of materials, or planarize the surface of the substrate.

As a method of applying the coloring resin composition, a known method can be used. Examples thereof include a dropping method (drop casting); a slit coating method; a spray method; a roll coating method; a spin coating method (spin coating); a cast coating method; a slit and spin method; a pre-wet method (for example, a method described in JP2009-145395A), various printing methods such as an ink jet (for example, on-demand type, piezo type, thermal type), a discharge printing such as nozzle jet, a flexo printing, a screen printing, a gravure printing, a reverse offset printing, and a metal mask printing; a transfer method using molds and the like; and a nanoimprinting method. A method for applying the ink jet is not particularly limited, and examples thereof include a method described in "Extension of Use of Ink Jet-Infinite Possibilities in Patent-" (February, 2005, S. B. Research Co., Ltd.) (particularly pp. 115 to 133) and methods described in JP2003-262716A, JP2003-185831A, JP2003-261827A, JP2012-126830A, and JP2006-169325A.

In addition, as the method of applying the coloring resin composition, methods described in WO2017/030174A and WO2017/018419A can also be used, the contents of which are incorporated herein by reference.

The coloring resin composition layer formed on the support may be dried (pre-baked). In a case of producing a film by a low-temperature process, pre-baking may not be performed. In a case of performing the pre-baking, the pre-baking temperature is preferably 150° C. or lower, more preferably 120° C. or lower, and still more preferably 110° C. or lower. The lower limit may be set to, for example, 50° C. or higher, or to 80° C. or higher. The pre-baking time is preferably 10 to 300 seconds, more preferably 40 to 250 seconds, and still more preferably 80 to 220 seconds. The pre-baking can be performed using a hot plate, an oven, or the like.

Next, the coloring resin composition layer is exposed in a patterned manner (exposing step). For example, the coloring resin composition layer can be exposed in a patterned manner using a stepper exposure device or a scanner exposure device through a mask having a predetermined mask pattern. Thus, the exposed portion can be cured.

Examples of the radiation (light) which can be used during the exposure include g-rays and i-rays. In addition, light (preferably light having a wavelength of 180 to 300 nm) having a wavelength of 300 nm or less can be used. Examples of the light having a wavelength of 300 nm or less include KrF-rays (wavelength: 248 nm) and ArF-rays (wavelength: 193 nm), and KrF-rays (wavelength: 248 nm) are preferable. In addition, a long-wave light source of 300 nm or more can be used.

In addition, in a case of exposure, the composition layer may be irradiated with light continuously to expose the composition layer, or the composition layer may be irradiated with light in a pulse to expose the composition layer (pulse exposure). The pulse exposure refers to an exposing method in which light irradiation and resting are repeatedly performed in a short cycle (for example, millisecond-level or less). In a case of the pulse exposure, the pulse width is preferably 100 nanoseconds (ns) or less, more preferably 50 nanoseconds or less, and still more preferably 30 nanoseconds or less. The lower limit of the pulse width is not particularly limited, and may be 1 femtosecond (fs) or more or 10 femtoseconds or more. The frequency is preferably 1 kHz or more, more preferably 2 kHz or more, and still more preferably 4 kHz or more. The upper limit of the frequency is preferably 50 kHz or less, more preferably 20 kHz or less, and still more preferably 10 kHz or less. The maximum instantaneous illuminance is preferably 50000000 W/m2 or more, more preferably 100000000 $W/m^2$ or more, and still more preferably 200000000 $W/m^2$ or more. In addition, the upper limit of the maximum instantaneous illuminance is preferably 1000000000 $W/m^2$ or less, more preferably 800000000 $W/m^2$ or less, and still more preferably 500000000 $W/m^2$ or less. The pulse width refers to a time during which light is irradiated in a pulse period. In addition, the frequency refers to the number of pulse periods per second. In addition, the maximum instantaneous illuminance refers to an average illuminance within the period of light irradiation in the pulse period. In addition, the pulse period refers to a period in which light irradiation and resting in the pulse exposure are defined as one cycle.

The irradiation amount (exposure amount) is, for example, preferably 0.03 to 2.5 $J/cm^2$ and more preferably 0.05 to 1.0 $J/cm^2$. The oxygen concentration during the exposure can be appropriately selected, and the exposure may also be performed, for example, in a low-oxygen atmosphere having an oxygen concentration of 19% by volume or less (for example, 15% by volume, 5% by volume, and substantially oxygen-free) or in a high-oxygen atmosphere having an oxygen concentration of more than 21% by volume (for example, 22% by volume, 30% by volume, and 50% by volume), in addition to an atmospheric air. In addition, the exposure illuminance can be appropriately set, and can be usually selected from a range of 1000 W/m$^2$ to 100000 W/m$^2$ (for example, 5000 W/m$^2$, 15000 W/m$^2$, or 35000 W/m$^2$). Appropriate conditions of each of the oxygen concentration and the exposure illuminance may be combined, and for example, a combination of the oxygen concentration of 10% by volume and the illuminance of 10000 W/m$^2$, a combination of the oxygen concentration of 35% by volume and the illuminance of 20000 W/m$^2$, or the like is available.

Next, the non-exposed portion of the coloring resin composition layer is removed by development to form a pattern (pixel). The non-exposed portion of the coloring resin composition layer can be removed by development using a developer. Thus, the coloring resin composition layer of the non-exposed portion in the exposing step is eluted into the developer, and as a result, only a photocured portion remains. The temperature of the developer is preferably, for example, 20° C. to 30° C. The development time is preferably 20 to 180 seconds. In addition, in order to improve residue removing properties, a step of removing the developer by shaking off per 60 seconds and supplying a fresh developer may be repeated multiple times.

Examples of the developer include an organic solvent and an alkali developer, and an alkali developer is preferably used. As the alkali developer, an alkaline solution (alkali developer) in which an alkali agent is diluted with pure water is preferable. Examples of the alkali agent include organic alkaline compounds such as ammonia, ethylamine, diethylamine, dimethylethanolamine, diglycol amine, diethanolamine, hydroxyamine, ethylenediamine, tetramethylammonium hydroxide, tetraethylammonium hydroxide, tetrapropylammonium hydroxide, tetrabutylammonium hydroxide, ethyltrimethylammonium hydroxide, benzyltrimethylammonium hydroxide, dimethylbis(2-hydroxyethyl)ammonium hydroxide, choline, pyrrole, piperidine, and 1,8-diazabicyclo[5.4.0]-7-undecene, and inorganic alkaline compounds such as sodium hydroxide, potassium hydroxide, sodium carbonate, sodium hydrogen carbonate, sodium silicate, and sodium metasilicate. In consideration of environmental aspects and safety aspects, the alkali agent is preferably a compound having a high molecular weight. The concentration of the alkali agent in the aqueous alkaline solution is preferably 0.001 to 10 mass % and more preferably 0.01 to 1 mass %. In addition, the developer may further contain a surfactant. Examples of the surfactant include the surfactants described above. Among these, a nonionic surfactant is preferable. From the viewpoint of easiness of transport, storage, and the like, the developer may be obtained by temporarily preparing a concentrated solution and diluting the concentrated solution to a necessary concentration during use. The dilution ratio is not particularly limited, and can be set to, for example, a range of 1.5 to 100 times. In addition, it is also preferable to wash (rinse) with pure water after development. In addition, it is preferable that the rinsing is performed by supplying a rinsing liquid to the coloring resin composition layer after development while rotating the support on which the coloring resin composition layer after development is formed. In addition, it is preferable that the rinsing is performed by moving a nozzle discharging the rinsing liquid from a center of the support to a peripheral edge of the support. In this case, in the movement of the nozzle from the center of the support to the peripheral edge of the support, the nozzle may be moved while gradually decreasing the moving speed of the nozzle. By performing rinsing in this manner, in-plane variation of rinsing can be suppressed. In addition, the same effect can be obtained by gradually decreasing the rotating speed of the support while moving the nozzle from the center of the support to the peripheral edge of the support.

After the development, it is preferable to carry out an additional exposure treatment or a heating treatment (post-baking) after carrying out drying. The additional exposure treatment or the post-baking is a curing treatment after development in order to complete curing. The heating temperature in the post-baking is preferably, for example, 100° C. to 240° C. and more preferably 200° C. to 240° C. The film after development is post-baked continuously or batch-wise using a heating unit such as a hot plate, a convection oven (hot air circulation dryer), and a high-frequency heater under the above-described conditions. In a case of performing the additional exposure treatment, light used for the exposure is preferably light having a wavelength of 400 nm or less. In addition, the additional exposure treatment may be carried out by the method described in KR10-2017-0122130A.

<Dry Etching Method>

Pattern formation by a dry etching method preferably includes a step of forming a coloring resin composition layer on a support using the coloring resin composition according to the embodiment of the present invention and curing the entire coloring resin composition layer to form a cured composition layer, a step of forming a photoresist layer on the cured composition layer, a step of exposing the photoresist layer in a patterned manner and then developing the photoresist layer to form a resist pattern, and a step of dry-etching the cured composition layer through this resist pattern as a mask and using an etching gas. It is preferable that pre-baking treatment is further performed in order to form the photoresist layer. In particular, as the forming process of the photoresist layer, it is desirable that a heating treatment after exposure and a heating treatment after development (post-baking treatment) are performed. The details of the pattern formation by the dry etching method can be found in paragraph Nos. 0010 to 0067 of JP2013-064993A, the content of which is incorporated herein by reference.

(Color Filter)

The color filter according to the embodiment of the present invention has the film according to the embodiment of the present invention. More preferably, the color filter according to the embodiment of the present invention has the film according to the embodiment of the present invention as a pixel of the color filter. The color filter according to the embodiment of the present invention can be used for a solid-state imaging element such as a charge coupled device (CCD) and a complementary metal-oxide semiconductor (CMOS), an image display device, or the like.

In the color filter according to the embodiment of the present invention, the thickness of the film according to the embodiment of the present invention can be appropriately adjusted depending on the purposes. The film thickness is preferably 20 μm or less, more preferably 10 μm or less, and still more preferably 5 μm or less. The lower limit of the film thickness is preferably 0.1 μm or more, more preferably 0.2 μm or more, and still more preferably 0.3 μm or more.

In the color filter according to the embodiment of the present invention, the width of the pixel is preferably 0.5 to 20.0 μm. The lower limit is preferably 1.0 μm or more and more preferably 2.0 µm or more. The upper limit is preferably 15.0 µm or less and more preferably 10.0 µm or less. In addition, the Young's modulus of the pixel is preferably 0.5 to 20 GPa and more preferably 2.5 to 15 GPa.

Each pixel included in the color filter according to the embodiment of the present invention preferably has high flatness. Specifically, the surface roughness Ra of the pixel is preferably 100 nm or less, more preferably 40 nm or less, and still more preferably 15 nm or less. The lower limit is not specified, but is preferably, for example, 0.1 nm or more. The surface roughness of the pixel can be measured, for example, using an atomic force microscope (AFM) Dimension 3100 manufactured by Veeco Instruments, Inc. In addition, the contact angle of water on the pixel can be appropriately set to a preferred value and is typically in the range of 50° to 110°. The contact angle can be measured, for example, using a contact angle meter CV-DT-A Model (manufactured by Kyowa Interface Science Co., Ltd.). In addition, it is preferable that the volume resistivity value of the pixel is high. Specifically, the volume resistivity value of the pixel is preferably 109 Ω·cm or more and more preferably $10^{11}$ Ω·cm or more. The upper limit is not specified, but is, for example, preferably $10^{14}$ Ω·cm or less. The volume resistivity value of the pixel can be measured using an ultrahigh resistance meter 5410 (manufactured by Advantest Corporation).

In addition, in the color filter according to the embodiment of the present invention, a protective layer may be provided on the surface of the film according to the embodiment of the present invention. By providing the protective layer, various functions such as oxygen shielding, low reflection, hydrophilicity/hydrophobicity, and shielding of light (ultraviolet rays, near-infrared rays, and the like) having a specific wavelength can be imparted. The thickness of the protective layer is preferably 0.01 to 10 µm and more preferably 0.1 to 5 µm. Examples of a method for forming the protective layer include a method of forming the protective layer by applying a resin composition for forming a protective layer, which is dissolved in an organic solvent, a chemical vapor deposition method, and a method of attaching a molded resin with an adhesive. Examples of components constituting the protective layer include a (meth)acrylic resin, an ene-thiol resin, a polycarbonate resin, a polyether resin, a polyarylate resin, a polysulfone resin, a polyethersulfone resin, a polyphenylene resin, a polyarylene ether phosphine oxide resin, a polyimide resin, a polyamidoimide resin, a polyolefin resin, a cyclic olefin resin, a polyester resin, a styrene resin, a polyol resin, a polyvinylidene chloride resin, a melamine resin, a urethane resin, an aramid resin, a polyamide resin, an alkyd resin, an epoxy resin, a modified silicone resin, a fluororesin, a polycarbonate resin, a polyacrylonitrile resin, a cellulose resin, Si, C, W, $Al_2O_3$, Mo, $SiO_2$, and $Si_3N_4$, and two or more kinds of these components may be contained. For example, in a case of a protective layer for oxygen shielding, it is preferable that the protective layer contains a polyol resin, $SiO_2$, and $Si_3N_4$. In addition, in a case of a protective layer for low reflection, it is preferable that the protective layer contains a (meth)acrylic resin and a fluororesin.

In a case of forming the protective layer by applying a resin composition for forming a protective layer, as a method for applying the resin composition for forming a protective layer, a known method such as a spin coating method, a casting method, a screen printing method, and an ink jet method can be used. As the organic solvent included in the resin composition for forming a protective layer, a known organic solvent (for example, propylene glycol 1-monomethyl ether 2-acetate, cyclopentanone, ethyl lactate, and the like) can be used. In a case of forming the protective layer by a chemical vapor deposition method, as the chemical vapor deposition method, a known chemical vapor deposition method (thermochemical vapor deposition method, plasma chemical vapor deposition method, and photochemical vapor deposition method) can be used.

The protective layer may contain, as desired, an additive such as organic or inorganic fine particles, an absorber of light (for example, ultraviolet rays, near-infrared rays, and the like) having a specific wavelength, a refractive index adjusting agent, an antioxidant, an adhesive agent, and a surfactant. Examples of the organic or inorganic fine particles include polymer fine particles (for example, silicone resin fine particles, polystyrene fine particles, and melamine resin fine particles), titanium oxide, zinc oxide, zirconium oxide, indium oxide, aluminum oxide, titanium nitride, titanium oxynitride, magnesium fluoride, hollow silica, silica, calcium carbonate, and barium sulfate. As the absorber of light having a specific wavelength, a known absorber can be used. The content of these additives can be appropriately adjusted, but is preferably 0.1 to 70 mass % and still more preferably 1 to 60 mass % with respect to the total mass of the protective layer.

In addition, as the protective layer, the protective layers described in paragraph Nos. 0073 to 0092 of JP2017-151176A can also be used.

The color filter may have a base layer. The base layer can also be formed using, for example, a composition obtained by removing a coloring material from the above-described coloring resin composition according to the embodiment of the present invention.

A preferred surface contact angle of the base is preferably 20° to 70° in a case of being measured with diiodomethane, and preferably 30° to 80° in a case of being measured with water.

In a case where the above-described surface contact angle is within the above-described range, both application properties of the coloring resin composition and application properties of a composition for forming the base are excellent.

In order to keep the surface contact angle within the above-described range, a method such as addition of a surfactant can be mentioned.

In addition, in the green pixel of the color filter, green color may be formed in a combination of C. I. Pigment Green 7, C. I. Pigment Green 36, C. I. Pigment Yellow 139, and C. I. Pigment Yellow 185, or in a combination of C. I. Pigment Green 58, C. I. Pigment Yellow 150, and C. I. Pigment Yellow 185.

The color filter may have a structure in which each colored pixel is embedded in a space partitioned in, for example, a lattice form by a partition wall. In addition, the coloring resin composition according to the embodiment of the present invention can also be suitably used for a pixel configuration described in WO2019/102887A.

(Solid-State Imaging Element)

The solid-state imaging element according to an embodiment of the present invention has the film according to the embodiment of the present invention. The configuration of the solid-state imaging element according to the embodiment of the present invention is not particularly limited as long as the solid-state imaging element is configured to include the film according to the embodiment of the present invention and functions as a solid-state imaging element. Examples of the configuration include the following configurations.

The solid-state imaging element is configured to have a plurality of photodiodes constituting a light receiving area of the solid-state imaging element (a charge coupled device (CCD) image sensor, a complementary metal-oxide semiconductor (CMOS) image sensor, or the like), and a transfer electrode formed of polysilicon or the like on a substrate; have a light-shielding film having openings only over the light receiving section of the photodiodes on the photodiodes and the transfer electrodes; have a device-protective film formed of silicon nitride or the like, which is formed to coat the entire surface of the light-shielding film and the light receiving section of the photodiodes, on the light-shielding film; and have a color filter on the device-protective film. Further, the solid-state imaging element may also be configured, for example, such that it has a light collecting unit (for example, a microlens, which is the same hereinafter) on a device-protective film under a color filter (a side closer to the substrate), or has a light collecting unit on a color filter. In addition, the color filter may have a structure in which each colored pixel is embedded in a space partitioned in, for example, a lattice form by a partition wall. In this case, it is preferable that the partition wall has a lower refractive index than each colored pixel. Examples of an imaging device having such a structure include the devices described in JP2012-227478A, JP2014-179577A, WO2018/043654A, and US2018/0040656A. An imaging device including the solid-state imaging element according to the embodiment of the present invention can also be used as a vehicle camera or a surveillance camera, in addition to a digital camera or electronic apparatus (mobile phones or the like) having an imaging function.

Further, the solid-state imaging element incorporating the color filter according to the embodiment of the present invention may incorporate another color filter, an infrared cut filter, an organic photoelectric conversion film, or the like in addition to the color filter according to the embodiment of the present invention.

(Image Display Device)

The image display device according to an embodiment of the present invention has the film according to the embodiment of the present invention. Examples of the image display device include a liquid crystal display device or an organic electroluminescent display device. The definitions of image display devices or the details of the respective image display devices are described in, for example, "Electronic Display Device (Akio Sasaki, Kogyo Chosakai Publishing Co., Ltd., published in 1990)", "Display Device (Sumiaki Ibuki, Sangyo Tosho Co., Ltd.)", and the like. In addition, the liquid crystal display device is described in, for example, "Liquid Crystal Display Technology for Next Generation (edited by Tatsuo Uchida, Kogyo Chosakai Publishing Co., Ltd., published in 1994)". The liquid crystal display device to which the present invention can be applied is not particularly limited, and can be applied to, for example, liquid crystal display devices employing various systems described in the "Liquid Crystal Display Technology for Next Generation".

(Polyimide or Polyimide Precursor)

The polyimide or polyimide precursor according to the embodiment of the present invention preferably includes the repeating unit represented by Formula (2-1) or Formula (2-2) described above.

A preferred aspect of the polyimide or polyimide precursor according to the embodiment of the present invention is the same as the preferred aspect of the polyimide or polyimide precursor in the coloring resin composition according to the embodiment of the present invention, except that the polyimide or polyimide precursor according to the embodiment of the present invention includes the repeating unit represented by Formula (2-1) or Formula (2-2) described above.

<Application>

The polyimide or polyimide precursor according to the embodiment of the present invention is preferably used, for example, as a resin included in a composition for forming a color filter, and more preferably used as a resin included in a composition for forming a color filter for a solid-state imaging element.

In addition, in applications where a known polyimide or polyimide precursor is used, the polyimide or polyimide precursor according to the embodiment of the present invention can be used in place of the known polyimide or polyimide precursor.

EXAMPLES

Hereinafter, the present invention will be described in detail using examples. The materials, the amounts of materials to be used, the proportions, the treatment details, the treatment procedure, or the like shown in the examples below may be modified appropriately as long as the modifications do not depart from the spirit of the present invention. Therefore, the scope of the present invention is not limited to the specific examples shown below. Unless otherwise specified, "parts" and "%" are based on mass.

<Measurement of Weight-Average Molecular Weight (Mw) of Sample>

The weight-average molecular weight (Mw) of a sample was measured by gel permeation chromatography (GPC) according to the following conditions.

Types of columns: columns formed by connection of TOSOH TSKgel Super HZM-H, TOSOH TSKgel Super HZ4000, and TOSOH TSKgel Super HZ2000

Developing solvent: tetrahydrofuran

Column temperature: 40° C.

Flow rate (amount of a sample to be injected): 1.0 µL (sample concentration: 0.1 mass %)

Device name: HLC-8220GPC manufactured by Tosoh Corporation

Detector: refractive index (RI) detector

Calibration curve base resin: polystyrene resin

<Measurement of Acid Value of Sample>

The acid value of the sample represents a mass of potassium hydroxide required to neutralize acidic components per 1 g of solid content of the sample. The acid value of the sample was measured as follows. That is, a measurement sample was dissolved in a mixed solvent of tetrahydrofuran/water=9/1 (mass ratio), and the obtained solution was subjected to neutralization titration with a 0.1 mol/L sodium hydroxide aqueous solution at 25° C. using a potentiometric titrator (trade name: AT-510, manufactured by KYOTO ELECTRONICS MANUFACTURING CO., LTD.). An inflection point of a titration pH curve was set as a titration end point, and the acid value was calculated from the following equation.

$$A = 56.11 \times Vs \times 0.5 \times f/w$$

A: acid value (mgKOH/g)

Vs: amount (mL) of the 0.1 mol/L sodium hydroxide aqueous solution used for the titration f: titer of the 0.1 mol/L sodium hydroxide aqueous solution w: mass (g) of the sample (expressed in terms of solid contents)

<Measurement of C=C Value of Sample>

The C=C value was obtained by extracting a low-molecular-weight component (a) of an ethylenically unsaturated bonding site (for example, in a case where the resin has an acryloxy group, acrylic acid) from the resin by an alkali treatment, measuring the content thereof by a high performance liquid chromatography (HPLC), and calculating the ethylenically unsaturated bonding value from the following expression based on the measured value.

Specifically, 0.1 g of the resin was dissolved in a tetrahydrofuran and methanol-mixed solution (50 mL/15 mL), 10 mL of a 4 mol/L sodium hydroxide aqueous solution was added thereto, and the mixture was reacted at 40° C. for 2 hours. The reaction solution was neutralized with 10.2 mL of a 4 mol/L methanesulfonic acid aqueous solution, the mixed solution to which 5 mL of ion exchange water and 2 mL of methanol were added was transferred to a 100 mL volumetric flask, and then the mixed solution was diluted in the volumetric flask by methanol to prepare a measurement sample for HPLC. Thereafter, the ethylenically unsaturated bonding value was measured under the following conditions. The content of the low-molecular-weight component (a) was calculated from a calibration curve of the low-molecular-weight component (a) prepared separately, and the ethylenically unsaturated bonding value (C=C value) was calculated from the following expression.

C=C value (mmol/g)=(Content (ppm) of low-molecular-weight component (a)/Molecular weight (g/mol) of low-molecular-weight component (a)/(Weighed value (g) of polymer solution)× (Concentration of solid contents (%) of polymer solution/100)×10)        [C=C Value Calculation Expression]

—HPLC Measurement Conditions—

Measuring equipment: Agilent-1200 (manufactured by Agilent Technologies, Inc.)

Column: Synergi 4u Polar-RP 80A manufactured by Phenomenex; 250 mm×4.60 mm (inner diameter)+guard column Column temperature: 40° C.

Analysis time: 15 minutes

Flow rate: 1.0 mL/min (maximum liquid feeding pressure: 182 bar (18.2 MPa))

Injection amount: 5 µl

Detection wavelength: 210 nm

Eluent: tetrahydrofuran (for stabilizer-free HPLC)/buffer solution (ion exchange aqueous solution containing 0.2 volume % of phosphoric acid and 0.2 volume % of triethylamine)=55/45 (volume %)

In the present specification, volume % is a value at 25° C.

Synthesis Example 1: Synthesis of Specific Resin A-12

(Synthesis of Main Polymer (A-12a))

20.0 g of 2,2'-bis(trifluoromethyl) benzidine and 38.3 g of 3,5-diaminobenzoic acid were dissolved in 460 g of N-methylpyrrolidone. 138.8 g of 4,4'-(hexafluoroisopropylidene) diphthalic acid anhydride and 5.6 g of phthalic acid anhydride were added thereto, and the mixture was stirred at 50° C. for 6 hours. Next, 100.4 g of acetic acid anhydride and 7.1 g of pyridine were added thereto, and the mixture was stirred at 80° C. for 2 hours. The obtained polymer solution was precipitated in methanol, and the obtained powder was collected by filtration. Mw of the polymer (A-12a) was 25,000, and the acid value was 69 mgKOH/g.

(Synthesis of Branch Polymer (A-12b))

10.0 g of methyl methacrylate and 1.7 g of mercaptoethanol were dissolved in 23 g of methyl ethyl ketone. 0.3 g of V-601 was added thereto, and the mixture was heated and stirred at 75° C. for 8 hours. The obtained polymer was precipitated in hexane, and the obtained powder was collected by filtration. Mw of the polymer (A-12b) was 3,500.

(Synthesis of Graft Polymer)

150 g of the polymer (A-12a) obtained above and 8 g of the polymer (A-12b) were dissolved in 360 g of N-methylpyrrolidone. 35 g of triphenyl phosphate and 10 g of pyridine were added thereto as a condensing agent, and the mixture was heated and stirred at 120° C. for 8 hours. The reaction solution was precipitated in methanol, and the obtained powder was collected by filtration. Mw of the polymer (A-12) was 45,800, and the acid value was 35 mgKOH/g.

Other specific resins used in Examples or Comparative Examples were synthesized by the same method as in A-12, except that the type and amount of the monomer used were appropriately changed.

Details of x, y, z, z1, and z2, which are the content ratios (molar ratios) of each repeating unit in specific resins A-1 to A-33 used in Examples or Comparative Examples, are as shown in the table below.

TABLE 10

|  | x | y | z | z1 | z2 |
|---|---|---|---|---|---|
| A-1 | 50 | — | — | — | — |
| A-2 | 30 | 20 | — | — | — |
| A-3 | 50 | — | — | — | — |
| A-4 | 25 | 25 | — | — | — |
| A-5 | 30 | 20 | — | — | — |
| A-6 | 25 | 25 | — | — | — |
| A-7 | 10 | 40 | — | — | — |
| A-8 | 10 | 20 | 20 | — | — |
| A-9 | 10 | 10 | 30 | — | — |
| A-10 | 30 | 10 | 10 | — | — |
| A-11 | 5 | 10 | 35 | — | — |
| A-12 | 10 | 35 | 5 | — | — |
| A-13 | 5 | 40 | 5 | — | — |
| A-14 | 10 | 35 | 5 | — | — |
| A-15 | 25 | 15 | 10 | — | — |
| A-16 | 10 | 30 | 10 | — | — |
| A-17 | 10 | 25 | 15 | — | — |
| A-18 | 10 | 35 | 5 | — | — |
| A-19 | 50 | — | — | — | — |
| A-20 | 50 | — | — | — | — |
| A-21 | 25 | 25 | — | — | — |
| A-22 | 10 | 5 | 35 | — | — |
| A-23 | 20 | 20 | 10 | — | — |
| A-24 | 5 | 20 | — | 5 | 20 |
| A-25 | 30 | 20 | — | — | — |
| A-26 | 5 | 25 | 20 | — | — |
| A-27 | 10 | 40 | — | — | — |
| A-28 | 10 | 40 | — | — | — |
| A-29 | 25 | 25 | — | — | — |
| A-30 | 10 | 40 | — | — | — |
| A-31 | 20 | 20 | 10 | — | — |
| A-32 | 20 | 20 | 10 | — | — |
| A-33 | 10 | 20 | — | 5 | 15 |

<Dispersion Liquids R1 to R8, B1 to B5, G1 to G4, Y1 and Y2, I1 to 16, and Bk1 to Bk7>

A mixed solution obtained by mixing raw materials listed in the table below was mixed and dispersed for 3 hours by a beads mill (zirconia beads: 0.3 mm diameter), and then subjected to a dispersion treatment under a pressure of 2,000 MPa at a flow rate of 500 g/min using a high-pressure disperser equipped with a pressure-reducing system NANO-3000-10 (manufactured by Nippon BEE Chemical Co., Ltd.). The dispersion treatment was repeated 10 times to obtain each dispersion liquid.

TABLE 11

| Pigment dispersion liquid | | PR 264 | PR 254 | PR 179 | PB 15:4 | PB 15:6 | PB 16 | PG 7 | PG 36 | PY 138 | PY 215 | PV 23 | IR coloring agent | IRGAP HORE | PBk 32 |
|---|---|---|---|---|---|---|---|---|---|---|---|---|---|---|---|
| Dispersion liquid | R1 | 20.8 | — | — | — | — | — | — | — | — | — | — | — | — | — |
| | R2 | — | 24.2 | — | — | — | — | — | — | — | — | — | — | — | — |
| | R3 | 11.6 | 10.6 | — | — | — | — | — | — | — | — | — | — | — | — |
| | R4 | 22.9 | 2.1 | — | — | — | — | — | — | — | — | — | — | — | — |
| | R5 | — | 12.8 | — | — | — | — | — | — | 5.5 | — | — | — | — | — |
| | R6 | 13.1 | — | — | — | — | — | — | — | — | — | 3.6 | — | — | — |
| | R7 | — | — | 12.9 | — | — | — | — | — | — | — | — | — | — | — |
| | R8 | — | — | 10.1 | — | — | — | — | — | — | — | 4.2 | — | — | — |
| | B1 | — | — | — | 21.5 | — | — | — | — | — | — | — | — | — | — |
| | B2 | — | — | — | — | 22.6 | — | — | — | — | — | — | — | — | — |
| | B3 | — | — | — | — | — | 22.4 | — | — | — | — | — | — | — | — |
| | B4 | — | — | — | 17.2 | 5.4 | — | — | — | — | — | — | — | — | — |
| | B5 | — | — | — | 10.8 | — | 6.9 | — | — | — | — | — | — | — | — |
| | G1 | — | — | — | — | — | — | 12.3 | — | — | — | — | — | — | — |
| | G2 | — | — | — | — | — | — | — | 11.9 | — | — | — | — | — | — |
| | G3 | — | — | — | — | — | — | 10.1 | — | — | 2.0 | — | — | — | — |
| | G4 | — | — | — | — | — | — | — | 10.2 | 2.9 | — | — | — | — | — |
| | Y1 | — | — | — | — | — | — | — | — | 12.9 | — | — | — | — | — |
| | Y2 | — | — | — | — | — | — | — | — | — | 13.1 | — | — | — | — |
| | I1 | — | — | — | — | — | — | — | — | — | — | — | 22.5 | — | — |
| | I2 | — | — | — | — | — | — | — | — | — | — | — | 22.5 | — | — |
| | I3 | — | — | — | — | — | — | — | — | — | — | — | 22.5 | — | — |
| | I4 | — | — | — | — | — | — | — | — | — | — | — | 24.3 | — | — |
| | I5 | — | — | — | — | — | — | — | — | — | — | — | 24.3 | — | — |
| | I6 | — | — | — | — | — | — | — | — | — | — | — | 24.3 | — | — |
| | Bk1 | — | 7.7 | — | 5.0 | — | — | — | — | — | — | — | — | — | — |
| | Bk2 | — | — | 4.9 | — | — | 1.9 | 5.2 | — | — | — | — | — | — | — |
| | Bk3 | 6.8 | — | — | — | — | 4.4 | — | — | — | 1.0 | — | — | — | — |
| | Bk4 | — | 5.6 | — | — | 3.2 | — | — | — | 2.2 | — | 3.6 | — | — | — |
| | Bk5 | — | — | — | — | — | 6.3 | — | — | — | — | — | — | 6.3 | — |
| | Bk6 | — | — | — | — | 3.1 | — | — | — | 3.1 | — | — | — | 3.1 | 3.1 |
| | Bk7 | — | — | — | — | 4.2 | — | — | — | 4.2 | — | 4.2 | — | — | — |

| Pigment dispersion liquid | | Derivative 1 | Derivative 2 | Derivative 3 | A-20 | A-22 | A-26 | A-29 | CA-1 | CA-2 | S-1 | S-2 | S-3 | S-4 |
|---|---|---|---|---|---|---|---|---|---|---|---|---|---|---|
| Dispersion liquid | R1 | 5.2 | — | — | 9.2 | — | — | — | — | — | 64.8 | — | — | — |
| | R2 | — | 5.6 | — | — | 9.8 | — | — | — | — | 60.4 | — | — | — |
| | R3 | — | 4.6 | — | — | — | 11.2 | — | — | — | — | 62.0 | — | — |
| | R4 | 5.0 | — | — | — | — | — | 12.3 | — | — | — | — | 57.7 | — |
| | R5 | 2.6 | — | — | 4.5 | — | — | — | — | — | 74.6 | — | — | — |
| | R6 | 2.4 | — | — | — | 4.3 | — | — | — | — | 76.6 | — | — | — |
| | R7 | 2.7 | — | — | — | — | 4.2 | — | — | — | 80.2 | — | — | — |
| | R8 | 2.6 | — | — | — | — | — | 4.0 | — | — | 79.1 | — | — | — |
| | B1 | — | 5.0 | — | 9.8 | — | — | — | — | — | — | — | 63.7 | — |
| | B2 | — | 4.2 | — | — | 10.3 | — | — | — | — | — | — | — | 62.9 |
| | B3 | — | 5.6 | — | — | — | 10.5 | — | — | — | 61.5 | — | — | — |
| | B4 | — | 4.8 | — | 5.4 | — | 4.2 | — | — | — | 63.0 | — | — | — |
| | B5 | 5.6 | — | — | — | — | — | — | — | 8.4 | 68.3 | — | — | — |
| | G1 | — | 2.5 | — | 4.1 | — | — | — | — | — | 81.1 | — | — | — |
| | G2 | — | 2.3 | — | — | 3.9 | — | — | — | — | 81.9 | — | — | — |
| | G3 | — | 2.6 | — | — | — | 3.3 | — | — | — | 82.0 | — | — | — |
| | G4 | — | 2.3 | — | — | — | — | 3.7 | — | — | 80.9 | — | — | — |
| | Y1 | — | 2.3 | — | 3.5 | — | — | — | — | — | 81.3 | — | — | — |
| | Y2 | — | 2.3 | — | 3.7 | — | — | — | — | — | 80.9 | — | — | — |
| | I1 | — | — | 6.4 | 4.5 | — | — | — | — | — | — | — | — | 66.6 |
| | I2 | — | — | 6.4 | — | 4.5 | — | — | — | — | — | — | 66.6 | — |
| | I3 | — | — | 6.4 | — | — | 4.5 | — | — | — | — | 66.6 | — | — |
| | I4 | — | — | 7.2 | — | — | — | 4.5 | — | — | 64.0 | — | — | — |
| | I5 | — | — | 7.2 | — | — | — | — | 2.3 | 2.2 | 64.0 | — | — | — |
| | I6 | — | — | 7.2 | — | — | — | — | — | 4.5 | 64.0 | — | — | — |
| | Bk1 | 2.3 | — | — | 4.5 | — | — | — | — | — | 80.5 | — | — | — |
| | Bk2 | — | 2.4 | — | — | 4.3 | — | — | — | — | 81.3 | — | — | — |
| | Bk3 | 2.3 | — | — | — | — | 4.0 | — | — | — | 81.5 | — | — | — |

TABLE 11-continued

| | | | | | | | | | | | | |
|---|---|---|---|---|---|---|---|---|---|---|---|---|
| Bk4 | 2.3 | — | — | — | — | — | 4.1 | — | — | 79.0 | — | — |
| Bk5 | — | 2.1 | — | — | — | — | 3.8 | — | — | 81.5 | — | — |
| Bk6 | — | 2.1 | — | — | — | — | 3.8 | — | — | 81.7 | — | — |
| Bk7 | 1.0 | 1.0 | 1.0 | — | — | — | 3.8 | — | — | 80.6 | — | — |

The unit of numerical values shown in the above table is part by mass. Among the raw materials shown in the above table, details of the raw materials shown by abbreviations are as follows.

[Coloring Material]

PR264: C. I. Pigment Red 264 (red pigment, diketopyr-rolopyrrole pigment)

PR254: C. I. Pigment Red 254 (red pigment, diketopyr-rolopyrrole pigment)

PR179: C. I. Pigment Red 179

PB15:4: C. I. Pigment Blue 15:4 (blue pigment, phthalo-cyanine pigment)

PB15:6: C. I. Pigment Blue 15:6 (blue pigment, phthalo-cyanine pigment)

PB16: C. I. Pigment Blue 16 (blue pigment, phthalocya-nine pigment)

PG7: C. I. Pigment Green 7

PG36: C. I. Pigment Green 36

PY138: C. I. Pigment Yellow 138

PY215: C. I. Pigment Yellow 215

PV23: C. I. Pigment Violet 23

IR coloring agent: compound having the following structure (near-infrared ray absorbing pigment, in the following structural formula, Me represents a methyl group and Ph represents a phenyl group)

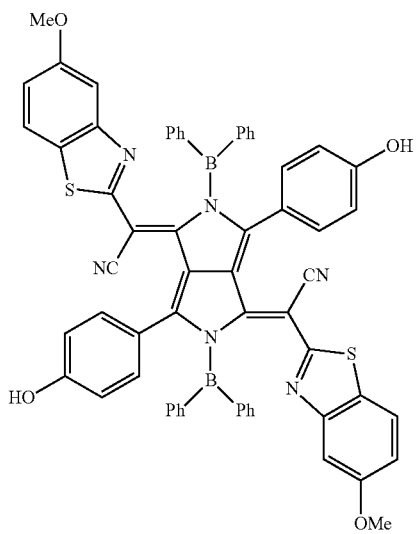 [SMILES: COc1ccc2sc(/C(C#N)=c3/c4c(-c5ccc(O)cc5)n(B(c5ccccc5)c5ccccc5)/c(=C(/C#N)c5nc6cc(OC)ccc6s5)c4c(-c4ccc(O)cc4)n3B(c3ccccc3)c3ccccc3)nc2c1]

IRGAPHORE: Irgaphor Black S 0100 CF (manufactured by BASF, compound having the following structure, lactam-based pigment)

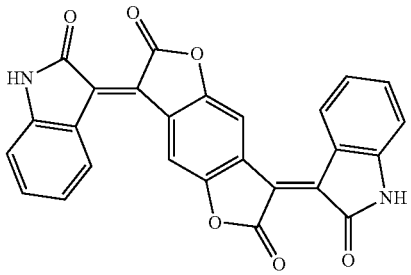 [SMILES: O=C1Nc2ccccc2/C1=C1/C(=O)Oc2cc3c(cc21)OC(=O)/C3=C1\C(=O)Nc2ccccc21]

PBk32: C. I. Pigment Black 32 (compound having the following structure, perylene-based pigment)

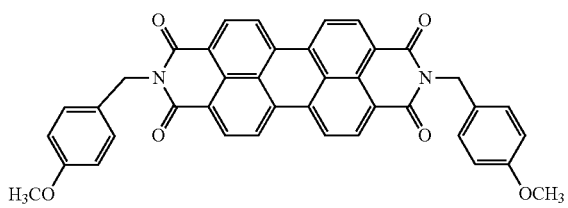 [SMILES: COc1ccc(CN2C(=O)c3ccc4c5ccc6c7c(ccc(c8ccc(c3c48)C2=O)c75)C(=O)N(Cc2ccc(OC)cc2)C6=O)cc1]

Derivative 1: compound having the following structure

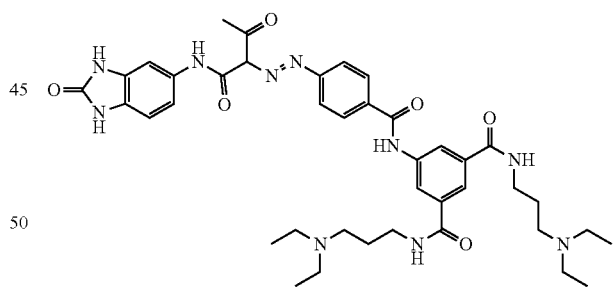

Derivative 2: compound having the following structure

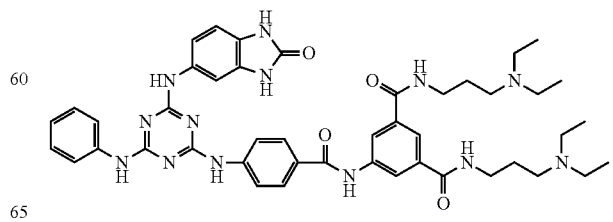

Derivative 2: compound having the following structure

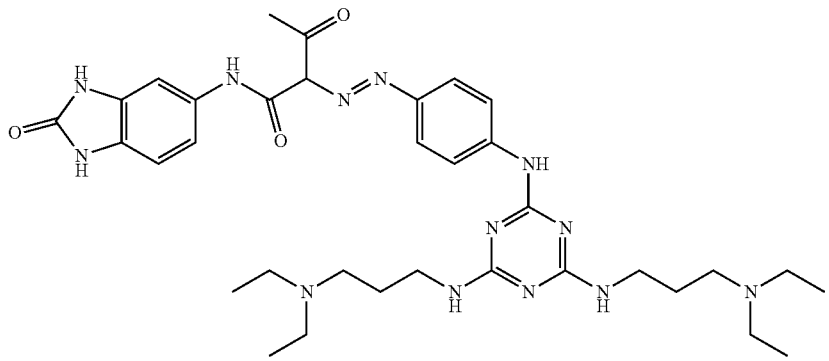 [SMILES: CCN(CC)CCCNc1nc(NCCCN(CC)CC)nc(Nc2ccc(/N=N/C(C(C)=O)C(=O)Nc3ccc4[nH]c(=O)[nH]c4c3)cc2)n1]

[Resin]

A-20, A-22, A-26, and A-29: resins synthesized as in Synthesis Examples described above CA-1: resin having the following structure ((meth)acrylic resin, a numerical value added to a main chain represents a molar ratio, and a numerical value added to a side chain represents the number of repeating units; the weight-average molecular weight was 20,000 and the acid value was 77 mgKOH/g; in addition, CA-1 was a resin not containing any one of the repeating units represented by Formulae (1-1) to (1-5))

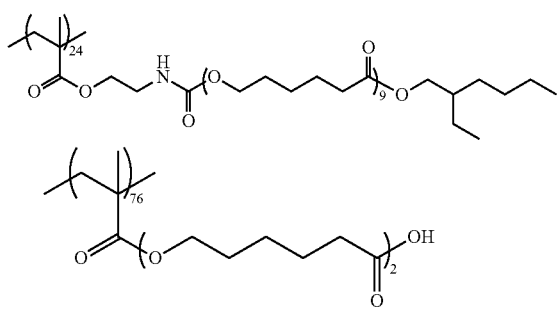

CA-2: DISPERBYK-193 (manufactured by BKY Additives & Instruments, nonionic polymer dispersant; in addition, CA-2 was a resin not containing any one of the repeating units represented by Formulae (1-1) to (1-5))

[Solvent]

S-1: propylene glycol monomethyl ether acetate

S-2: propylene glycol monomethyl ether

S-3: cyclohexanone

S-4: cyclopentanone

<Production of Resin Composition>

In each of Examples and Comparative Examples, raw materials shown in the tables below were mixed to prepare a coloring resin composition or a comparative resin composition. The unit of the numerical value in the column of the amount added described in the tables below is parts by mass. The description in the column of "Coloring material concentration (%) in solid content" indicates a content (mass %) of the coloring material with respect to the total solid content of the composition.

TABLE 12

| Example | Pigment dispersion liquid Type | Pigment dispersion liquid Part by mass | Resin Type | Resin Part by mass | Polymerizable compound Type | Polymerizable compound Part by mass | Photopolymerization initiator Type | Photopolymerization initiator Part by mass | Solvent Type | Solvent Part by mass | Coloring material concentration (%) in solid content |
|---|---|---|---|---|---|---|---|---|---|---|---|
| 1 | Dispersion liquid R1 | 54.6 | A-2 | 12.0 | D-1 | 5 | E-1 | 5.0 | S-1 | 23.4 | 34.4 |
| 2 | Dispersion liquid R1 | 56.4 | A-4 | 4.0 | D-1 | 4 | E-1 | 3.0 | S-1 | 32.6 | 47.5 |
| 3 | Dispersion liquid R1 | 54.6 | A-5 | 2.0 | D-1 | 3 | E-2 | 1.0 | S-3 | 39.4 | 56.3 |
| 4 | Dispersion liquid R2 | 53.4 | A-6 | 8.0 | D-1 | 3 | E-1 | 3.0 | S-3 | 32.6 | 45.3 |
| 5 | Dispersion liquid R2 | 58.6 | A-7 | 8.0 | D-2 | 3 | E-2 | 3.0 | S-3 | 27.4 | 46.9 |
| 6 | Dispersion liquid R2 | 55.0 | A-8 | 8.0 | D-1 | 3 | E-3 | 3.0 | S-3 | 31.0 | 45.8 |
| 7 | Dispersion liquid R3 | 55.9 | A-9 | 10.0 | D-1 | 5 | E-1 | 3.0 | S-3 | 26.1 | 38.2 |
| 8 | Dispersion liquid R3 | 57.2 | A-10 | 10.0 | D-2 | 5 | E-2 | 3.0 | S-3 | 24.8 | 38.6 |

TABLE 12-continued

| Example | Pigment dispersion liquid Type | Part by mass | Resin Type | Part by mass | Polymerizable compound Type | Part by mass | Photopolymerization initiator Type | Part by mass | Solvent Type | Part by mass | Coloring material concentration (%) in solid content |
|---|---|---|---|---|---|---|---|---|---|---|---|
| 9 | Dispersion liquid R3 | 63.7 | A-11 | 10.0 | D-3 | 4 | E-3 | 3.0 | S-1 | 19.3 | 41.4 |
| 10 | Dispersion liquid R4 | 56.9 | A-12 | 12.0 | D-1 | 4 | E-3 | 3.0 | S-3 | 24.1 | 39.6 |
| 11 | Dispersion liquid R5 | 55.0 | A-13 | 5.0 | D-1 | 4 | E-2 | 3.0 | S-1 | 33.0 | 44.3 |
| 12 | Dispersion liquid R6 | 55.0 | A-14 | 5.0 | D-2 | 3 | E-2 | 3.0 | S-1 | 34.0 | 44.0 |
| 13 | Dispersion liquid R7 | 55.0 | A-15 | 5.0 | D-1 | 3 | E-3 | 3.0 | S-1 | 34.0 | 39.2 |
| 14 | Dispersion liquid R8 | 55.0 | A-16 | 5.0 | D-2 | 2 | E-3 | 3.0 | S-1 | 35.0 | 43.2 |
| 15 | Dispersion liquid B1 | 52.5 | A-17 | 8.0 | D-1 | 5 | E-1 | 2.0 | S-3 | 32.5 | 40.9 |
| 16 | Dispersion liquid B1 | 52.0 | A-18 | 8.0 | D-2 | 5 | E-1 | 3.0 | S-3 | 32.0 | 39.5 |
| 17 | Dispersion liquid B1 | 57.9 | A-19 | 8.0 | D-3 | 5 | E-1 | 3.0 | S-3 | 26.2 | 41.4 |
| 18 | Dispersion liquid B2 | 52.3 | A-20 | 8.0 | D-1 | 5 | E-2 | 3.0 | S-3 | 31.7 | 39.6 |
| 19 | Dispersion liquid B2 | 56.7 | A-22 | 8.0 | D-2 | 2 | E-2 | 2.0 | S-3 | 31.3 | 46.0 |
| 20 | Dispersion liquid B2 | 55.1 | A-24 | 8.0 | D-3 | 5 | E-2 | 3.0 | S-1 | 28.9 | 40.5 |
| 21 | Dispersion liquid B3 | 58.0 | A-26 | 10.0 | D-1 | 5 | E-3 | 3.0 | S-1 | 24.0 | 40.3 |
| 22 | Dispersion liquid B3 | 53.8 | A-27 | 10.0 | D-1 | 2 | E-3 | 3.0 | S-1 | 31.2 | 42.2 |
| 23 | Dispersion liquid B3 | 54.1 | A-28 | 10.0 | D-2 | 5 | E-3 | 3.0 | S-1 | 27.9 | 39.0 |
| 24 | Dispersion liquid B4 | 59.2 | A-29 | 10.0 | D-1 | 5 | E-1 | 3.0 | S-3 | 22.9 | 40.6 |
| 25 | Dispersion liquid B4 | 56.4 | A-30 | 8.0 | D-1 | 5 | E-2 | 2.0 | S-3 | 28.6 | 43.1 |
| 26 | Dispersion liquid B4 | 56.8 | A-31 | 8.0 | D-2 | 2 | E-3 | 3.0 | S-3 | 30.2 | 45.8 |
| 27 | Dispersion liquid B5 | 63.7 | A-32 | 9.0 | D-1 | 5 | E-1 | 3.0 | S-3 | 19.3 | 39.9 |
| 28 | Dispersion liquid B5 | 70.2 | A-33 | 10.0 | D-1 | 5 | E-2 | 3.0 | S-3 | 11.8 | 40.6 |
| 29 | Dispersion liquidG1 | 55.0 | A-8 | 5.0 | D-1 | 5 | E-3 | 2.0 | S-1 | 33.0 | 36.3 |
| 30 | Dispersion liquidG2 | 55.0 | A-8 | 5.0 | D-1 | 5 | E-3 | 3.0 | S-1 | 32.0 | 34.0 |
| 31 | Dispersion liquidG3 | 55.0 | A-9 | 5.0 | D-2 | 5 | E-3 | 3.0 | S-1 | 32.0 | 35.3 |
| 32 | Dispersion liquidG4 | 55.0 | A-9 | 5.0 | D-2 | 5 | E-3 | 3.0 | S-1 | 32.0 | 36.0 |
| 33 | Dispersion liquid Y1 | 55.0 | A-10 | 5.0 | D-3 | 2 | E-3 | 2.0 | S-1 | 36.0 | 43.3 |
| 34 | Dispersion liquid Y2 | 55.0 | A-10 | 5.0 | D-3 | 5 | E-3 | 3.0 | S-1 | 32.0 | 36.0 |
| 35 | Dispersion liquid I1 | 53.8 | A-11 | 8.0 | D-1 | 2 | E-3 | 1.0 | S-1 | 35.2 | 53.7 |
| 36 | Dispersion liquid I1 | 56.6 | A-11 | 8.0 | D-1 | 5 | E-1 | 3.0 | S-1 | 27.5 | 46.8 |
| 37 | Dispersion liquid I1 | 59.8 | A-24 | 8.0 | D-1 | 5 | E-2 | 3.0 | S-1 | 24.2 | 48.0 |
| 38 | Dispersion liquid I2 | 60.3 | A-24 | 8.0 | D-1 | 2 | E-3 | 1.0 | S-3 | 28.7 | 56.0 |
| 39 | Dispersion liquid I2 | 57.1 | A-26 | 8.0 | D-2 | 5 | E-1 | 2.0 | S-3 | 27.9 | 48.4 |
| 40 | Dispersion liquid I3 | 56.3 | A-26 | 12.0 | D-3 | 10 | E-2 | 5.0 | S-3 | 16.7 | 35.5 |

TABLE 13

| | | Pigment dispersion liquid | | Resin | | Polymerizable compound | | Photopolymerization initiator | | Solvent | | Coloring material |
|---|---|---|---|---|---|---|---|---|---|---|---|---|
| | | Type | Part by mass | Type | Part by mass | Type | Part by mass | Type | Part by mass | Type | Part by mass | concentration (%) in solid content |
| Example | 41 | Dispersion liquid I3 | 55.9 | A-8 | 8.0 | D-2 | 5 | E-3 | 5.0 | S-3 | 26.1 | 44.1 |
| | 42 | Dispersion liquid I4 | 54.1 | A-8 | 8.0 | D-1 | 2 | E-1 | 3.0 | S-3 | 32.9 | 52.5 |
| | 43 | Dispersion liquid I5 | 55.9 | A-8 | 8.0 | D-1 | 2 | E-2 | 3.0 | S-3 | 31.1 | 53.2 |
| | 44 | Dispersion liquid I5 | 60.6 | A-9 | 8.0 | D-1 | 5 | E-3 | 3.0 | S-3 | 23.4 | 50.5 |
| | 45 | Dispersion liquid I5 | 55.8 | A-9 | 8.0 | D-1 | 5 | E-3 | 3.0 | S-3 | 28.2 | 48.7 |
| | 46 | Dispersion liquid I6 | 55.0 | A-9 | 8.0 | D-1 | 5 | E-3 | 3.0 | S-3 | 29.0 | 48.4 |
| | 47 | Dispersion liquid Bk1 | 55.0 | A-10 | 5.0 | D-1 | 2 | E-2 | 3.0 | S-1 | 35.0 | 39.8 |
| | 48 | Dispersion liquid Bk2 | 55.0 | A-10 | 5.0 | D-1 | 2 | E-2 | 3.0 | S-1 | 35.0 | 39.0 |
| | 49 | Dispersion liquid Bk3 | 55.0 | A-11 | 5.0 | D-1 | 2 | E-3 | 3.0 | S-1 | 35.0 | 39.5 |
| | 50 | Dispersion liquid Bk4 | 55.0 | A-11 | 5.0 | D-1 | 2 | E-3 | 3.0 | S-1 | 35.0 | 43.1 |
| | 51 | Dispersion liquid R1 | 27.6 | A-11 | 10.0 | D-1 | 11.5 | E-2 | 5.0 | S-1 | 18.3 | 31.4 |
| | | Dispersion liquid B2 | 27.6 | | | | | | | | | |
| | 52 | Dispersion liquid R5 | 18.3 | A-11 | 5.0 | D-1 | 5 | E-2 | 3.0 | S-1 | 32.1 | 38.0 |
| | | Dispersion liquidG1 | 18.3 | | | | | | | | | |
| | | Dispersion liquid Y1 | 18.3 | | | | | | | | | |
| | 53 | Dispersion liquid R6 | 18.3 | A-11 | 5.0 | D-2 | 5 | E-2 | 3.0 | S-1 | 32.1 | 40.2 |
| | | Dispersion liquidG2 | 18.3 | | | | | | | | | |
| | | Dispersion liquid B1 | 18.3 | | | | | | | | | |
| | 54 | Dispersion liquid R6 | 18.3 | A-11 | 5.0 | D-3 | 5 | E-3 | 3.0 | S-1 | 32.1 | 40.7 |
| | | Dispersion liquid B2 | 18.3 | | | | | | | | | |
| | | Dispersion liquid Y2 | 18.3 | | | | | | | | | |
| | 55 | Dispersion liquid Bk5 | 55.0 | A-39 | 5.0 | D-1 | 2 | E-2 | 3.0 | S-1 | 35.0 | 40.1 |
| | 56 | Dispersion liquid Bk6 | 55.0 | A-39 | 5.0 | D-1 | 2 | E-2 | 3.0 | S-1 | 35.0 | 39.7 |
| | 57 | Dispersion liquid Bk7 | 55.0 | A-39 | 5.0 | D-1 | 2 | E-2 | 3.0 | S-1 | 35.0 | 41.5 |
| Comparative example | 1 | Dispersion liquid I6 | 40.2 | CA-3 | 8.0 | D-1 | 11.5 | E-3 | 5.0 | S-1 | 35.3 | 32.5 |
| | 2 | Dispersion liquid I6 | 43.6 | CA-4 | 8.0 | D-1 | 11.5 | E-3 | 5.0 | S-3 | 31.9 | 34.2 |

Among the raw materials listed in the above tables, details of the raw materials shown by abbreviations are as follows.

[Dispersion Liquid]

Dispersion liquids R1 to R8, B1 to B5, G1 to G4, Y1 and Y2, I1 to I6, and Bk1 to Bk7: dispersion liquids described above

[Resin]

A-1 to A-33: resins synthesized as in Synthesis Examples described above

CA-3: resin synthesized according to Synthesis Example CA-3 below; CA-3 is a resin which does not include a repeating unit represented by Formula (1-1) or Formula (1-2).

CA-4: resin synthesized according to Synthesis Example CA-4 below; CA-4 is a resin which does not include a repeating unit represented by Formula (1-1) or Formula (1-2).

Synthesis Example CA-3

Under a dry nitrogen stream, in a three-neck flask, 31.13 g of BAHF (2,2-bis(3-amino-4-hydroxyphenyl) hexafluoropropane) (0.085 mol; 77.3 mol % with respect to structural units derived from all amines and its derivatives), 1.24 g of SiDA (1,3-bis(3-aminopropyl) tetramethyldisiloxane) (0.0050 mol; 4.5 mol % with respect to structural units derived from all amines and its derivatives), 2.18 g of MAP (3-aminophenol) (0.020 mol; 18.2 mol % with respect to structural units derived from all amines and its derivatives) as a terminal blocking agent, and 150.00 g of NMP (N-methyl-2-pyrrolidone) were weighed and dissolved. A solution in which 31.02 g of ODPA (bis(3,4-dicarboxyphenyl) ether dianhydride) (0.10 mol; 100 mol % with respect to structural units derived from all carboxylic acids and its derivatives) was dissolved in 50.00 g of NMP was added thereto, and the mixture was stirred at 20° C. for 1 hour and then stirred at 50° C. for 4 hours. Thereafter, 15 g of xylene was added thereto, and the mixture was stirred at 150° C. for 5 hours while azeotropically boiling water with xylene. After completion of the reaction, the reaction solution was poured into 3 L of water, and the precipitated solid was obtained by filtration. The obtained solid was washed with water three times and then dried in a vacuum dryer at 80° C. for 24 hours to obtain a polyimide (CA-3). Mw of the obtained polyimide (CA-3) was 27,000, and an acid equivalent was 350 g/mol. The acid equivalent means the mass of the resin per 1 mol of the acidic group, and the unit is g/mol.

Synthesis Example CA-4

4,4'-diaminophenyl ether (0.30 molar equivalent), p-phenylenediamine (0.65 molar equivalent), bis(3-aminopropyl) tetramethyldisiloxane (0.05 molar equivalent), 850 g of γ-butyrolactone, and 850 g of N-methyl-2-pyrrolidone were charged, 4,4'-oxydiphthalic acid dianhydride (0.9975 molar equivalent) was added thereto, and the mixture was reacted at 80° C. for 3 hours to obtain a polyamic acid (polymer concentration: 20 mass %) P-1 solution.

MOI (manufactured by SHOWA DENKO K.K.), which is a monoisocyanate compound, was added to the polyamic acid P-1 in an amount of 10 mol % of the total carboxy group amount of P-1, and the mixture was reacted at 70° C. for 3 hours to obtain a polyimide precursor derivative CA-4 (polymer concentration: 20 mass %) solution in which 10% of all carboxy groups were carboxylic acid derivatives. Thereafter, the CA-4 solution was dried to obtain a polyimide precursor derivative CA-4.

[Polymerizable Compound]

D-1: KAYARAD DPHA (manufactured by Nippon Kayaku Co., Ltd.)

D-2: NK ESTERA-DPH-12E (manufactured by Shin-Nakamura Chemical Co., Ltd.)

D-3: ARONIX M-510 (manufactured by TOAGOSEI CO., LTD.)

[Photopolymerization Initiator]

E-1: IRGACURE 379 (aminoacetophenone-based photo-radical initiator (manufactured by BASF))

E-2: IRGACURE OXE01 (oxime ester-based photo-radical initiator (manufactured by BASF))

E-3: IRGACURE OXE03 (oxime ester-based photo-radical initiator (manufactured by BASF))

[Solvent]

S-1: propylene glycol monomethyl ether acetate

S-3: cyclohexanone

<Evaluation>

[Evaluation of Exposure Sensitivity]

In each of Examples and Comparative Examples, on a silicon wafer, the coloring resin composition or the comparative composition was applied to a glass substrate by spin coating, and dried (pre-baked) at 100° C. for 120 seconds using a hot plate. Thereafter, the composition was heated (post-baked) at 200° C. for 30 minutes using an oven to form a resin composition layer having a thickness of 0.60 μm.

Next, using an i-ray stepper exposure device FPA-3000 i5+(manufactured by Canon Inc.), the resin composition layer was irradiated with light having a wavelength of 365 nm through a mask pattern in which square non-masked pixels with a side of 1.0 μm were arranged in an area of 4 mm×3 mm to perform exposure thereon with a specific exposure amount.

Next, the silicon wafer on which the resin composition layer after the exposure was formed was placed on a horizontal rotary table of a spin-shower developing machine (DW-30 Type, manufactured by Chemitronics Co., Ltd.), and subjected to a puddle development at 23° C. for 60 seconds using a developer (CD-2000, manufactured by Fujifilm Electronic Materials Co., Ltd.). Next, while rotating the silicon wafer at a rotation speed of 50 rpm, the silicon wafer was rinsed by supplying pure water from above the center of rotation in shower-like from an ejection nozzle, and then spray-dried to form a pattern (pixel).

While changing the above-described specific exposure amount, the obtained pattern was observed, the minimum exposure amount for resolving the square pattern with a side of 1.0 μm was determined, and evaluation was performed according to the following evaluation standard. The evaluation results are shown in Table 14. It can be said that, as the minimum exposure amount is smaller, the composition has more excellent exposure sensitivity.

—Evaluation Standard—

A: minimum exposure amount was less than 100 mJ/cm$^2$.

B: minimum exposure amount was 100 or more and less than 200 mJ/cm$^2$.

C: minimum exposure amount was 200 or more and less than 500 mJ/cm$^2$.

D: minimum exposure amount was 500 or more and less than 1,000 mJ/cm$^2$.

E: minimum exposure amount was 1,000 mJ/cm$^2$ or more.

[Evaluation of Dispersion Storage Stability]

In each of Examples and Comparative Examples, the viscosity (mPa·s) of the coloring resin composition or the comparative composition was measured by "RE-85L" manufactured by TOKI SANGYO CO., LTD. After the above-described measurement, the coloring resin composition was allowed to stand at 45° C. under the conditions of light shielding for 3 days, and the viscosity (mPa·s) was measured again. Storage stability was evaluated according to the following evaluation standard from a viscosity difference (ΔVis) before and after leaving to stand. The evaluation results are described in the column of "Dispersion storage stability" in Table 14. It can be said that, as the numerical value of the viscosity difference (ΔVis) is smaller, the storage stability of the composition is better. In each of the above-described viscosity measurements, the temperature and humidity were controlled to 22±5° C. and 60±20% in a laboratory, and the temperature of the composition was adjusted to 25° C.
—Evaluation Standard—
A: ΔVis was 0.5 mPa·s or less.
B: ΔVis was more than 0.5 mPa·s and 1.0 mPa·s or less.
C: ΔVis was more than 1.0 mPa·s and 2.0 mPa·s or less.
D: ΔVis was more than 2.0 mPa·s and 2.5 mPa·s or less.
E: ΔVis was more than 2.5 mPa·s.

[Evaluation of Spectral Change]

In each of Examples and Comparative Examples, on a glass substrate, the coloring resin composition or the comparative composition was applied to a glass substrate by spin coating, and dried (pre-baked) at 100° C. for 120 seconds using a hot plate. Thereafter, the composition was heated (post-baked) at 200° C. for 30 minutes using an oven to produce a film having a thickness of 0.60 μm. Using Cary 5000 UV-Vis-NIR spectrophotometer (manufactured by Agilent Technologies, Inc.), a transmittance Tr1 of the obtained film at a wavelength of 450 nm was measured. Next, the obtained film was heat-treated at 300° C. for 5 hours in a nitrogen atmosphere. A transmittance Tr2 of the film after the heating treatment at a wavelength of 450 nm was measured.

An absolute value ΔT of the difference between Tr1 and Tr2 was calculated, and the spectral change was evaluated according to the following evaluation standard. The evaluation results are described in the column of "Spectral change" in Table 14. It can be said that, as ΔT is smaller, the spectral change is less likely to occur, which is preferable. Both Tr1 and Tr2 were measured in a state in which the temperature and humidity were controlled to 22±5° C. and 60±20% in a laboratory, and the temperature of the substrate was adjusted to 25° C.
—Evaluation Standard—
A: ΔT was 0.10% or less.
B: ΔT was more than 0.10% and 0.5% or less.
C: ΔT was more than 0.5% and 1% or less.
D: ΔT was more than 1% and 5% or less.
E: ΔT was more than 5%.

[Evaluation of Film Contraction Ratio]

In each of Examples and Comparative Examples, on a glass substrate, the coloring resin composition or the comparative composition was applied to a glass substrate by spin coating, and dried (pre-baked) at 100° C. for 120 seconds using a hot plate. Thereafter, the composition was heated (post-baked) at 200° C. for 30 minutes using an oven to produce a film having a thickness of 0.60 μm. The film thickness was measured by scraping a part of the film to expose a surface of the glass substrate, and measuring a step (film thickness of the coating film) between the surface of the glass substrate and the coating film using a stylus type step meter (DektakXT, manufactured by BRUKER). Next, the obtained film was heat-treated at 300° C. for 5 hours in a nitrogen atmosphere. The film thickness of the film after the heating treatment was measured in the same manner as described above, a film contraction ratio was calculated from the following expression, and the film contraction ratio was evaluated according to the following evaluation standard. The evaluation results are described in the column of "Film contraction ratio" in Table 14. Both T0 and T1 below were measured in a state in which the temperature and humidity were controlled to 22±5° C. and 60±20% in a laboratory, and the temperature of the substrate was adjusted to 25° C. It can be said that, as the film contraction ratio is smaller, the film contraction is more suppressed, which is a preferred result.

Film contraction ratio (%)=(1−(T1/T0))×100

T0: thickness of film immediately after production (=0.60 μm)
T1: thickness of film after the heating treatment at 300° C. for 5 hours in a nitrogen atmosphere
—Evaluation Standard—
A: film contraction ratio was 1% or less.
B: film contraction ratio was more than 1% and 5% or less.
C: film contraction ratio was more than 5% and 10% or less.
D: film contraction ratio was more than 10% and 30% or less.
E: film contraction ratio was more than 30%.

[Evaluation of Cracks]

In each of Examples and Comparative Examples, on a glass substrate, the coloring resin composition or the comparative composition was applied to a glass substrate by spin coating, and dried (pre-baked) at 100° C. for 120 seconds using a hot plate. Thereafter, the composition was heated (post-baked) at 200° C. for 30 minutes using an oven to produce a film having a thickness of 0.60 μm.

Next, $SiO_2$ was laminated at 200 nm on the surface of the obtained film by a sputtering method to form an inorganic film. The obtained film in which the inorganic film was formed on the surface was heat-treated at 300° C. for 5 hours in a nitrogen atmosphere. The surface of the inorganic film after the heating treatment was observed with an optical microscope, the number of cracks per 1 $cm^2$ was counted, and the presence or absence of cracks was evaluated according to the following evaluation standard. The evaluation results are described in the column of "Crack" in Table 14.
—Evaluation Standard—
A: number of cracks per 1 $cm^2$ was 0.
B: number of cracks per 1 $cm^2$ was 1 to 10.
C: number of cracks per 1 $cm^2$ was 11 to 50.
D: number of cracks per 1 $cm^2$ was 51 to 100.
E: number of cracks per 1 $cm^2$ was 101 or more.

TABLE 14

| | | Evaluation result | | | | |
|---|---|---|---|---|---|---|
| | | Exposure sensitivity | Dispersion storage stability | Spectral change | Film contraction ratio | Cracks |
| Example | 1 | C | A | B | A | A |
| | 2 | C | B | B | A | A |
| | 3 | C | A | A | B | A |
| | 4 | C | A | A | B | A |
| | 5 | B | B | B | A | A |
| | 6 | A | A | B | A | A |
| | 7 | A | A | B | B | A |
| | 8 | A | B | A | A | A |
| | 9 | A | A | A | A | A |
| | 10 | B | A | A | C | B |
| | 11 | B | A | A | B | A |
| | 12 | B | A | A | B | A |
| | 13 | B | A | B | A | A |

TABLE 14-continued

| | | Evaluation result | | | |
|---|---|---|---|---|---|
| | Exposure sensitivity | Dispersion storage stability | Spectral change | Film contraction ratio | Cracks |
| 14 | B | A | B | A | A |
| 15 | B | A | B | B | A |
| 16 | B | A | B | B | B |
| 17 | C | A | A | A | A |
| 18 | C | A | A | A | A |
| 19 | B | A | B | A | A |
| 20 | A | A | B | B | A |
| 21 | A | A | B | A | A |
| 22 | C | A | C | A | A |
| 23 | C | B | C | A | A |
| 24 | C | B | C | A | A |
| 25 | C | A | C | B | A |
| 26 | B | A | A | A | A |
| 27 | B | A | A | C | B |
| 28 | B | A | A | C | C |
| 29 | A | A | B | A | A |
| 30 | A | A | B | A | A |
| 31 | A | B | B | A | A |
| 32 | A | A | B | A | A |
| 33 | A | B | B | A | A |
| 34 | A | B | B | B | B |
| 35 | A | A | A | A | A |
| 36 | A | B | A | A | A |
| 37 | A | A | A | B | A |
| 38 | A | A | B | A | A |
| 39 | A | B | A | A | A |
| 40 | A | A | A | A | A |
| 41 | A | A | B | B | A |
| 42 | A | A | A | A | B |
| 43 | A | A | A | C | B |
| 44 | A | A | B | C | C |
| 45 | A | A | B | C | B |
| 46 | A | B | A | C | C |
| 47 | A | A | B | A | B |
| 48 | A | A | A | A | B |
| 49 | A | A | A | A | A |
| 50 | A | A | A | A | A |
| 51 | A | A | A | A | B |
| 52 | A | A | A | B | A |
| 53 | A | A | A | A | A |
| 54 | A | A | A | A | A |
| 55 | B | B | C | A | A |
| 56 | B | B | C | A | A |
| 57 | B | B | C | A | A |
| Comparative example 1 | B | B | D | E | D |
| Comparative example 2 | C | B | D | E | E |

In a case of using the coloring resin composition of Examples, the occurrence of cracks was suppressed as compared with a case of using the comparative composition of Comparative Example 1 or 2. Therefore, as compared with the comparative composition of Comparative Examples 1 and 2, it can be said that it was possible to expand a process window of process after manufacturing the film.

Example 100: Pattern Formation by Photolithography Method

The coloring resin composition of Example 9 was applied to a silicon wafer by spin coating, and dried (pre-baked) at 100° C. for 120 seconds using a hot plate. Thereafter, the coloring resin composition was heated (post-baked) at 200° C. for 30 minutes using an oven to form a resin composition layer having a thickness of 0.60 μm.

Next, using an i-ray stepper exposure device FPA-3000 i5+(manufactured by Canon Inc.), the resin composition layer was irradiated with light having a wavelength of 365 nm through a mask pattern in which square non-masked pixels with a side of 1.1 μm were arranged in an area of 4 mm×3 mm to perform exposure thereon with an exposure amount of 500 mJ/cm².

Next, the silicon wafer on which the resin composition layer after the exposure was formed was placed on a horizontal rotary table of a spin-shower developing machine (DW-30 Type, manufactured by Chemitronics Co., Ltd.), and subjected to a puddle development at 23° C. for 60 seconds using a developer (CD-2000, manufactured by Fujifilm Electronic Materials Co., Ltd.). Next, while rotating the silicon wafer at a rotation speed of 50 rpm, the silicon wafer was rinsed by supplying pure water from above the center of rotation in shower-like from an ejection nozzle, and then spray-dried to form a pattern (pixel).

The produced patterned silicon wafer was divided into two, and one of these was heat-treated at 300° C. for 5 hours in a nitrogen atmosphere (hereinafter, one is referred to as a substrate before heating treatment at 300° C. and the other is referred to as a substrate after heating treatment at 300° C.). In a case where cross sections of resist patterns on the substrate before heating treatment at 300° C. and the substrate after heating treatment at 300° C. were evaluated by a scanning electron microscope (SEM), the height of the resist pattern formed on the substrate after heating treatment at 300° C. was 71% of the height of the resist pattern formed on the substrate before heating treatment at 300° C.

What is claimed is:
1. A coloring resin composition comprising:
   a resin;
   a coloring material; and
   a solvent,
   wherein the resin is a polyimide or polyimide precursor including a repeating unit represented by Formula (1-1) or Formula (1-2), and
   a content of the coloring material is 30 mass % or more with respect to a total solid content of the composition,

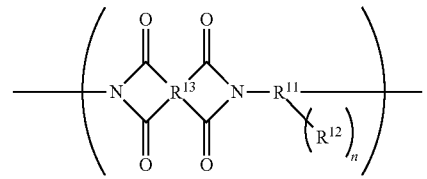

(1-1)

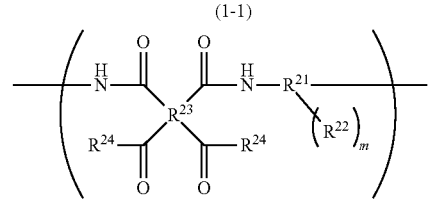

(1-2)

in Formula (1-1), $R^{11}$ represents an aromatic hydrocarbon group having 6 to 14 carbon atoms, $R^{12}$ represents a monovalent substituent which is a substituent on the aromatic hydrocarbon group in $R^{11}$, n represents an integer of 1 to nA, nA is a maximum number of substitutions of the aromatic hydrocarbon group in $R^{11}$, and $R^{13}$ represents a tetravalent organic group, in Formula (1-2), $R^{21}$ represents an aromatic hydrocarbon group having 6 to 14 carbon atoms, $R^{22}$ represents a monovalent substituent which is a substituent on the aromatic hydrocarbon group in $R^{21}$, m represents an integer of 1 to mA, mA is a maximum number of substitutions of the aromatic hydrocarbon group in $R^{21}$, $R^{23}$ represents a tetravalent organic group, and $R^{24}$ each independently represents a monovalent substituent, wherein the resin includes at least one repeating unit selected from the group consisting of a repeating unit 1-1b which is the repeating unit represented by Formula (1-1) and in which $R^{12}$ in Formula (1-1) is a group $R^{1b}$ including at least one curable group selected from the group consisting of a (meth)acryloxy group, a (meth)acrylamide group, an aromatic vinyl group, a maleimide group, an epoxy group, and an oxetanyl group, and a repeating unit 1-2b which is the repeating unit represented by Formula (1-2) and in which $R^{22}$ in Formula (1-2) is $R^{1b}$, or wherein the resin includes at least one repeating unit selected from the group consisting of a repeating unit 1-1c which is the repeating unit represented by Formula (1-1) and in which $R^{12}$ in Formula (1-1) is a group $R^{1c}$ having 12 or more carbon atoms, and a repeating unit 1-2c which is the repeating unit represented by Formula (1-2) and in which $R^{22}$ in Formula (1-2 is $R^{1c}$.

2. The coloring resin composition according to claim 1, wherein the resin includes at least one repeating unit selected from the group consisting of a repeating unit 1-1a which is the repeating unit represented by Formula (1-1) and in which $R^{12}$ in Formula (1-1) is a group $R^{1a}$ including at least one acid group selected from the group consisting of a carboxy group, a sulfo group, a phosphoric acid group, a sulfonamide group, and a hydroxy group, and a repeating unit 1-2a which is the repeating unit represented by Formula (1-2) and in which $R^{22}$ in Formula (1-2) is $R^{1a}$.

3. The coloring resin composition according to claim 1, wherein $R^{1c}$ includes at least one selected from the group consisting of a repeating unit derived from a (meth)acrylic acid ester compound, a repeating unit derived from a (meth)acrylamide compound, a repeating unit derived from an aromatic vinyl compound, and a polyester structure.

4. The coloring resin composition according to claim 1, wherein $R^{13}$ and $R^{23}$ are groups including an alicyclic structure, or groups including a fluorine atom and an aromatic ring structure.

5. The coloring resin composition according to claim 1, wherein $R^{24}$ is a group including at least one acid group selected from the group consisting of a carboxy group, a sulfo group, a phosphoric acid group, a sulfonamide group, and a hydroxy group, a group including at least one curable group selected from the group consisting of a (meth)acryloxy group, a (meth)acrylamide group, an aromatic vinyl group, a maleimide group, an epoxy group, and an oxetanyl group, or a group having 12 or more carbon atoms.

6. The coloring resin composition according to claim 1, wherein an acid value of the resin is 20 to 150 mgKOH/g.

7. The coloring resin composition according to claim 1, wherein a C=C value of the resin is 0.1 mmol/g to 3 mmol/g.

8. The coloring resin composition according to claim 1, wherein a weight-average molecular weight of the resin is 5,000 to 20,000.

9. The coloring resin composition according to claim 1, wherein, as the resin, the following resin 1 and resin 2 are included, resin 1: a resin including at least one acid group selected from the group consisting of a carboxy group, a sulfo group, a phosphoric acid group, a sulfonamide group, and a hydroxy group and at least one curable group selected from the group consisting of a (meth)acryloxy group, a (meth)acrylamide group, an aromatic vinyl group, a maleimide group, an epoxy group, and an oxetanyl group, resin 2: a resin including at least one acidic group selected from the group consisting of a carboxy group, a sulfo group, a phosphoric acid group, a sulfonamide group, and a hydroxy group and a group having 12 or more carbon atoms.

10. The coloring resin composition according to claim 1, wherein the coloring material is an organic pigment.

11. The coloring resin composition according to claim 1, wherein the coloring material includes at least one selected from a chromatic coloring material or a near-infrared absorbing coloring material.

12. The coloring resin composition according to claim 1, wherein the coloring material includes a chromatic coloring material and a near-infrared absorbing coloring material.

13. The coloring resin composition according to claim 1, wherein the coloring material includes a black coloring material.

14. The coloring resin composition according to claim 1, wherein the coloring material includes at least one coloring material selected from the group consisting of a red coloring material, a yellow coloring material, a blue coloring material, and a violet coloring material.

15. The coloring resin composition according to claim 1, further comprising:
a photopolymerization initiator.

16. The coloring resin composition according to claim 15, wherein the photopolymerization initiator is an oxime initiator.

17. The coloring resin composition according to claim 1, wherein the solvent includes at least one solvent selected from the group consisting of propylene glycol monomethyl ether acetate, propylene glycol monomethyl ether, cyclohexanone, cyclopentanone, butyl acetate, ethyl 3-ethoxypropionate, propylene glycol monoethyl ether acetate, ethyl lactate, 3-methoxybutanol, methyl isobutyl ketone, and dipropylene glycol monomethyl ether.

18. A film formed of the coloring resin composition according to claim 1.

19. A color filter comprising:
the film according to claim 18.

20. A solid-state imaging element comprising:
the film according to claim 18.

21. An image display device comprising:
the film according to claim 18.

22. A polyimide or a polyimide precursor comprising:
a repeating unit represented by Formula (2-1) or Formula (2-2),

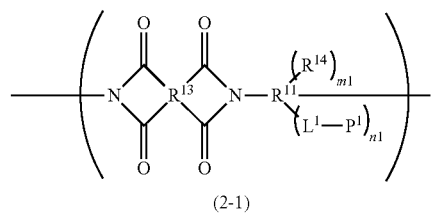

(2-1)

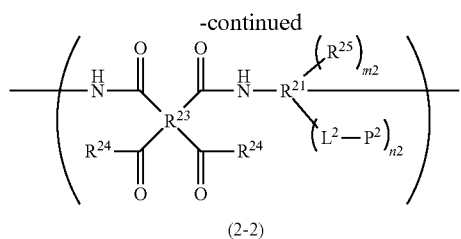

(2-2)

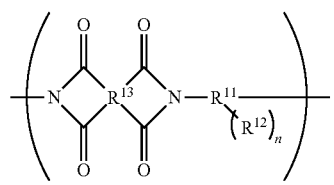

(1-1)

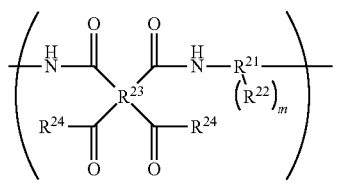

(1-2)

in Formula (2-1), $R^{11}$ represents an aromatic hydrocarbon group having 6 to 14 carbon atoms, $L^1$ represents a group represented by Formula (L-1), Formula (L-2), or Formula (L-3), $P^1$ represents a molecular chain having a weight-average molecular weight of 1,000 to 10,000 and having no acid group and basic group, n1 is 1 or 2, $R^{14}$ represents a monovalent substituent which is a substituent on the aromatic hydrocarbon group in $R^{11}$, m1 represents an integer of 0 to nA1, nA1 is a number obtained by subtracting n1 from a maximum number of substitutions of the aromatic hydrocarbon group in $R^1$, and $R^{13}$ represents a tetravalent organic group, in Formula (2-2), $R^{21}$ represents an aromatic hydrocarbon group having 6 to 14 carbon atoms, $L^2$ represents a group represented by Formula (L-1), Formula (L-2), or Formula (L-3), $P^2$ represents a molecular chain having a weight-average molecular weight of 1,000 to 10,000 and having no acid group and basic group, n2 is 1 or 2, $R^{25}$ represents a monovalent substituent which is a substituent on the aromatic hydrocarbon group in $R^{21}$, m2 represents an integer of 0 to nA2, nA2 is a number obtained by subtracting n2 from a maximum number of substitutions of the aromatic hydrocarbon group in $R^{21}$, $R^{23}$ represents a tetravalent organic group, and $R^{24}$ each independently represents a monovalent substituent,

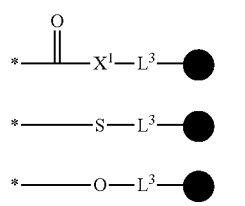

(L-1)

(L-2)

(L-3)

in Formula (L-1), Formula (L-2), or Formula (L-3), $X^t$ represents —O— or —$NR^N$—, $L^3$ represents a single bond, —O—, —$NR^N$—, —S—, —C(=O)—, —$NR^N$(C=O)O—, —$CH_2$—CH(OH)—$CH_2$—, a hydrocarbon group, or a group of a combination of two or more these groups, * represents a bonding site with $R^{11}$ or $R^{21}$, ● represents a bonding site with $P^1$ or $P^2$, and $R^N$ represents a hydrogen atom or a hydrocarbon group.

23. A polyimide or polyimide precursor comprising a repeating unit represented by Formula (1-1) or Formula (1-2), in Formula (1-1), $R^{11}$ represents an aromatic hydrocarbon group having 6 to 14 carbon atoms, $R^{12}$ represents a monovalent substituent which is a substituent on the aromatic hydrocarbon group in $R^{11}$, $R^{12}$ is $R^{1a}$ or $R^{1b}$, n represents an integer of 1 to nA, nA is a maximum number of substitutions of the aromatic hydrocarbon group in $R^{11}$, and $R^{13}$ represents a tetravalent organic group, in Formula (1-2), $R^{21}$ represents an aromatic hydrocarbon group having 6 to 14 carbon atoms, $R^{22}$ represents a monovalent substituent which is a substituent on the aromatic hydrocarbon group in $R^{21}$, $R^{21}$ is $R^{1a}$ or $R^{1b}$, m represents an integer of 1 to mA, mA is a maximum number of substitutions of the aromatic hydrocarbon group in $R^{21}$, $R^{23}$ represents a tetravalent organic group, and $R^{24}$ each independently represents a monovalent substituent, $R^{1a}$: a group represented by Formula (A-1),
$R^{1b}$: a group represented by Formula (B-1),

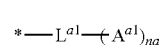

(A-1)

in Formula (A-1), $L^{a1}$ represents a single bond or an (na+1)-valent linking group, $A^{a1}$ each independently represents a carboxy group, a phosphoric acid group, or a sulfonamide group, na represents an integer of 1 or more, and * represents a bonding site with $R^{11}$,

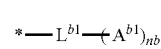

(B-1)

in Formula (B-1), $L^{b1}$ represents a single bond or an (nb+1)-valent linking group, $A^{b1}$ each independently represent at least one curable group selected from the group consisting of a (meth)acryloxy group, a (meth)acrylamide group, an aromatic vinyl group, a maleimide group, an epoxy group, and an oxetanyl group, nb represents an integer of 1 or more, and * represents a bonding site with $R^{11}$.

* * * * *